United States Patent
Jong et al.

(10) Patent No.: US 9,426,857 B2
(45) Date of Patent: Aug. 23, 2016

(54) LED DRIVING CIRCUIT PACKAGE

(75) Inventors: Young Do Jong, Ansan-si (KR); Hyun Gu Kang, Yongin-si (KR); Hye Man Jung, Suwon-si (KR); Kang Nyung Lee, Seoul (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 348 days.

(21) Appl. No.: 13/360,481

(22) Filed: Jan. 27, 2012

(65) Prior Publication Data

US 2013/0026924 A1 Jan. 31, 2013

Related U.S. Application Data

(60) Provisional application No. 61/437,288, filed on Jan. 28, 2011, provisional application No. 61/437,296, filed on Jan. 28, 2011, provisional application No. 61/565,574, filed on Dec. 1, 2011, provisional (Continued)

(51) Int. Cl.
 *H05B 33/08* (2006.01)

(52) U.S. Cl.
 CPC .......... *H05B 33/083* (2013.01); *H05B 33/0809* (2013.01); *H05B 33/0818* (2013.01); *H05B 33/0824* (2013.01); *H01L 2224/05554* (2013.01);

(Continued)

(58) Field of Classification Search
 CPC ............. H05B 33/0818; H05B 33/083; H05B 33/0809; H05B 33/0824; Y02B 20/347; H01L 2224/48091; H01L 2924/00014; H01L 2224/05554; H01L 2224/32225; H01L 2224/48137; H01L 2224/48227; H01L 2224/45139; H01L 2924/00

USPC ............................. 315/113; 257/99, E33.066
See application file for complete search history.

(56) References Cited

U.S. PATENT DOCUMENTS 6,455,930 B1 * 9/2002 Palanisamy et al. .......... 257/706
7,081,722 B1 7/2006 Huynh et al.

(Continued)

FOREIGN PATENT DOCUMENTS

CN 1863423 11/2006
CN 1975534 6/2007

(Continued)

OTHER PUBLICATIONS

Non-Final Office Action issued on Feb. 26, 2015, in U.S. Appl. No. 13/360,464.

(Continued)

*Primary Examiner* — Vibol Tan
(74) *Attorney, Agent, or Firm* — H.C. Park & Associates, PLC

(57) ABSTRACT

An LED driving circuit package includes a rectification unit to receive an AC power voltage and rectify the AC power voltage to generate a ripple voltage, an LED driving switching unit including a plurality of switch units and a plurality of current control units. The LED driving circuit package further includes a low voltage control unit including a circuit power supply unit to generate low voltage power, a voltage detection unit to detect a magnitude of the ripple voltage, a reference frequency generation unit to generate a reference frequency, and a reference pulse generation unit to generate a reference pulse for controlling the operation of the LED driving switch unit according to the reference frequency and a magnitude of the voltage detected by the voltage detection unit.

15 Claims, 45 Drawing Sheets

Related U.S. Application Data application No. 61/437,932, filed on Jan. 31, 2011, provisional application No. 61/438,304, filed on Feb. 1, 2011, provisional application No. 61/438,308, filed on Feb. 1, 2011, provisional application No. 61/442,732, filed on Feb. 14, 2011, provisional application No. 61/467,782, filed on Mar. 25, 2011.

(52) U.S. Cl.
CPC .............. *H01L 2224/32225* (2013.01); *H01L 2224/45139* (2013.01); *H01L 2224/4813* (2013.01); *H01L 2224/48091* (2013.01); *H01L 2224/48137* (2013.01); *H01L 2224/48227* (2013.01); *H01L 2224/49113* (2013.01); *H01L 2924/181* (2013.01); *Y02B 20/347* (2013.01)

(56) References Cited

U.S. PATENT DOCUMENTS

| | | | |
|---|---|---|---|
| 7,095,053 B2* | 8/2006 | Mazzochette et al. | 257/81 |
| 7,408,308 B2 | 8/2008 | Sawada et al. | |
| 7,626,211 B2* | 12/2009 | Sugiura et al. | 257/99 |
| 7,969,404 B2 | 6/2011 | Lee et al. | |
| 9,101,019 B2* | 8/2015 | Jong | H05B 33/0818 |
| 2003/0117369 A1* | 6/2003 | Spitzer et al. | 345/156 |
| 2006/0012986 A1* | 1/2006 | Mazzochette et al. | 362/227 |
| 2008/0122383 A1 | 5/2008 | Katoh | |
| 2009/0295775 A1 | 12/2009 | Kim et al. | |
| 2010/0026203 A1* | 2/2010 | Zhao et al. | 315/291 |
| 2010/0176507 A1* | 7/2010 | Shiv et al. | 257/698 |
| 2010/0194274 A1* | 8/2010 | Hoogzaad | 315/51 |
| 2010/0194298 A1 | 8/2010 | Kuwabara | |
| 2010/0231135 A1* | 9/2010 | Hum et al. | 315/250 |
| 2010/0270931 A1* | 10/2010 | Hui | 315/113 |
| 2010/0308739 A1 | 12/2010 | Shteynberg et al. | |
| 2011/0068702 A1* | 3/2011 | van de Ven et al. | 315/186 |

FOREIGN PATENT DOCUMENTS

| | | | |
|---|---|---|---|
| CN | 101109501 | 1/2008 | |
| CN | 101193484 | 6/2008 | |
| CN | 2013-23679 | 10/2009 | |
| CN | 101589539 | 11/2009 | |
| CN | 101707831 | 5/2010 | |
| CN | 201491338 | 5/2010 | |
| CN | 101779522 | 7/2010 | |
| EP | 1 881 746 | 1/2008 | |
| KR | 10-2010-0067468 | 6/2010 | |
| KR | 10-2011-0007706 | 1/2011 | |
| WO | WO 2012101519 A2 * | 8/2012 | H05B 33/0818 |
| WO | WO 2012101521 A2 * | 8/2012 | H05B 33/0818 |

OTHER PUBLICATIONS

The First Office Action issued on May 19, 2014 in Chinese Patent Application No. 201280006928.X.
Chinese Office Action issue Jul. 2, 2014 for Chinese Application No. 201280006874.7.

* cited by examiner

LED DRIVING CIRCUIT PACKAGE

CROSS REFERENCE TO RELATED APPLICATIONS

This application claims the benefit of U.S. Provisional Patent Application Nos.: 61/437,288, filed on Jan. 28, 2011; 61/437,296, filed on Jan. 28, 2011; 61/437,932, filed on Jan. 31, 2011; 61/438,304, filed on Feb. 1, 2011; 61/438,308, filed on Feb. 1, 2011; 61/442,732, filed on Feb. 14, 2011; 61/467,782, filed on Mar. 25, 2011; and 61/565,574, filed on Dec. 1, 2011, which are all hereby incorporated by reference for all purposes as if fully set forth herein.

BACKGROUND OF THE INVENTION

1. Field of the Invention

Exemplary embodiments of the present invention relate to a Light-Emitting Diode (LED) luminescence apparatus using Alternating Current (AC) power and, more particularly, to an LED luminescence apparatus that is capable of improving power factor and Total Harmonics Distortion (THD) and effectively dealing with the distortion and commercial AC voltage and variation in the magnitude thereof. Exemplary embodiments of the present invention also relate to an LED luminescence apparatus equipped with a driving circuit, which defines the characteristic range of total LED driving voltage (Vf) and uses LEDs having a plurality of driving voltages, thus decreasing a flicker phenomenon and increasing the quantity of light while minimizing an interval in which the LEDs are turned off.

2. Discussion of the Background

FIG. 1 is a block diagram of a conventional LED luminescence apparatus using AC power.

The conventional LED luminescence apparatus using AC power 1 is configured to provide unidirectional ripple voltage, output from a rectification circuit 2 that is implemented using a bridge circuit, to high voltage LEDs 3-1 to 3-4 via a resistor 4.

In such a conventional LED luminescence apparatus using AC power, LED driving current provided to the LEDs may not have a complete sinusoidal wave form and there may be a phase difference between the LED driving current and AC voltage, and therefore a problem may arise in that electrical characteristics, including power factor and THD, do not fulfill requirements for LED lighting.

In order to solve this problem, there is a method of reducing LED driving voltage (forward voltage: Vf). However, since the driving efficiency and light output characteristics of high-voltage driven LEDs may be determined depending on the driving voltage Vf of the LEDs, the simple reduction in the driving voltage Vf of the LEDs may cause the problem of not fulfilling the power factor and the THD that are presented in the LED lighting standard.

Furthermore, commercial AC power may not provide AC voltage in ideal sinusoidal wave form. That is, the problem of the magnitude of commercial AC voltage being higher or lower than that of a reference voltage in ideal sinusoidal wave form arises, and the waveform thereof may be distorted by harmonics.

FIG. 2A and FIG. 2B are waveform diagrams showing the waveforms of current, each of which is provided to LEDs and is subject to variation in AC power or the distortion of the AC power, in the conventional LED luminescence apparatus over time.

When the instantaneous voltage of an input voltage exceeds the driving voltage Vf of the LEDs, a driving current flows in proportion to the input voltage. As shown in FIG. 2A and FIG. 2B, the driving current of LEDs may be distorted by such deformation of the waveform of AC voltage. As a result, when LEDs are driven using AC power, the light emission efficiency of the LEDs may significantly vary depending on the shape and magnitude of the driving current.

Further, in order to drive LEDs using AC power, various circuits such as a rectification circuit, a power supply circuit, a voltage detection circuit, a pulse generation circuit, a switch circuit, and a current control circuit may be required.

SUMMARY OF THE INVENTION

Exemplary embodiments of the present invention provide a light-emitting diode (LED) driving circuit package.

Additional features of the invention will be set forth in the description which follows, and in part will be apparent from the description, or may be learned by practice of the invention.

An exemplary embodiment of the present invention discloses a light-emitting diode (LED) driving circuit package, which includes a rectification unit to receive an alternating current (AC) power voltage and rectify the AC power voltage to generate a ripple voltage, an LED driving switching unit including a plurality of switch units and a plurality of current control units, and a low voltage control unit including a circuit power supply unit to generate low voltage power, a voltage detection unit to detect a magnitude of the ripple voltage, a reference frequency generation unit for operating using the low voltage power generated by the circuit power supply unit to generate a reference frequency, and a reference pulse generation unit for operating using the low voltage power generated by the circuit power supply unit to generate a reference pulse for controlling the operation of the LED driving switch unit according to the reference frequency and a magnitude of the voltage detected by the voltage detection unit.

Another exemplary embodiment of the present invention discloses a light-emitting diode (LED) driving circuit package, which includes a rectification unit to receive an alternating current (AC) power voltage and rectify the AC power voltage to generate a ripple voltage, an LED driving switching unit including a plurality of switch units and a plurality of current control units, and a low voltage control unit including a circuit power supply unit to generate low voltage power, a voltage detection unit to detect a magnitude of the ripple voltage, a reference frequency generation unit to generate a reference frequency, and a reference pulse generation unit to generate a reference pulse for controlling the operation of the LED driving switch unit according to the reference frequency and a magnitude of the voltage detected by the voltage detection unit. At least one diode of the rectification unit is disposed on a diode mounting pad as an individual element.

Still another exemplary embodiment of the present invention discloses a light-emitting diode (LED) driving circuit package, which includes a board having a die attach area at a center portion thereof, an LED chip attached to the die attach area, and a plurality of electrode pad units formed around the die attach area and configured to form electrical connections to terminal units of the LED chip via wires.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
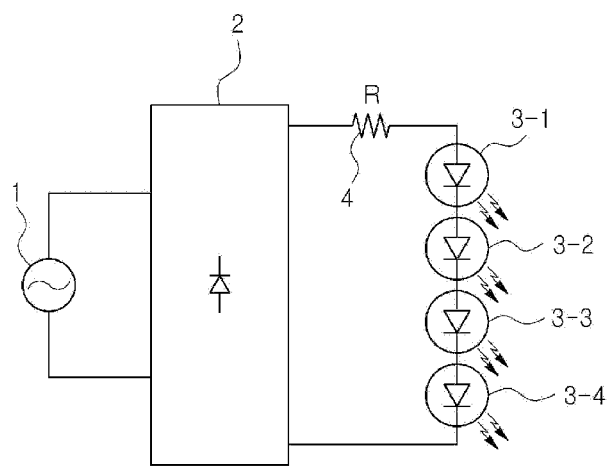
FIG. 1 is a block diagram of a conventional LED luminescence apparatus using AC power.
Figure 2A:
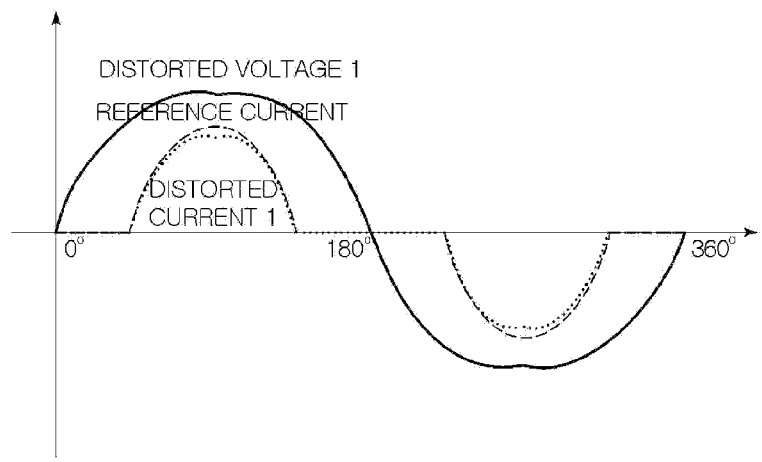
FIG. 2A and FIG. 2B are waveform diagrams showing the waveforms of current in the conventional LED luminescence apparatus of FIG. 1.
Figure 2B:
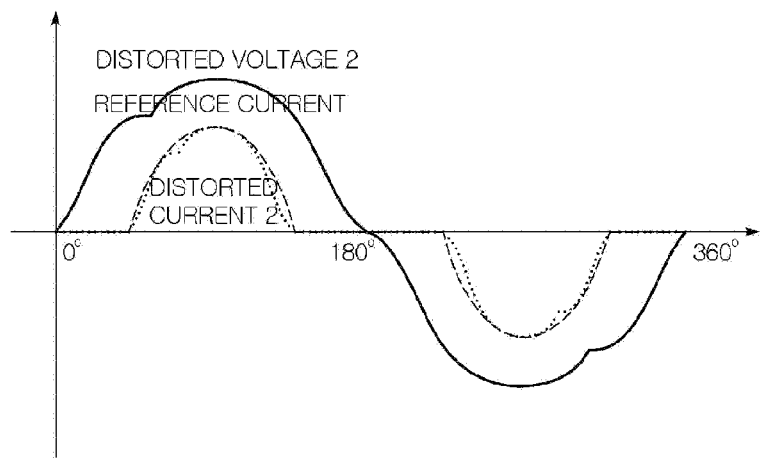

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 3:
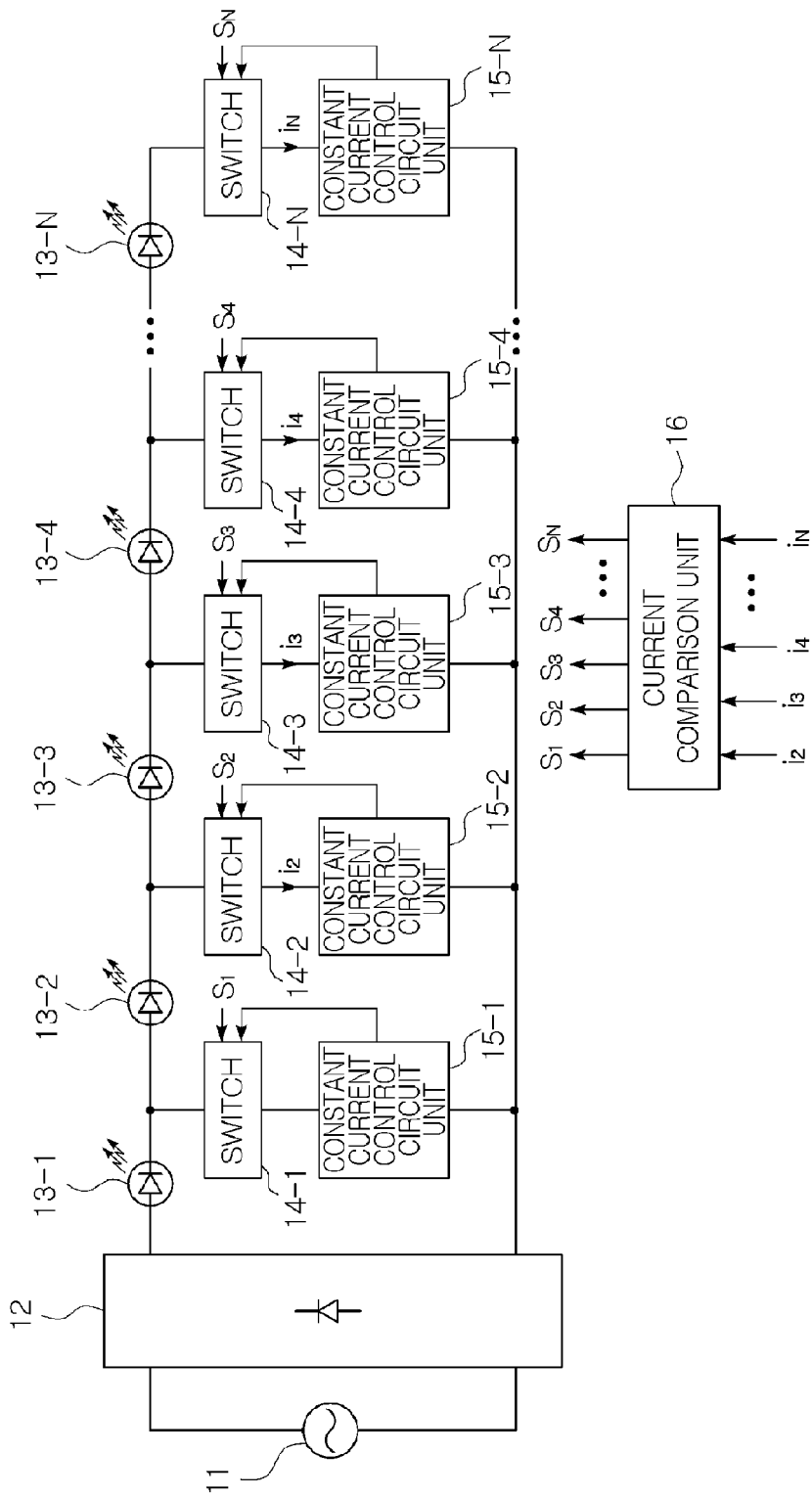
FIG. 3 is a block diagram of an LED luminescence apparatus using AC power according to an exemplary embodiment of the present invention.

FIG. 3 is a block diagram of an LED luminescence apparatus using AC power according to an exemplary embodiment of the present invention.

Referring to FIG. 3, the LED luminescence apparatus using AC power according to the present exemplary embodiment may include an AC power source 11, a rectification circuit unit 12, a plurality of LED units 13-1 to 13-N, a plurality of switches 14-1 to 14-(N−1), constant current control circuit units 15-1 to 15-(N−1), and a current comparison unit 16.

The AC power source 11 may be a commercial AC power source, and may provide AC voltage in a sinusoidal wave form.

The rectification circuit unit 12 may generate unidirectional ripple voltage by rectifying AC voltage provided by the AC power source 11. The rectification circuit unit 12 may be a bridge circuit that is implemented using a plurality of diodes.

The plurality of LED units 13-1 to 13-N may be connected in series to each other in forward direction. That is, one terminal of the rectification circuit unit 12 is connected to an anode, a positive terminal, of the LED unit 13-1, and a cathode, a negative terminal, of the LED unit 13-1 is connected to an anode of the LED unit 13-2. A cathode of the LED unit 13-2 is connected to an anode of the LED unit 13-3, and so on. Each of the LED units 13-1 to 13-N shown in FIG. 3 may be a single LED, or may include a plurality of LEDs, the same polarity terminals of which are connected to each other (that is, which are connected in parallel to each other). Here, the number of LEDs that are connected in series may be increased to improve the efficiency of a drive circuit and perform current control in multiple stages.

Each of the switches 14-1 to 14-(N−1) may be connected, at one end thereof, to a node where two of the plurality of LED units 13-1 to 13-N are connected to each other. That is, a first switch 14-1 may be connected to a node where a first LED unit 13-1 and a second LED unit 13-2 are connected to each other, and a second switch 14-2 may be connected between the second LED unit 13-2 and a third LED unit 13-3. An (N−1)th switch 14-(N−1) may be connected between an (N−1)th LED unit 13-(N−1) and an Nth LED unit 13-N.

These switches 14-1 to 14-(N−1) may operate in response to switch control signals S1 to SN output from the current comparison unit 16, which will be described later. Furthermore, the switches 14-1 to 14-N may operate in response to control signals from the constant current control circuit units 15-1 to 15-N.

The constant current control circuit units 15-1 to 15-N may control current flowing through the plurality of LED units 13-1 to 13-N so that it has a specific magnitude. The constant current control circuit units 15-1 to 15-(N−1) may be connected to the remaining ends of the switches 14-1 to 14-N.

The current comparison unit 16 may receive currents i2 to iN flowing through the switches 14-2 to 14-N in response to opening of the switches 14-2 to 14-N, which is respectively controlled by the constant current control circuit units 15-1 to 15-N. In greater detail, the current comparison unit 16 generates switching control signals S1 to SN to close (turn on) the switches 14-1 to 14-N or open (turn off) so that the constant current control circuit units 15-1 to 15-N sequentially operate. That is, each of the switching control signals S1 to SN switches a corresponding switch 14-1 to 14-N to an open state (turned-off state) when downstream stage currents i2 to iN are received and if any one thereof reaches a preset value. For example, the first switching control signal S1 switches the first switch 14-1 to an open state when the downstream stage currents i2 to iN are received and if any one thereof reaches the preset value, the second switching control signal S2 switches the second switch 14-2 to an open state (turned-off state) when the downstream stage currents i3 to iN are received and if any one thereof reaches the preset value, and the (N−1)th switch control signal S(N−1) switches the (N−1)th switch 15-(N−1) to an open state (turned-off state) when the downstream current iN is received and if the corresponding current reaches the preset value.

The operation of the LED luminescence apparatus using AC power according to the present exemplary embodiment shown in FIG. 3 will now be described in detail.

First, when AC voltage is applied to the rectification circuit unit 12 by the AC power source 11, the rectification circuit unit 12 rectifies the AC voltage, and then outputs unidirectional ripple voltage. As shown in FIG. 3, the output voltage of the AC power source 11, that is, voltage input to the rectification circuit unit 12, is AC voltage alternating between positive and negative voltage levels, and the voltage output from the rectification circuit unit 12 assumes the form of unidirectional ripple voltage in which the negative direction of voltage has been switched to a positive direction. The ripple voltage is provided to the plurality of LED units 13-1 to 13-N.

Thereafter, as ripple voltage increases, the LED units 13-1 to 13-N can sequentially emit light. Such light emitting operation of the LED units will now be described with reference to FIGS. 4 and 5.

Figure 4:
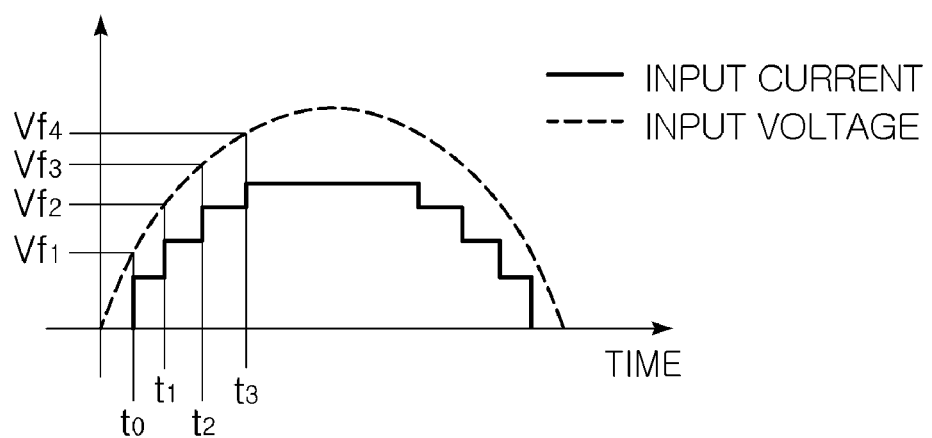
FIG. 4 is a waveform diagram illustrating the waveforms of AC voltage and AC current provided to the LEDs in the LED luminescence apparatus using AC power according to the exemplary embodiment of FIG. 3.

FIG. 4 is a waveform diagram illustrating the waveforms of AC voltage and AC current provided to the LEDs in the LED luminescence apparatus using AC power according to the present exemplary embodiment.

Figure 5:
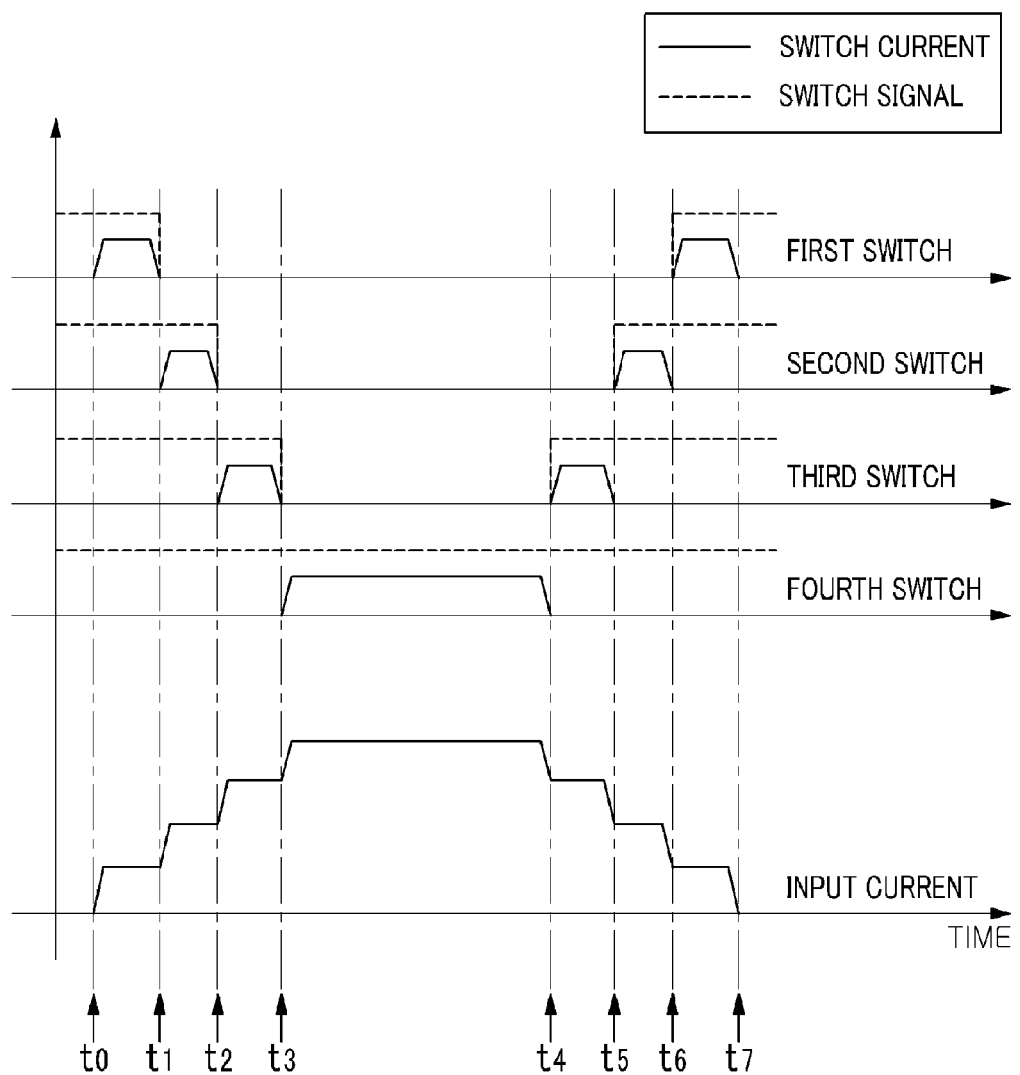
FIG. 5 is a waveform diagram illustrating the waveforms of the control signals of the switches provided in the LED luminescence apparatus using AC power according to the exemplary embodiment of FIG. 3.

Furthermore, FIG. 5 is a waveform diagram illustrating the waveforms of the control signals of the switches provided in the LED luminescence apparatus using AC power according to the present exemplary embodiment, the waveform of current flowing through the switches, and the waveform of current provided to the LEDs over time.

FIGS. 4 and 5 illustrate the case where the number of LED units is four, that is, N=4. Accordingly, an example of the case where in FIG. 3, the value of N is set to four will be described. Furthermore, FIGS. 4 and 5 illustrate only a single cycle of ripple voltage provided by the rectification circuit unit 12. Since the same operation is performed in the remaining cycles of the ripple voltage, description of the remaining cycles is omitted for the sake of brevity.

When the magnitude of the ripple voltage provided to the LED units 13-1 to 13-4 increases and the ripple voltage reaches the driving voltage (forward voltage Vf1) of the first LED unit 13-1, current flows through the first LED unit 13-1 and light is emitted (at time t0 of FIGS. 4 and 5)

Here, the first switch 14-1 to the fourth switch 14-4 are initially set to a close state (turned-on state). Such input voltage Vf1 is the voltage which enables the first LED unit 13-1 to be turned on, and the current corresponding to the input voltage Vf1 flows through a path to the first constant current circuit control unit 15-1 via the first LED 13-1. In this case, the first switch 14-1 uniformly controls current passing through the first constant current control circuit unit 15-1 in response to a control signal output from the first constant current control circuit unit 15-1. The first constant current control circuit unit 15-1 performs constant current control so that reference current preset to drive the first LED unit 13-1 can flow through the first LED unit 13-1. The operation in which the first LED unit 13-1 initiates light emission corresponds to a time interval t0-t1 in FIGS. 4 and 5.

Thereafter, when the magnitude of the ripple voltage further increases and voltage applied to the second LED unit 13-2 reaches the driving voltage of the second LED unit 13-2 (when the magnitude of the ripple voltage becomes Vf2), current flows through the second LED unit 13-2 and the second LED unit 13-2 emits light (at time t1 of FIGS. 4 and 5). Here, the input voltage Vf2 is the voltage which enables the first and second LED units 13-1 and 13-2 to be turned on, and the current corresponding to the input voltage Vf2 flows through a path to the second constant current circuit control unit 15-2 via the second LED unit 13-2. In this case, the current comparison unit 16 senses that the current i2 of the second constant current control circuit unit 15-2 is a preset value, generates a first switching control signal S1, thus opening (turning off) the first switch 14-1. At the same time, the second switch 14-2 performs control in response to the control signal output from the second constant current control circuit unit 15-2 so that current flowing through the second constant current control circuit unit 15-2 becomes the reference current preset to drive both the first and second LED units 13-1 and 13-2.

Using this operation, control may be performed such that constant current flows through the first LED unit 13-1 and the second LED unit 13-2. Furthermore, as shown in FIGS. 4 and 5, at time t1, the first switch 14-1 is turned off, and stepped input current can be formed by the constant current control of the second constant current control circuit unit 15-2.

Similarly to the above-described procedure, when the ripple voltage further increases and voltage applied to the third LED unit 13-3 becomes the driving voltage of the third LED unit 13-3 (when the magnitude of the ripple voltage becomes Vf3), current flows through the third LED unit 13-3 and then the third LED unit 13-3 emits light (at time t2 of FIGS. 4 and 5). Here, the input voltage Vf3 is the voltage which enables the first LED unit 13-1 to the third LED unit 13-3 to be turned on, and current corresponding to the input voltage Vf3 flows through a path to the third constant current circuit control unit 15-3 via the third LED unit 13-3. In this case, the current comparison unit 16 senses that the current i3 of the third constant current control circuit unit 15-3 is a preset value, and generates a second switching control signal S2, thus opening (turning off) the second switch 14-2. The first switch control signal S1 is maintained in its previous state, so that the first switch 14-1 is maintained in an open (turned-off) state. At the same time, the third switch 14-3 performs control in response to a control signal output from the third constant current control circuit unit 15-3 so that current flowing through the third constant current control circuit unit 15-3 becomes the reference current preset to drive the first to third LED units 13-1 to 13-3.

Using this operation, control may be performed such that constant current flows through the first LED unit 13-1, the second LED unit 13-2, and the third LED unit 13-3. Furthermore, as shown in FIGS. 4 and 5, at time t2, the first switch 14-1 and the second switch 14-2 are turned off, and stepped input current can be formed by the constant current control of the third constant current control circuit unit 15-3.

Similarly to the above-described procedure, when the ripple voltage further increases, and voltage applied to the fourth LED unit 13-4 becomes the driving voltage of the fourth LED unit 13-4 (when the magnitude of the ripple voltage becomes Vf4), current flows through the fourth LED unit 13-4 and then the fourth LED unit 13-4 emits light (at time t3 of FIGS. 4 and 5). Here, the input voltage Vf4 is the voltage which enables all of the first LED unit 13-1 to the fourth LED unit 13-4 to be turned on, and current corresponding to the input voltage Vf4 flows through a path to the fourth constant current circuit control unit 15-4 via the fourth LED unit 13-4. In this case, the current comparison unit 16 senses that the current i4 of the fourth constant current control circuit unit 15-4 is a preset value, and generates a third switching control signal S3, thus opening (turning off) the third switch 14-3. The first and second switch control signals S1 and S2 are maintained in their previous states, so that the first and second switches 14-1 and 14-2 are maintained in an open (turned-off) state. At the same time, the fourth switch 14-4 performs control in response to a control signal output from the fourth constant current control circuit unit 15-4 so that current flowing through the fourth constant current control circuit unit 15-4 becomes reference current preset to drive the first to fourth LED units 13-1 to 13-4.

Using this operation, control may be performed such that constant current flows through the first LED unit 13-1, the second LED unit 13-2, the third LED unit 13-3, and the fourth LED unit 13-4. Furthermore, as shown in FIGS. 4 and 5, at time t3, the third switch is turned off, and stepped input current can be formed by the constant current control of the fourth constant current control circuit unit 15-4.

When ripple voltage passes over a peak and gradually decreases, the LED units are sequentially turned off in the sequence from the fourth LED unit 13-4 to the first LED unit 13-1. When the fourth LED unit 13-4 is turned off (at time t4), the current comparison unit 16 senses that the current i4 of the fourth constant current control circuit unit 15-4 is not the preset value, and inverts the fourth switching control signal S4, thus closing (turning on) the third switch 14-3. In this case, the first and second switching control signals S1 and S2 are maintained in their previous states, so that the first and second switches 14-1 and 14-2 are maintained in an open (turned-off) state. At the same time, the third switch 14-3 initiates constant current control in response to a control signal output from the third constant current control circuit unit 15-3 so that the current flowing through the third constant current control unit 15-3 is maintained at the reference current preset to drive the first to third LED units 13-1 to 13-3.

A subsequent current control operation is performed in the reverse order of the constant current control performed during the above-described interval t0 to t3, and thus a detailed description thereof will be omitted here.

Although the present exemplary embodiment has been described such that LED driving current is increased or decreased in stepped form by multi-stage constant current control, the present invention is not limited thereto, but the waveform of the LED driving current can be changed by variously setting reference current for constant current control.

Figure 6:
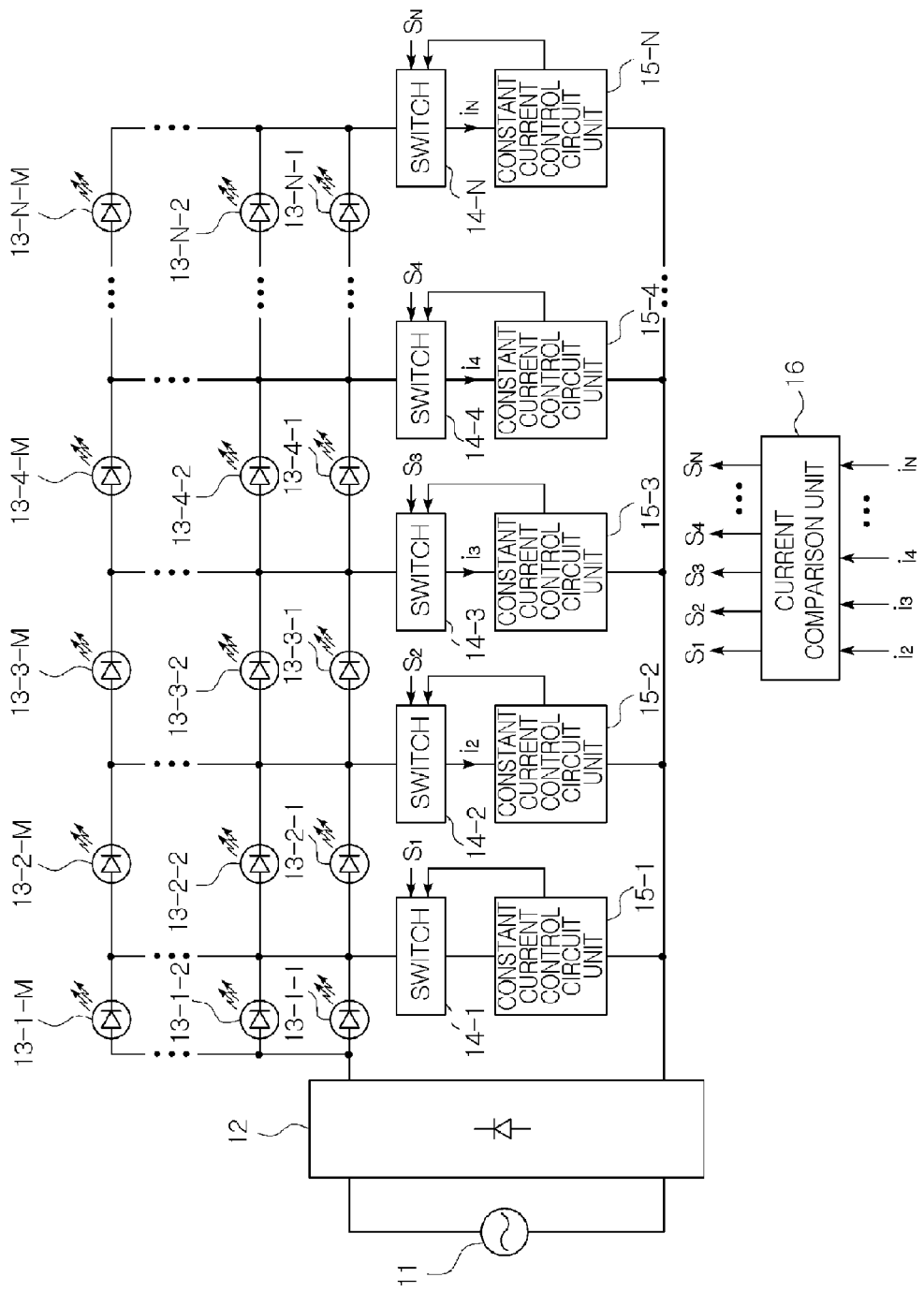
FIG. 6 is a block diagram of an LED luminescence apparatus using AC power according to an exemplary embodiment of the present invention.

FIG. 6 is a block diagram of an LED luminescence apparatus using AC power according to an exemplary embodiment of the present invention.

Since the configuration of the LED luminescence apparatus of the exemplary embodiment shown in FIG. 6 is the same as that of the exemplary embodiment described above with respect to FIG. 3, except for the LED units 13-1-1 to 13-N-M, a description thereof will be omitted here.

In the present exemplary embodiment, each of the LED units is configured such that a plurality of LEDs is connected in parallel to each other, for example, a first LED unit 13-1-1 to 13-1-M is configured such that M LEDs are connected in parallel to each other. Here, the number of LEDs connected in parallel may be increased for the purpose of an increase in the luminous flux of an LED lighting lamp or an increase in the capability of the lamp.

As described above, exemplary embodiments of the present invention are configured to sequentially drive the series-connected LEDs at constant current using AC voltage, so that current that increases or decreases in stepped form can be provided, as shown in FIGS. 4 and 5, and therefore LED driving current approximate to a sinusoidal wave equal to AC voltage is provided, thereby enabling problems related to the power factor, THD, etc. to be solved.

Constant driving current can be provided in the event of a variation in AC voltage (distortion, or an increase or decrease in the magnitude of voltage) by controlling current so that it has a constant value at each stage, thereby improving the light output efficiency of AC-driven LEDs.

Figure 7:
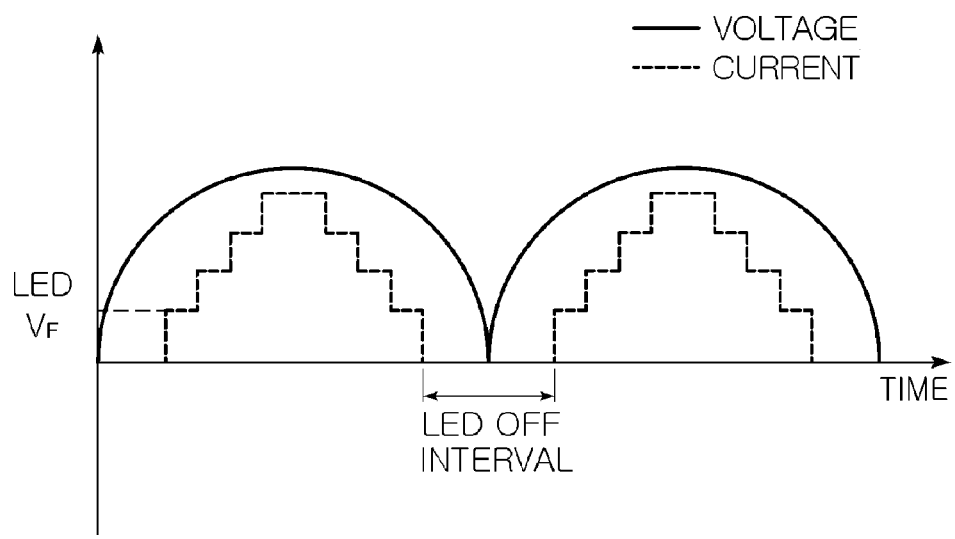
FIG. 7 is a waveform diagram showing the waveforms of AC voltage and current supplied to LEDs using multi-stage current driving according to an exemplary embodiment of the present invention.

A method of generating the driving current of an LED in a stepped shape using multi-stage current driving is shown in FIG. 7.

FIG. 7 is a waveform diagram showing the waveforms of AC voltage and current supplied to an LED according to multi-stage current driving.

As shown in FIG. 7, before a predetermined voltage is applied to an LED, the LED is maintained in an OFF state. Accordingly, before the input voltage reaches the turn-on voltage of the LED, there exists an LED OFF interval in which input current is not present. Due to such current-voltage operating characteristics, the power factor defined as the ratio of input real power to input apparent power may be deteriorated and a harmonic component may increase. In this case, the LED OFF interval occurs depending on the characteristics of the driving voltage (Vf) of the LED, which may result in a flicker phenomenon, deteriorated power factor, and decreased quantity of light, depending on the size of the LED OFF interval.

As shown in FIG. 7, there is an OFF interval during which current does not flow between the time at which a plurality of LED units are sequentially turned on and then sequentially turned off in one cycle of the ripple voltage, and the time at which the LED units are turned on again in a subsequent cycle of the ripple voltage. When this OFF interval increases, the power factor (defined as the ratio of input real power to input apparent power) may decrease, and a harmonic component may increase, and thus it is preferable to minimize such an OFF interval.

There is a relationship between the driving voltage (forward voltage: Vf) of LED units employed in the luminescence apparatus and the OFF interval, thus the driving voltage may be manipulated in order to minimize the OFF interval.

Hereinafter, techniques for minimizing the OFF interval according to exemplary embodiments of the present invention will be described with respect to FIG. 8, FIG. 9, and FIG. 10, using various graphs showing relationships between the driving voltage of the LED units and the OFF interval.

Figure 8:
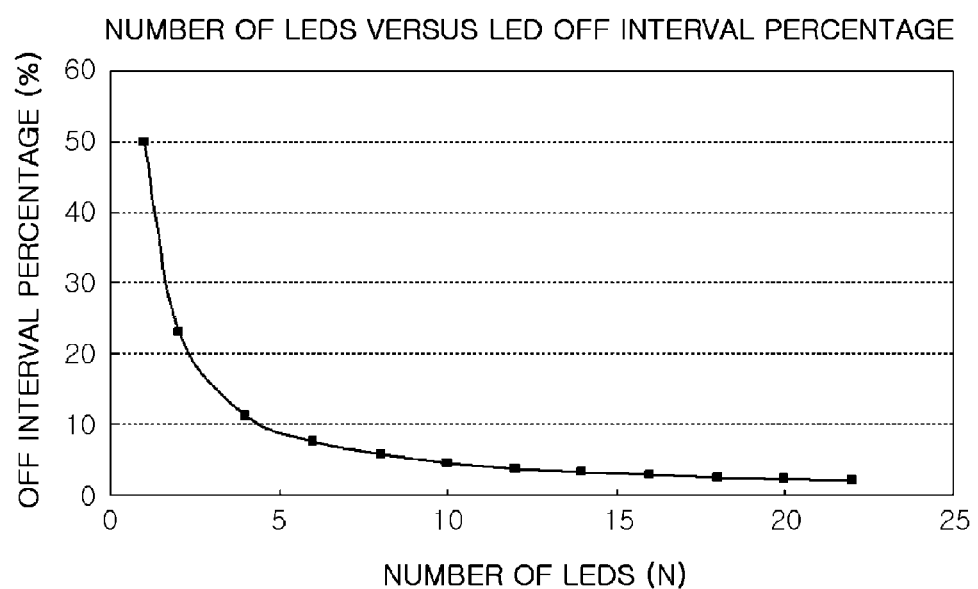
FIG. 8 is a graph showing the number of LEDs versus an LED OFF interval ratio when a plurality of LED units having the same driving voltage are connected in series in the LED luminescence apparatus using AC power according to an exemplary embodiment of the present invention.

FIG. 8 is a graph showing the number of LEDs versus an OFF interval percentage when a plurality of LED units having the same driving voltage are connected in series to each other in the LED luminescence apparatus using AC power according to an exemplary embodiment of the present invention.

As shown in FIG. 8, when there are a large number of series-connected LEDs, the percentage of LEDs in the OFF interval may decrease. In particular, when the total LED driving voltage Vf is constant, if the number of LEDs increases, the driving voltage Vf of each individual LED decreases.

Therefore, the percentage of LEDs in the OFF interval may be reduced by employing LEDs having different driving voltages Vf rather than employing LED units having the same driving voltage.

Figure 9:
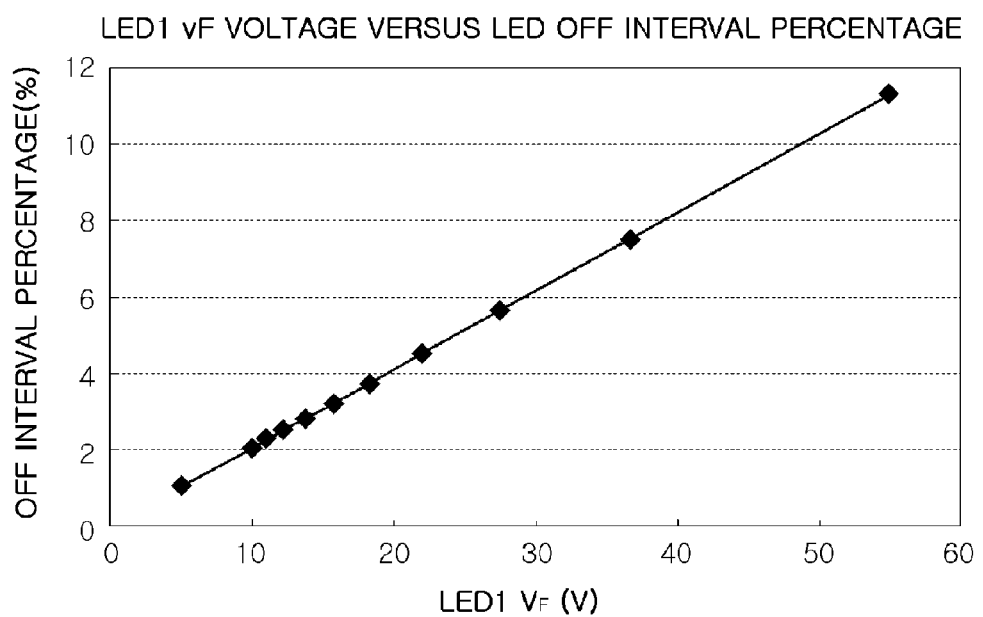
FIG. 9 is a graph showing a relationship between the driving voltage of a first diode and an OFF interval in the LED luminescence apparatus using AC power according to the exemplary embodiment of FIG. 3.

FIG. 9 is a graph showing the relationship between the driving voltage of a first LED unit, which first emits light, and an OFF interval in the LED luminescence apparatus using AC power according to the present exemplary embodiment and the LED luminescence apparatus described above with respect to FIG. 3.

As shown in FIG. 9, it can be seen that as the driving voltage Vf of the first LED unit LED1 (13-1 in FIG. 3) which first emits light decreases, the percentage of LEDs in the OFF interval decreases. That is, in the case of the first LED unit LED1 (13-1) that is turned on when ripple voltage increases above a threshold voltage and is turned off when the ripple voltage decreases below a threshold voltage, since the driving voltage Vf is lower for one cycle of the ripple voltage, the first LED unit may be turned on earlier and may be turned off later. Therefore, when the driving voltage Vf of the first LED unit LED1 (13-1) is decreased, the OFF interval between the present cycle and a subsequent cycle of the ripple voltage can be reduced.

Figure 10:
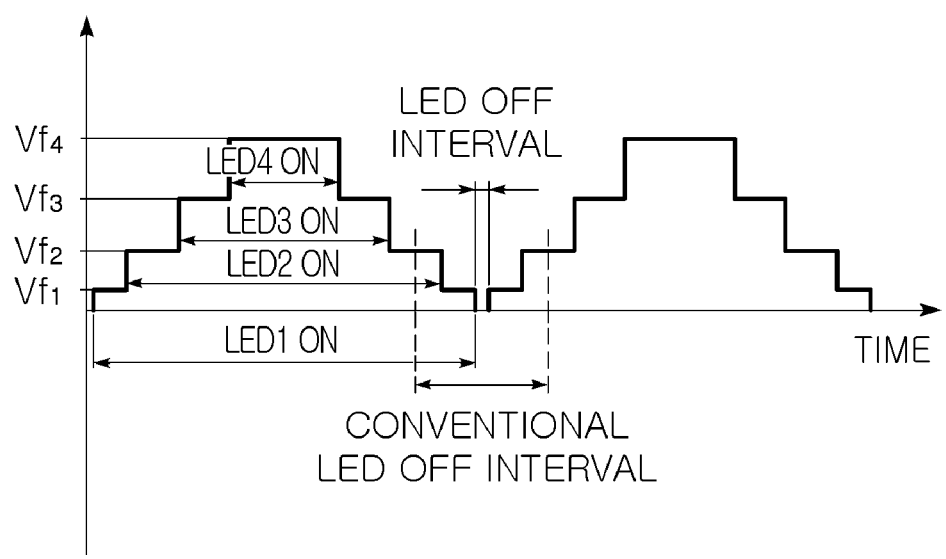
FIG. 10 is a waveform diagram showing the waveforms of AC voltage and AC current supplied to LEDs in the LED luminescence apparatus using AC power according to an exemplary embodiment of the present invention.

FIG. 10 is a waveform diagram showing the waveforms of AC voltage and AC current supplied to LEDs in the LED luminescence apparatus using AC power according to the present exemplary embodiment.

When the number of LED units is four, that is, N=4, the driving voltages Vf1 to Vf4 of the LED units 13-1 to 13-4 (LED1 to LED4) are implemented as different voltages, in particular, in such a way that the driving voltage Vf1 of the first LED unit 13-1 (LED1) closest to a rectification circuit unit 12 is set to the smallest value, as shown in FIG. 10. Accordingly, compared to FIG. 7, the time point at which the first LED unit 13-1 (LED1) is turned on is decreased, and the time point at which the first LED unit is turned off is increased, thus enabling the turn-on duration of the first LED unit 13-1 (LED1) to be maximized. As a result, the LED OFF interval may be reduced compared to that of the LED luminescence apparatus shown in FIG. 7.

Meanwhile, although the present exemplary embodiment has been described such that different stepped driving currents are used to drive the LED units at respective steps, the present invention is not limited thereto and can be implemented in various forms. For example, the LED units can be driven using the same current so that variations in the quantity of light depending on the voltages of LED units having a plurality of driving voltages Vf can be minimized. In this case, the driving current applied to the LED units can be formed in the shape of a single square wave.

That is, referring to FIG. 8, FIG. 9, and FIG. 10, the driving voltage of the first LED unit 13-1 (LED1) which is turned on first is set to the lowest voltage and that LED units having different driving voltages Vf may be used together in FIG. 3, thus minimizing the size of the OFF interval.

FIG. 6 is a block diagram showing an LED luminescence apparatus using AC power according to an exemplary embodiment of the present invention.

Since the construction of the LED luminescence apparatus of FIG. 6 is substantially similar to that of the exemplary embodiment described above with respect to FIG. 3, except for LED luminescence units 13-1-1 to 13-N-M, a detailed description thereof will be omitted.

In the present exemplary embodiment, each LED unit is implemented using a plurality of LEDs connected in parallel to each other. For example, a first LED unit 13-1-1 to 13-1-M can be implemented using M parallel-connected LEDs. In this case, the number of parallel-connected LEDs can be increased for the purpose of increasing the luminous flux of an LED luminescence lamp or increasing the capacity of the lamp.

As described above, the exemplary embodiments of the present invention are configured such that the driving voltages Vf of LED units may have a plurality of different values, thus reducing an OFF interval compared to the arrangement of LED units having the same driving voltage according to the conventional embodiment. By way of this configuration, the exemplary embodiments of the present invention not only may reduce a flicker phenomenon and increase the quantity of light, but also may improve the power factor and reduce the influence of harmonics.

A method of generating LED driving current in a stepped form using multi-stage current driving is described below with respect to FIG. 11.

Figure 11:
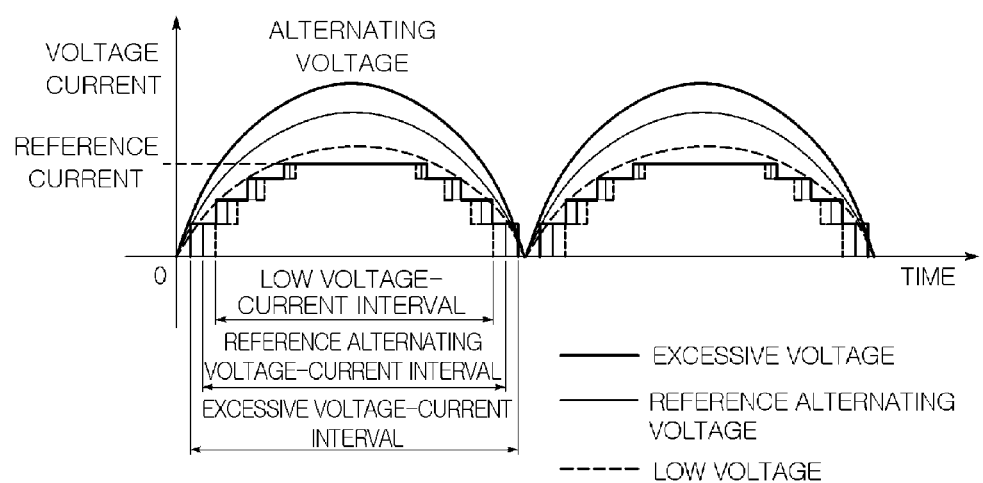
FIG. 11 is a waveform diagram illustrating waveforms of AC voltage and current provided to LEDs during multi-stage current driving.

FIG. 11 is a waveform diagram illustrating waveforms of AC voltage and current provided to LEDs during multi-stage current driving.

As shown in FIG. 11, when LED driving current is generated in a stepped form, the LED driving current can be kept constant in the same interval even while AC voltage is varying.

However, as AC voltage increases or decreases, an LED driving voltage Vf may instantaneously vary. As shown in FIG. 11, when an input voltage increases above a reference voltage, the time at which the input voltage reaches the LED driving voltage is earlier than that for the reference AC voltage and the time at which the LEDs are turned off is increased. Accordingly, an LED driving interval, that is, an LED current conduction interval, increases, and therefore the total amount of current increases. In contrast, when the input voltage decreases below the reference voltage, the time at which the input voltage reaches the LED driving voltage is later than that for the reference AC voltage and the time at which the LEDs are turned off is decreased. Accordingly, an LED driving interval, that is, an LED current conduction interval, decreases, and therefore the total amount of current decreases. As a result, the multi-stage current control method, such as that described above with respect to FIG. 3, may have a varying average LED driving current depending on variations in AC voltage.

Figure 12:
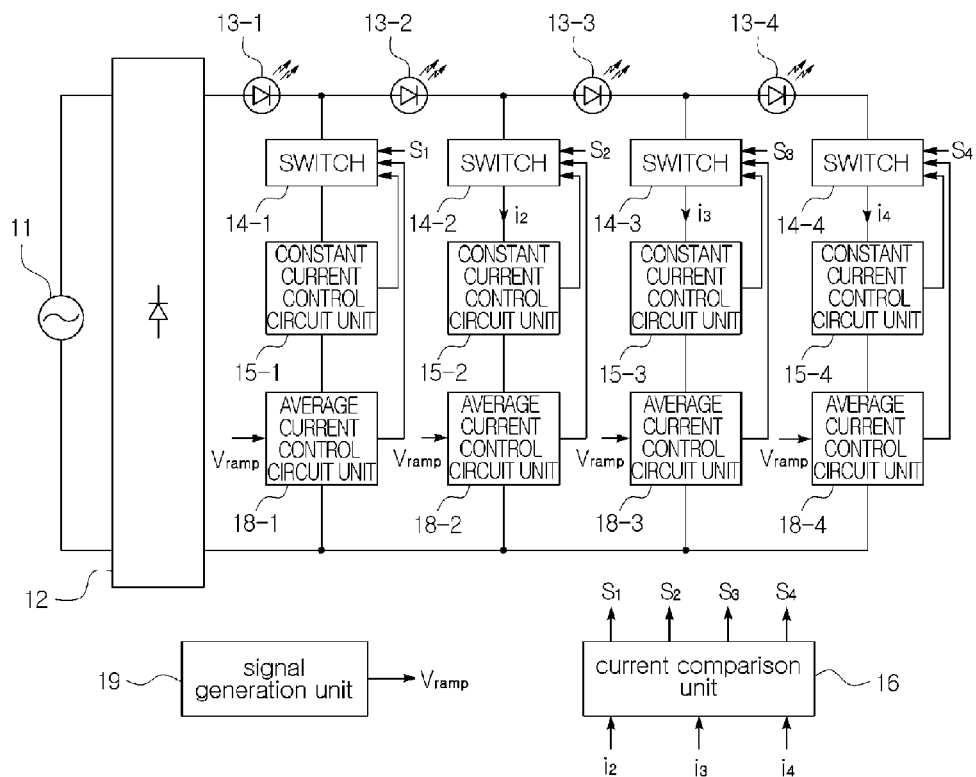
FIG. 12 is a block diagram of an LED luminescence apparatus according to an exemplary embodiment of the present invention.

FIG. 12 is a block diagram of an LED luminescence apparatus according to an exemplary embodiment of the present invention.

Referring to FIG. 12, the LED luminescence apparatus according to the present exemplary embodiment may include an AC power source 11, a rectification circuit unit 12, a plurality of LED units 13-1 to 13-4, a plurality of switches 14-1 to 14-4, constant current control circuit units 15-1 to 15-4, a current comparison unit 16, average current control circuit units 18-1 to 18-4, and a signal generation unit 19.

The AC power source 11 may be a commercial AC power source, and may provide AC voltage in a sinusoidal wave form.

The rectification circuit unit 12 may generate unidirectional ripple voltage by rectifying AC voltage provided by the AC power source 11. The rectification circuit unit 12 may be a bridge circuit that is implemented using a plurality of diodes.

The plurality of LED units 13-1 to 13-4 may be connected in series to each other. Each of the LED units 13-1 to 13-4 shown in FIG. 3 may be a single LED, or may include a plurality of LEDs, the same polarity terminals of which are connected to each other (that is, which are connected in parallel to each other). Here, the number of LEDs that are connected in series may be increased to improve the efficiency of a drive circuit and perform current control in multiple stages, and the number of LEDs that are connected in parallel may be increased to increase the luminous flux of the LED lighting lamp or the capacity of the LED lighting lamp.

For convenience of description, the plurality of LED units 13-1 to 13-4 that are connected in series to each other is labeled a first LED unit, a second LED unit, a third LED unit, and a fourth LED unit in the sequence of the connection thereof.

Each of the switches 14-1 to 14-4 may be connected, at one end thereof, to a node where two of the plurality of LED units 13-1 to 13-4 are connected to each other. That is, a first switch 14-1 may be connected to a node where a first LED unit 13-1 and a second LED unit 13-2 are connected to each other, a second switch 14-2 may be connected to a node where the second LED unit 13-2 and a third LED unit 13-3 are connected to each other, and a third switch 14-3 may be connected to a node where a third LED unit 13-3 and a fourth LED unit 13-4 are connected to each other.

These switches 14-1 to 14-4 may operate in response to switch control signals S1 to S4 output from the current comparison unit 16, which will be described later. Furthermore, the switches 14-1 to 14-4 may operate in response to control signals from the constant current control circuit units 15-1 to 15-4.

The constant current control circuit units 15-1 to 15-4 may control current flowing through the plurality of LED units 13-1 to 13-4 so that it has a specific magnitude. The constant current control circuit units 15-1 to 15-4 may be connected to the remaining ends of the switches 14-1 to 14-4.

The constant current control circuit units 15-1 to 15-4 generate the switch control signals of switch units 10-1 to 10-4 (see FIG. 13) that include the switches 14-1 to 14-4, and generate a control signal Vgs so as to control the maximum current, as will be described below.

The current comparison unit 16 may receive currents i2 to i4 flowing through the switches 14-2 to 14-4 in response to the constant current control circuit units 15-1 to 15-4, and generate the switching control signals S1 to S4 of the switches 14-1 to 14-4. In greater detail, the current comparison unit 16 generates switching control signals S1 to S4 depending on the closing (turning on) or opening (turning off) of the switches 14-1 to 14-4 so that the constant current control circuit units 15-1 to 15-4 sequentially operate. That is, each of the switching control signals S1 to S4 switches a corresponding switch 14-1 to 14-4 to an open state (turned-off state) when downstream stage currents i2 to i4 are received and if any one thereof reaches a preset value. For example, the first switching control signal S1 switches the first switch 14-1 to an open state when the downstream stage currents i2 to i4 are received and if any one thereof reaches the preset value, the second switching control signal S2 switches the second switch 14-2 to an open state (turned-off state) when the downstream stage currents i3 to i4 are received and if any one thereof reaches the preset value, and the third switch control signal S3 switches the third switch 15-3 to an open state (turned-off state) when the downstream current i4 is received and if the corresponding current reaches the preset value.

The average current control circuit units 18-1 to 18-4 generate a Pulse-Width Modulation (PWM) signal so as to control the average value of current flowing through the switches 14-1 to 14-4. The average current control circuit units 18-1 to 18-4 may detect the current of the constant current control circuit units 15-1 to 15-4 and control the average value of driving current flowing through the LED units 13-1 to 13-4, regardless of AC power. For example, when the AC voltage is a voltage higher than a higher reference voltage level, the driving time of the corresponding switches 14-1 to 14-4 is decreased by reducing the duty of the PWM signal, so as to decrease the driving interval of the LED units 13-1 to 13-4. In contrast, when the AC voltage is lower voltage than a lower reference voltage level, the driving time of the corresponding switch 14-1 to 14-4 is increased by increasing the duty of the PWM signal, so as to increase the driving interval of the LED units 13-1 to 13-4.

Meanwhile, since the average current control circuit units 18-1 to 18-4 drive the switches 14-1 to 14-4 using a PWM signal, the LED driving current at each stage is generated in the form of pulse waves.

The signal generation unit 19 generates a ramp signal, and applies it to the average current control circuit units 18-1 to 18-4 to generate the PWM signal. Here, the frequency of the generated signal is determined depending on the average driving current of the LED units 13-1 to 13-4, and may be, for example, in the range of 1 KHz to 100 KHz.

The operation of the LED luminescence apparatus using AC power according to an exemplary embodiment of the present invention shown in FIG. 12 will now be described in detail. Description of the present exemplary embodiment that substantially overlaps the description provided above with respect to FIG. 3 is omitted for the sake of brevity. In FIG. 12, the ripple voltage is provided to the plurality of LED units 13-1 to 13-4. Thereafter, as ripple voltage increases, the LED units 13-1 to 13-4 sequentially emit light. Such light emitting operation of the LED units are described with reference to both FIG. 4 and FIG. 5.

The first average current control circuit unit 18-1 detects the current of the first constant current control circuit unit 15-1, generates a PWM signal based on an error with respect to the reference current, and drives the first switch 14-1. That is, if the actual current is greater than or less than the reference current, the duty of the PWM signal is varied. Accordingly, as shown in FIG. 5, in a time interval t0-t1, the driving current of the first LED unit 13-1 is generated in a pulse wave form corresponding to that of the PWM signal, with the peak current thereof being kept constant.

The second average current control circuit unit 18-2 detects the current of the second constant current control circuit unit 15-2, generates a PWM signal based on an error with respect to the reference current, and drives the second switch 14-2. Accordingly, as shown in FIG. 5, in a time interval t1-t2, the driving currents of the first LED unit 13-1 and the second LED unit 13-2 are generated in a pulse wave form corresponding to that of the PWM signal, with the peak current thereof being kept constant.

The third average current control circuit unit 18-3 detects the current of the third constant current control circuit unit 15-3, generates a PWM signal based on an error with respect to the reference current, and drives the third switch 14-3. Accordingly, as shown in FIG. 5, in a time interval t2-t3, the driving current of the first to third LED units 13-1 to 13-3 is generated in a pulse wave form corresponding to that the PWM signal, with the peak current thereof being kept constant.

The fourth average current control circuit unit 18-4 detects the current of the fourth constant current control circuit unit 15-4, generates a PWM signal based on an error with respect to the reference current, and drives the fourth switch 14-4. Accordingly, as shown in FIG. 5, in a time interval t3-t4, the driving current of the first to fourth LED units 13-1 to 13-4 is generated in a pulse wave form corresponding to that of the PWM signal, with the peak current thereof being kept constant.

When ripple voltage passes over a peak and gradually decreases, the LED units are sequentially turned off in the sequence from the fourth LED unit 13-4 to the first LED unit 13-1. When the fourth LED unit 13-4 is turned off (at time t4), the current comparison unit 16 senses that the current i4 of the fourth constant current control circuit unit 15-4 is not the preset value, and inverts the third switching control signal S3, thus closing (turning on) the third switch 14-3. In this case, the first and second switching control signals S1 and S2 are maintained in their previous states, so that the first and second switches 14-1 and 14-2 are maintained in an open (turned-off) state. At the same time, current is input to the third constant current control circuit unit 15-3, and constant current control is initiated such that the reference current preset to drive the first to third LED units 13-1 to 13-3 can be maintained.

The third average current control circuit unit 18-3 detects the current of the third constant current control circuit unit 15-3, generates a PWM signal based on an error with respect to the reference current, and drives the third switch 14-3. Accordingly, as shown in FIG. 5, in a time interval t4-t5, the driving current of the first to third LED units 13-1 to 13-3 is generated in a pulse wave form corresponding to that the PWM signal, with the peak current thereof being kept constant.

A subsequent current control operation is performed in the reverse order of the constant current control performed during the above-described interval t0 to t3, and thus a detailed description thereof will be omitted here.

Figure 13:
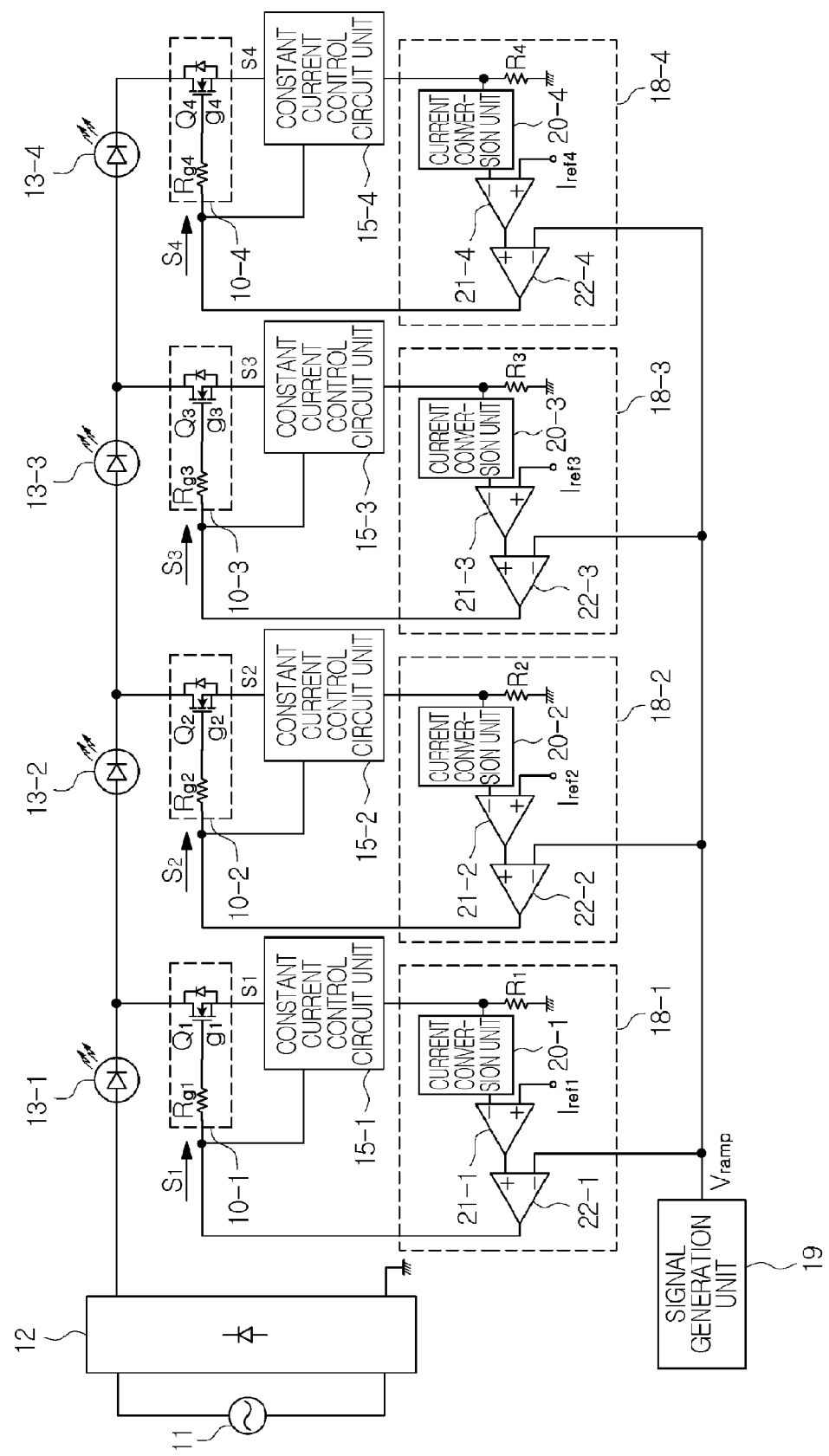
FIG. 13 is a detailed block diagram of the LED luminescence apparatus using AC power based on FIG. 12.
Figure 14:
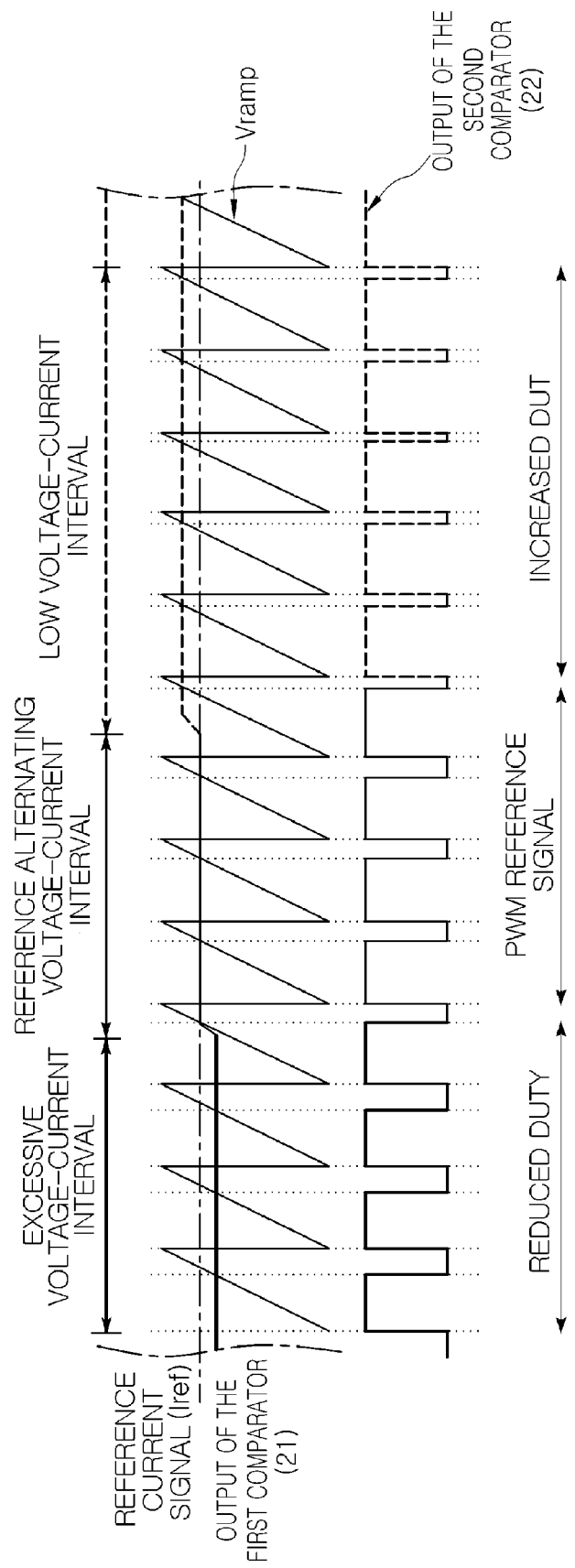
FIG. 14 is a waveform diagram illustrating the waveform of the PWM output signal of the average current control circuit unit in the LED luminescence apparatus using AC power according to the exemplary embodiment shown in FIG. 13.

Referring to FIG. 13 and FIG. 14, the control of the peak current and average current of LED driving current will be described in detail below.

FIG. 13 is a detailed block diagram of the LED luminescence apparatus using AC power based on FIG. 12.

In FIG. 13, switch units 10-1 to 10-4 correspond to the switches 14-1 to 14-4 of FIG. 12, and each include switching devices Q1 to Q4 and resistors Rg1 to Rg4, and the control signals of the constant current control circuit units 15-1 to 15-4 are input to the gates g1 to g4 of the switching devices Q1 to Q4. The switch units 10-1 to 10-4 generate constant current that fulfills the driving voltages Vf1 to Vf4 of the LED units 13-1 to 13-4.

The constant current control circuit units 15-1 to 15-4 are connected to the sources s1 to s4 and gates g1 to g4 of the switching devices Q1 to Q4. Furthermore, the constant current control circuit units 15-1 to 15-4 control the switching devices Q1 to Q4, which include power semiconductors, such as field effect transistors (FETs) or bipolar junction transistors (BJTs), at linear regions. That is, the constant current control circuit units 15-1 to 15-4 generate signals that control Vgs of the switching devices Q1 to Q4 so that the driving current of the LED unit 13-1 fulfills a set peak current value. In this case, the switching devices Q1 to Q4 operate at linear regions. Specifically, each of the constant current control circuit units 15-1 to 15-4 senses the current flowing from the respective switching device Q1 to Q4 via the respective resistors R1 to R4, and generates a control signal to control the respective switching device Q1 to Q4 based on the amount of the sensed current. For this, each of the constant current control circuit units 15-1 to 15-4 may include a switching element (not shown) which is selectively turned on according to the sensed current. Such switching element may be power semiconductors, such as field effect transistors (FETs) or bipolar junction transistors (BJTs). That is, if the switching element is a BJT, a base terminal of the BJT is connected to the source s1 of the respective switching device Q1 to Q4, a collector terminal of the BJT is connected to a gate terminal g1 of the respective switching device Q1 to Q4, and an emitter terminal of the BJT is connected to the respective resistors R1 to R4.

The average current control circuit units 18-1 to 18-4 may be configured to include detection resistors R1 to R4 for detecting the current of the constant current control circuits 15-1 to 15-4, current conversion units 20-1 to 20-4 for converting the detected current into DC current, first comparators 21-1 to 21-4 for performing comparison with reference currents Iref1 to Iref4 and outputting error values, and second comparators 22-1 to 22-4 for comparing the error values of the first comparators 21-1 to 21-4 with the signal Vramp of the signal generation unit 19 and generating PWM signals.

Here, the detection resistors R1 to R4 are connected in series to the constant current control circuit units 15-1 to 15-4, and the current conversion units 20-1 to 20-4 are connected between the detection resistors R1 to R4 and the constant current control circuit units 15-1 to 15-4, and the current flowing from the constant current control circuit units 15-1 to 15-4 is changed to a predetermined level by averaging the current. For example, each of the current conversion units 20-1 to 20-4 may be configured to include a filter.

The outputs of the current conversion units 20-1 to 20-4 are connected to the negative (−) terminals of the first comparators 21-1 to 21-4, and the reference currents Iref1 to Iref4 are connected to the positive (+) terminals of the first comparators 21-1 to 21-4. The outputs of the first comparators 21-1 to 21-4 are connected to the positive (+) terminals of the second comparators 22-1 to 22-4, and the output Vramp of the signal generator 19 is connected to the negative (−) terminals of the second comparators 22-1 to 22-4.

Furthermore, the average current control circuit units 18-1 to 18-4 generate signals that control Vgs of the switching devices Q1 to Q4 so that the driving current of the LED units 13-1 to 13-4 fulfills the set average current. In this case, the switching devices Q1 to Q4 operate at switching ON/OFF intervals.

The operation of the average current control circuit unit will now be described with reference to FIG. 13 and FIG. 14.

FIG. 14 is a waveform diagram illustrating the waveform of the PWM output signal of the average current control circuit unit in the LED luminescence apparatus using AC power according to the present exemplary embodiment.

Here, since the operation of the average current control circuit units 18-1 to 18-4 is the same at individual current intervals, only the operation at a first interval, that is, time interval t0 to t1, will be described.

First, when the AC voltage is a reference voltage and the detection resistor R1 detects the current of the constant current control circuit unit 15-1, the current conversion unit 18-1 converts the detected current into DC current and inputs the DC current to the first comparator 21-1. The first comparator 21-1 compares reference current Iref1 with the output signal of the current conversion unit 20-1, and outputs an error signal corresponding to the error. For example, the first comparator 21-1 may output an error signal if the output signal of the current conversion unit 20-1 is less than or greater than to the reference current Iref1.

Thereafter, the second comparator 22-1 compares signal Vramp, input by the signal generation unit 19, with the output of the first comparator 21-1, and generates a PWM reference signal for driving the switching device Q1. As shown in FIG. 14, the PWM reference signal has a band from 1 KHz to 100 KHz in response to the generated voltage Vramp of the signal generator 19. Here, the duty of the PWM reference signal is determined by the gain of the first comparators 21-1 to 21-4 so as to compensate for an increase or a decrease in input voltage.

The switching device Q1 performs ON and OFF switching in response to the PWM reference signal of the average current control circuit unit 18-1, so that the driving current of the LED unit 13-1 is generated in the form of pulses having a constant duty.

Furthermore, when the AC voltage is an excessive voltage, the detected current input to the negative (−) terminal of the first comparator 21-1 increases, and the output of the first comparator 21-1 is a signal at a level lower than that of the reference AC voltage. Accordingly, as shown in FIG. 14, the level of a signal input to the second comparator 22-1 decreases, and therefore the second comparator 22-1 generates a PWM signal having a reduced duty.

Accordingly, the switching device Q1 performs ON and OFF switching in response to the PWM signal having a reduced duty, and therefore the duty of the driving current of the LED unit 13-1 is reduced, thereby rendering it possible to control average current by reducing the driving interval of the LED unit 13-1.

Meanwhile, when the AC voltage is a low voltage and the detected current input to the negative (−) terminal of the first comparator 21-1 is reduced, the output of the first comparator 21-1 is a signal at a level higher than that of reference AC voltage. Accordingly, as shown in FIG. 14, since the level of a signal input to the second comparator 22-1 increases, the second comparator 22-1 generates a PWM signal having an increased duty.

Accordingly, the switching device Q1 performs ON and OFF switching in response to the PWM signal having an increased duty, and therefore the duty of the driving current of the LED unit 13-1 is increased, thereby rendering it possible to control average current by increasing the driving interval of the LED unit 13-1.

As described above, the present invention is configured to control the LED driving current using the PWM signal of the average current so that the LED driving current can have an average value regardless of variations in AC input voltage, thereby keeping the intensity of light emitted from the LEDs constant.

Furthermore, the present invention is configured to control a constant current control device, such as a BJT or an FET, in a hybrid manner in which linear region control and PWM switching have been combined together, the optical efficiency for input power can be increased, thereby mitigating loss in a driving circuit.

Figure 15:
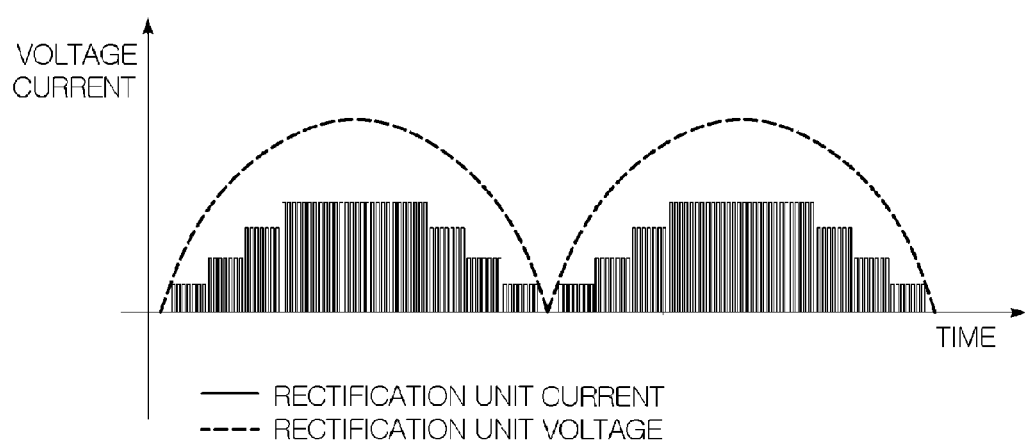
FIG. 15 is a waveform diagram showing the waveforms of AC voltage and current supplied to LEDs according to multi-stage Pulse Width Modulation (PWM) current driving.

FIG. 15 is a waveform diagram showing the waveforms of AC voltage and current supplied to LEDs according to multi-stage Pulse Width Modulation (PWM) current driving.

As shown in FIG. 15, when the driving current of LEDs is formed in a stepped shape, the LED driving current may be maintained at a constant level during each stepped interval even if AC voltage fluctuates. Further, in spite of variations in AC input voltage, LED driving current is controlled to have constant mean power using a PWM signal output from a current control circuit unit, so that LEDs can always output a constant amount of light.

However, as semiconductor elements for power are used as switching elements driven by such a PWM signal, and these switching elements perform switching in a high-frequency band, a large amount of noise may occur on input power at the time point at which the switching elements are turned on or off. That is, since the variation in current increases over time, various types of noise defined as Electromagnetic Interference (EMI) may be caused. In order to cancel such noise, an EMI filter unit may be separately added, thus increasing cost of the circuit and making it difficult to realize a small size and light weight of a power circuit.

Figure 16:
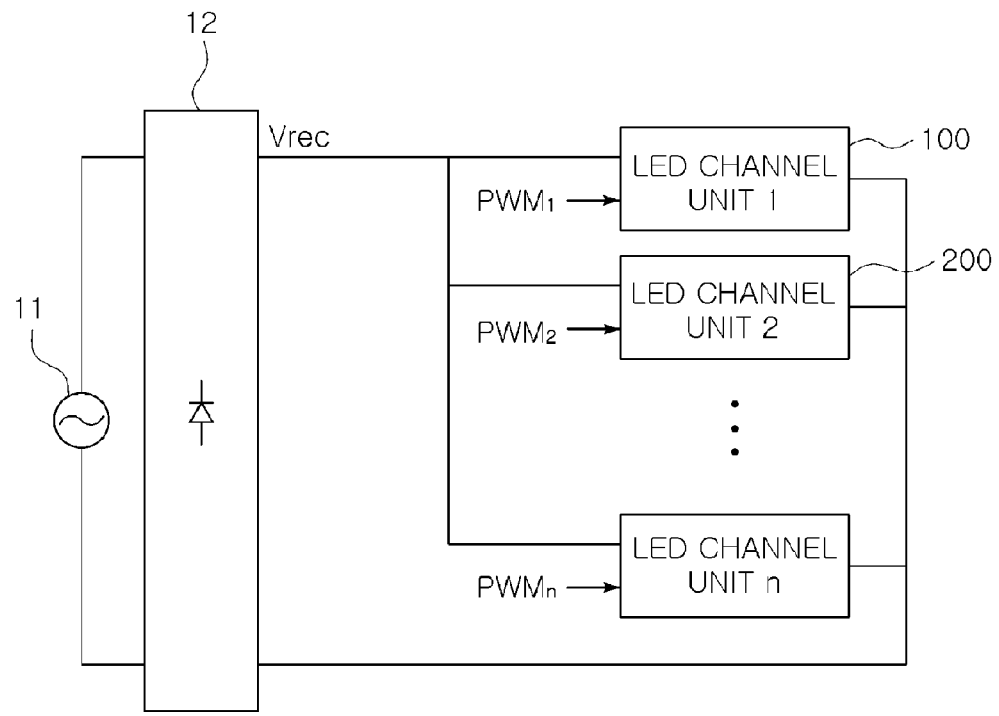
FIG. 16 is a block diagram showing an LED luminescence apparatus according to an exemplary embodiment of the present invention.
Figure 16:
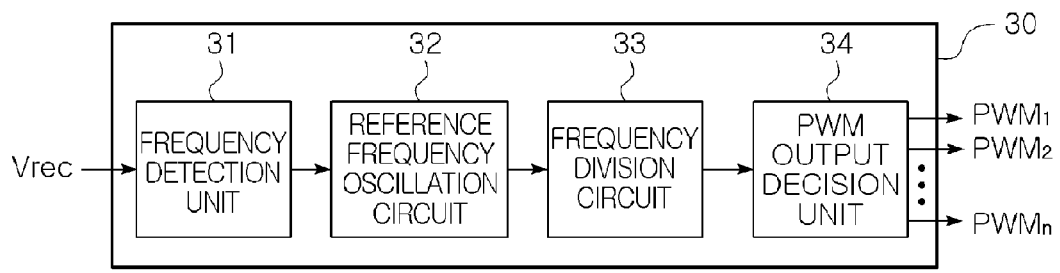

In order to solve this problem, the LED luminescence apparatus of FIG. 16 has been proposed.

FIG. 16 is a block diagram showing an LED luminescence apparatus according to an exemplary embodiment of the present invention.

Figure 17:
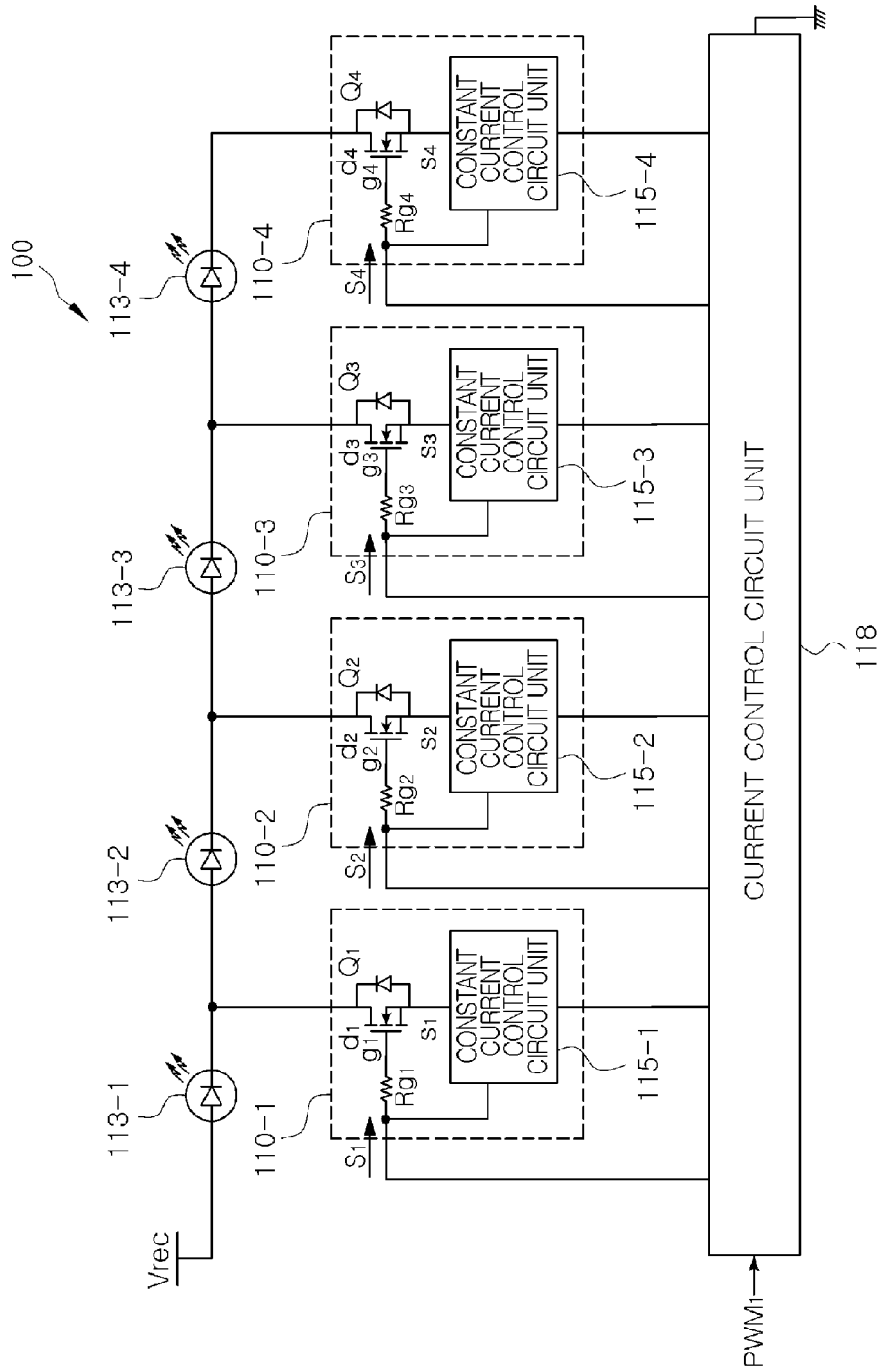
FIG. 17 is a detailed block diagram showing LED channels in the LED luminescence apparatus according to the exemplary embodiment shown in FIG. 16.

FIG. 17 is a detailed block diagram showing LED channels in the LED luminescence apparatus according to the present exemplary embodiment.

Referring to FIG. 16, the LED luminescence apparatus according to the present exemplary embodiment may include an AC power source 11, a rectification circuit unit 12, LED channel units 100 to n×100, and a PWM signal generation unit 30.

The AC power source 11 may by a commercial AC power source capable of supplying AC voltage in a sinusoidal wave form.

The rectification circuit unit 12 may generate unidirectional ripple voltage Vrec by rectifying the AC voltage supplied by the AC power source 11. The rectification circuit unit 12 may be a bridge circuit implemented using a plurality of diodes.

The LED channel units 100 to n×100 are connected in parallel to each other, and may be sequentially operated in response to PWM signals PWM1 to PWMn generated by the PWM signal generation unit 30, which will be described later. For example, the LED channel unit 1 100, the LED channel unit 2 200, . . . , the LED channel unit n n×100 may be sequentially operated. In this case, the LED channel units 100 to n×100 are constructed to have the same structure, and will be described in detail below with reference to FIG. 17.

As shown in FIG. 17, the LED channel unit 100 of the LED luminescence apparatus according to the present exemplary embodiment may include a plurality of LED units 113-1 to 113-4, a plurality of switches Q1 to Q4, constant current control circuit units 115-1 to 115-4, and a current control circuit unit 118. Here, although the drawing shows four LED units, four switches, four constant current control circuit units, and four current control circuit units, the number is not limited to 4 and any number of components can be provided in adaptation to the efficiency of driving circuits and multi-stage current control.

The LED units 113-1 to 113-4 may be connected in series to each other. A single LED unit shown in FIG. 17 (one of the LED units 113-1 to 113-4) may be a single LED, and may include a plurality of LEDs, the same polarity terminals of which are mutually connected to each other (that is, they are connected in parallel to each other). The number of series-connected LEDs may be increased so as to improve the efficiency of driving circuits and perform multi-stage current control, and the number of parallel-connected LEDs may be increased to increase the luminous flux of LED luminescence lamps and increase the capacity of lamps.

Each of the switches Q1 to Q4 may be connected, at one end thereof, to a node where two of the plurality of LED units 113-1 to 113-4 are connected to each other. That is, a first switch Q1 may be connected to a node where a first LED unit 113-1 and a second LED unit 113-2 are connected to each other, a second switch Q2 may be connected to a node where the second LED unit 113-2 and a third LED unit 113-3 are connected to each other, and a third switch Q3 may be connected to a node where the third LED unit 113-3 and a fourth LED unit 113-4 are connected to each other.

The switches Q1 to Q4 may operate in response to switch control signals S1 to SN output from a current control circuit unit 118, which will be described later. Further, the switches Q1 to Q4 may operate in response to control signals output from the constant current control circuit units 115-1 to 115-4.

The constant current control circuit units 115-1 to 115-4 may control current flowing through the plurality of LED units 113-1 to 113-4 so that it has a predetermined magnitude. The constant current control circuit units 115-1 to 115-4 may be connected to the remaining ends of the switches Q1 to Q4.

The constant current control circuit units 115-1 to 115-4 generate switch control signals for the switch units 10-1 to 10-4 implemented as switches Q1 to Q4, which will be described later, and generate control signals Vgs to control the maximum current.

Meanwhile, the switches Q1 to Q4 and the constant current control circuit units 115-1 to 115-4 constitute constant current control units 110-1 to 110-4. In more detail, the control signals from the constant current control circuit units 115-1 to 115-4 are applied to the gates g1 to g4 of the respective switches Q1 to Q4. The constant current control units 110-1 to 110-4 generate constant currents satisfying the driving voltages Vf1 to Vf4 of the respective LED units 113-1 to 113-4.

The constant current control circuit units 115-1 to 115-4 are connected to the sources s1 to s4 and the gates g1 to g4 of the respective switches Q1 to Q4. Further, the constant current control circuit units 115-1 to 115-4 perform control such that the switches Q1 to Q4 implemented using power semiconductor elements, such as Field Effect Transistors (FET) or Bipolar Junction Transistors (BJT), are operated in a linear region. That is, the constant current control circuit units 115-1 to 115-4 generate signals for controlling Vgs of the switches Q1 to Q4 so that the driving currents of the LED units 113-1 to 113-4 satisfy set peak currents.

The current control circuit unit 118 may receive currents flowing through the switches Q2 to Q4 via the constant current control circuit units 115-1 to 115-4 and may generate switching control signals S1 to S4 for the switches Q1 to Q4. In detail, the current control circuit unit 118 generates the switching control signals S1 to S4 so that the constant current control circuit units 115-1 to 115-4 are sequentially operated depending on the closed state (turned-on state) or the open state (turned-off state) of the switches Q1 to Q4. That is, the current control circuit unit 118 receive downstream currents from the constant current control circuit units 115-2 to 115-4 in a subsequent stage, and switches relevant switches Si to S4 to an open state (turned-off state) when any one of the received currents reaches a predetermined value. For example, for the first switching control signal S1, the current control circuit unit 118 receives downstream currents from the constant current control circuit units 115-2 to 115-4 in a subsequent stage and control the first switching control signal S1 to switch the first switch Q1 to an open state when any of the currents reaches a predetermined value. For the second switching control signal S2, the current control circuit unit 118 receives downstream currents from the constant current control circuit units 115-3 and 115-4 in a subsequent stage and control the second switching control signal S2 to switch the second switch Q2 to an open state (turned-off state) when any one of the currents reaches the predetermined value. For the third switch control signal S3, the current control circuit unit 118 receives downstream current from the constant current control circuit unit 115-4 in a subsequent stage, and control the third switching control signal S3 to switch the third switch Q3 to an open state (turned-off state) when the current reaches the predetermined value.

Further, the current control circuit unit 118 generates PWM signals required to control a mean value of the currents flowing through the switches Q1 to Q4. The current control circuit unit 118 may detect the currents flowing through the constant current control circuit units 115-1 to 115-4 regardless of the AC power source, and then control a mean value of driving currents flowing through the LED units 113-1 to 113-4. For example, when the AC voltage is higher than a reference voltage level, the driving times of the switches Q1 to Q4 are reduced by reducing the duty cycle of a relevant PWM signal so that the intervals, during which the LED units 113-1 to 113-4 are turned on, are reduced. In contrast, when the AC voltage is lower than a reference voltage, the driving times of the switches Q1 to Q4 are increased by increasing the duty cycle of a relevant PWM signal so that the intervals, during which the LED units 113-1 to 113-4 are turned on, are increased.

Meanwhile, since the current control circuit unit 118 drives the switches Q1 to Q4 using the PWM signals, LED driving current in each stage is generated in the form of a pulse wave. That is, the current control circuit unit 118 generates signals for controlling Vgs of the switches Q1 to Q4 so that the driving current of each of the LED units 113-1 to 113-4 satisfies preset mean current. In this case, the switches Q1 to Q4 are operated in a switching (ON/OFF) region, so that the driving current of each of the LED units 113-1 to 113-4 is formed in the shape of a pulse having a certain duty cycle.

The PWM signal generation unit 30 may include a frequency detection unit 31 for detecting the frequency of the AC power source 11, a reference frequency oscillation circuit 32 for oscillating at a reference frequency different from the detected frequency, a frequency division circuit 33 for dividing the reference frequency, and a PWM output decision unit 34 for deciding on PWM output using frequency-divided signals.

The frequency detection unit 31 generates a square wave signal by detecting zero crossings (zero crossing detection) in the AC power source 11, and the reference frequency oscillation circuit 32 generates a reference signal having a PWM frequency synchronized with the generated square wave signal. In this case, the frequency of the oscillation signal can be set to various frequencies. The frequency division circuit 33 divides the reference PWM frequency signal by a multiple of an integer. The signal which has been frequency-divided in this way has a duty cycle of 50%, and is frequency-divided by an integer n (Fs/n) from a clock pulse, the ratio of ON/OFF times of which is 1. Here, the frequency-divided signal is the reference signal of the PWM output decision unit 34, and the PWM output decision unit 34 generates n PWM decision signals PWM1 to PWMn corresponding to the number of channels, which will be described in detail with reference to FIG. 18.

Figure 18:
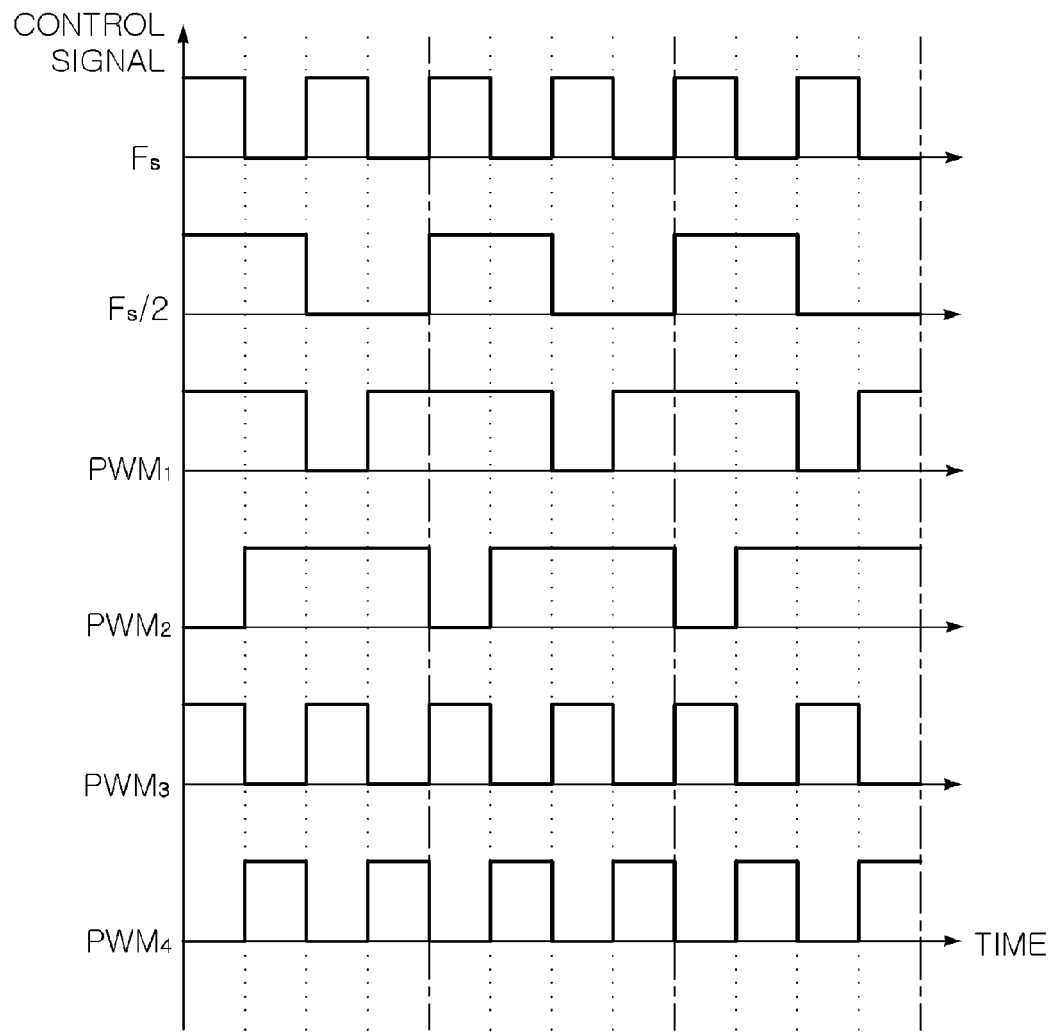
FIG. 18 is a waveform diagram showing PWM decision signals obtained by frequency division in the LED luminescence apparatus according to the exemplary embodiment of the present invention.

FIG. 18 is a waveform diagram showing PWM decision signals obtained by frequency division in the LED luminescence apparatus according to the exemplary embodiment of the present invention.

As shown in FIG. 18, the PWM output decision unit 34 outputs n PWM decision signals PWM 1 to PWMn using a reference PWM frequency signal Fs and a 2-frequency-divided signal Fs/2. That is, the PWM output decision unit 34 combines n channels using a logical expression of the reference signal Fs and the frequency-divided signal Fs/2, and then generates PWM decision signals. For example, when four PWM decision signals PWM1 to PWM4 are generated, the first PWM decision signal PWM1 can be generated by performing a logical OR operation on the inverted reference signal Fs and the 2-frequency-divided signal Fs/2, the second PWM decision signal PWM2 can be generated by performing a logical OR operation on an inverted reference signal Fs and an inverted 2-frequency-divided signal Fs/2, the third PWM decision signal PWM3 is the reference signal Fs, and the fourth PWM decision signal PWM4 can be generated by performing a logical NOT operation on the reference signal Fs. Therefore, the PWM decision signals PWM1 to PWM4 have the form of pulses that repeatedly overlap one another. That is, in FIG. 18, in a single cycle of the 2-frequency-divided signal Fs/2, in a first interval, the first PWM decision signal PWM1 and the third PWM decision signal PWM3 overlap each other, in a second interval, the first PWM decision signal PWM1, the second PWM decision signal PWM2 and the fourth PWM decision signal PWM4 overlap one another, in a third interval, the second PWM decision signal PWM2 and the third PWM decision signal PWM3 overlap each other, and a fourth interval, the first PWM decision signal PWM1, the second PWM decision signal PWM2 and the fourth PWM decision signal PWM4 overlap one another.

The operation of the LED luminescence apparatus using AC power according to the present exemplary embodiment shown in FIG. 15 will be described in detail below.

The operation of the LED luminescence apparatus using AC power shown in FIG. 16 and FIG. 17 according to the present exemplary embodiment will now be described in detail.

First, when AC voltage is input by the AC power source 11 to the rectification circuit unit 12, the rectification circuit unit 12 rectifies the AC voltage and outputs unidirectional ripple voltage Vrec. As shown in FIG. 15, the output voltage of the AC power source 11, that is, voltage input to the rectification circuit unit 12, is AC voltage having both a positive direction and a negative direction, and the voltage output from the rectification circuit unit 12 has the form of unidirectional ripple voltage Vrec in which voltage in the negative direction is converted into voltage in the positive direction. Such a ripple voltage Vrec is supplied to the plurality of LED channel units 100 to n×100. Hereinafter, a description will be made on the basis of the LED channel unit 1 100 because the operations of the LED channel units 100 to n×100 are identical to each other.

As the ripple voltage Vrec input to the LED channel unit 1 100 increases, the LED units 113-1 to 113-4 may sequentially emit light. The light emission operations of the LED units are described with reference to FIG. 4 and FIG. 5.

FIG. 4 is a waveform diagram showing the waveforms of AC voltage and AC current supplied to LEDs in the LED luminescence apparatus according to the present exemplary embodiment.

FIG. 5 is a waveform diagram showing the waveforms of the control signals of the switches provided in the LED luminescence apparatus according to the present exemplary embodiment, the waveform of current flowing through the switches, and the waveform of current supplied to the LEDs over time.

Further, FIG. 4 and FIG. 5 illustrate only a single cycle of ripple voltage Vrec supplied by the rectification circuit unit 11. The reason for this is that the same operation is performed in the remaining cycles of the ripple voltage Vrec.

When the magnitude of the ripple voltage Vrec supplied to the LED units 113-1 to 113-4 increases, and the ripple voltage Vrec reaches the driving voltage (forward voltage: Vf1) of the first LED unit 113-1, current flows through the first LED unit 113-1 and then light is emitted (at time t0 of FIG. 4 and FIG. 5). In this case, the first switch Q1 to the fourth switch Q4 are initially set to a closed state (turned-on state). Current corresponding to such input voltage Vf1 flows through a path to the first constant current control circuit unit 115-1 via the first LED unit 113-1. In this case, the first switch Q1 controls current passing through the first constant current control circuit unit 115-1 to a constant value in response to a control signal from the first constant current control circuit unit 115-1. The first constant current control circuit unit 115-1 performs constant current control so that current preset to drive the first LED unit 113-1 can flow therethrough. The operation in which the first LED unit 113-1 initiates light emission corresponds to a time interval t0-t1. Here, the current control circuit unit 118 detects the current of the first constant current control circuit unit 115-1, generates a PWM signal depending on an error between the detected current and the reference current, and then drives the first switch Q1.

In this case, in response to the PWM decision signals PWM1 to PWMn generated by the PWM output decision unit 34, the individual LED channel units 100 to 400 can be sequentially operated. That is, as shown in FIG. 5, the LED channel units 100 to 400 are sequentially driven in response to the PWM decision signals PWM1 to PWM4, so that the first LED units 113-1 of the individual LED channel units 100 to 400 are sequentially turned on. Here, since the PWM decision signals PWM1 to PWM4 overlap one another in some intervals, two or three of the LED channel units 100 to 400 are simultaneously driven in some intervals, in which case the first LED units 113-1 of the LED channel units 100 to 400 are simultaneously turned on and, consequently, the LED driving current is generated in the form of DC level-shifted current.

Next, when the magnitude of the ripple voltage Vrec further increases and voltage applied to the second LED unit 113-2 becomes the driving voltage of the second LED 113-2 (when the magnitude of the ripple voltage Vrec becomes Vf2), current flows through the second LED unit 113-2, and then light is emitted (at time t1 of FIG. 4 and FIG. 5). Here, current corresponding to the input voltage Vf2 also flows through a path to the second constant current control circuit unit 115-2 via the second LED 113-2. In this case, the current control circuit unit 118 detects that the current of the second constant current control circuit unit 115-2 is a predetermined value, generates the first switching control signal S1, and then opens (turns off) the first switch Q1. At the same time, the second switch Q2 performs control such that, in response to the control signal from the second constant current control circuit unit 115-2, current passing and flowing through the second constant current control circuit unit 115-2 becomes current preset to drive the first LED unit 113-1 and the second LED unit 113-2.

Using this operation, control may be performed such that constant current flows through the first LED unit 113-1 and the second LED unit 113-2. Further, as shown in FIG. 4 and FIG. 5, at time t1, the first switch Q1 is turned off, and stepped input current can be formed using constant current control performed by the second constant current control circuit unit 115-1. Here, the current control circuit unit 118 detects the current of the second constant current control circuit unit 115-2, generates a PWM signal depending on an error between the detected current and the reference current, and then drives the second switch Q2. Therefore, as shown in FIG. 5, during the time interval t1-t2, the LED channel units 100 to 400 are sequentially driven in response to the PWM decision signals PWM1 to PWM4, so that the first LED unit 113-1 and the second LED unit 113-2 of the LED channel units 100 to 400 are turned on. Here, since the PWM decision signals PWM1 to PWM4 overlap one another in some intervals, two or three of the LED channel units 100 to 400 are simultaneously driven in some intervals, in which case the first and second LED units 113-1 and 113-2 of the LED channel units 100 to 400 are simultaneously turned on and, consequently, the LED driving current is generated in the form of DC level-shifted current.

Similarly to the above description, when the ripple voltage Vrec further increases and voltage applied to the third LED unit 113-3 becomes the driving voltage of the third LED unit 113-3 (when the magnitude of the ripple voltage Vrec becomes Vf3), current flows through the third LED unit 113-3, and light is emitted (at time t2 of FIG. 4 and FIG. 5). In this case, current corresponding to the input voltage Vf3 also flows through a path to the third constant current control circuit unit 115-3 via the third LED 113-3. Here, the current control circuit unit 118 detects that the current of the third constant current control circuit unit 115-3 is a predetermined value, generates second switching control signal S2, and then opens (turns off) the second switch Q2. The first switching control signal S1 is maintained in its previous state, so that the first switch Q1 is maintained in an open (turned-off) state. At the same time, the third switch Q3 performs control such that, in response to the control signal from the third constant current control circuit unit 115-3, current passing and flowing through the third constant current control circuit unit 115-3 becomes current preset to drive the first LED unit 113-1 to the third LED unit 113-3.

Using this operation, control may be performed such that constant current flows through the first LED unit 113-1, the second LED unit 113-2, and the third LED unit 113-3. Further, as shown in FIG. 4 and FIG. 5, at time t2, the first switch Q1 and the second switch Q2 are turned off, and stepped input current can be formed using constant current control performed by the third constant current control circuit unit 115-3. Here, the current control circuit unit 118 detects the current of the third constant current control circuit unit 115-3, generates a PWM signal depending on an error between the detected current and the reference current, and then drives the third switch Q3. Therefore, as shown in FIG. 4, during the time interval t2-t3, the LED channel units 100 to 400 are sequentially driven in response to the PWM decision signals PWM1 to PWM4, so that the first LED unit 113-1 to the third LED unit 113-3 of the LED channel units 100 to 400 are turned on. Here, since the PWM decision signals PWM1 to PWM4 overlap one another in some intervals, two or three of the LED channel units 100 to 400 are simultaneously driven in some intervals, in which case the first to third LED units 113-1 to 113-3 of the LED channel units 100 to 400 are simultaneously turned on and, consequently, the LED driving current is generated in the form of DC level-shifted current.

Similarly to the above description, when the ripple voltage Vrec further increases and voltage applied to the fourth LED unit 113-4 becomes the driving voltage of the fourth LED unit 113-4 (when the magnitude of the ripple voltage Vrec becomes Vf4), current flows through the fourth LED unit 113-4, and light is emitted (at time t3 of FIG. 4 and FIG. 5). In this case, current corresponding to the input voltage Vf4 also flows through a path to the fourth constant current control circuit unit 115-4 via the fourth LED 113-4. Here, the current control circuit unit 118 detects that the current of the fourth constant current control circuit unit 115-4 is a predetermined value, generates a third switching control signal S3, and then opens (turns off) the third switch Q3. The first and second switching control signals S1 and S2 are maintained in its previous state, so that the first and second switches Q1 and Q2 are maintained in an open (turned-off) state. At the same time, the fourth switch Q4 performs control such that, in response to the control signal from the fourth constant current control circuit unit 115-4, current passing and flowing through the fourth constant current control circuit unit 115-4 becomes current preset to drive the first LED unit 113-1 to the fourth LED unit 113-4.

Using this operation, control may be performed such that constant current flows through the first LED unit 113-1, the second LED unit 113-2, the third LED unit 113-3, and the fourth LED unit 113-4. Further, as shown in FIG. 4 and FIG. 5, at time t3, the third switch is turned off, and stepped input current can be formed using constant current control performed by the fourth constant current control circuit unit 115-4. Here, the current control circuit unit 118 detects the current of the fourth constant current control circuit unit 115-4, generates a PWM signal depending on an error between the detected current and the reference current, and then drives the fourth switch Q4. Therefore, as shown in FIG. 5, during the time interval t3-t4, the LED channel units 100 to 400 are sequentially driven in response to the PWM decision signals PWM1 to PWM4, so that the first LED unit 113-1 to the fourth LED unit 113-4 of the LED channel units 100 to 400 are turned on. Here, since the PWM decision signals PWM1 to PWM4 overlap one another in some intervals, two or three of the LED channel units 100 to 400 are simultaneously driven in some intervals, in which case the first to fourth LED units 113-1 to 113-4 of the LED channel units 100 to 400 are simultaneously turned on and, consequently, the LED driving current is generated in the form of DC level-shifted current.

When the ripple voltage Vrec passes over a peak and gradually decreases, the LED units are sequentially turned off in the sequence from the fourth LED unit 113-4 to the first LED unit 113-1. When the fourth LED unit 113-4 is turned off (at time t4), the current control circuit unit 118 detects that the current of the fourth constant current control circuit unit 115-4 is not the predetermined value, inverts the third switching control signal S3, and then closes (turns on) the third switch Q3. In this case, the first switching control signal S1 and the second switching control signal S2 are maintained in their previous states, so that the first switch Q1 and the second switch Q2 are maintained in an open (turned-off) state. At the same time, current flows into the third constant current control circuit unit 115-3, and constant current control is initiated so that preset current is maintained to drive the first to third LED units 113-1 to 113-3.

In this case, the current control circuit unit 118 detects the current of the third constant current control circuit unit 115-3, generates a PWM signal depending on an error between the detected current and the reference current, and then drives the third switch Q3. Therefore, as shown in FIG. 5, during the time interval t4-t5, the LED channel units 100 to 400 are sequentially driven in response to the PWM decision signals PWM1 to PWM4, so that the first LED unit 113-1 to the third LED unit 113-3 of the LED channel units 100 to 400 are turned on. Here, since the PWM decision signals PWM1 to PWM4 overlap one another in some intervals, two or three of the LED channel units 100 to 400 are simultaneously driven in some intervals, in which case the first to third LED units 113-1 to 113-3 of the LED channel units 100 to 400 are simultaneously turned on and, consequently, the LED driving current is generated in the form of DC level-shifted current.

A subsequent current control operation is performed in the reverse order of the constant current control performed during the above-described interval t0 to t3, and thus a detailed description thereof is omitted.

Although the present exemplary embodiment has been described such that LED driving current is increased or decreased in a stepped shape via multi-stage constant current control, the present invention is not limited thereto and reference current for constant current control can be set to various forms so that the waveform of the LED driving current can also be changed.

Hereinafter, the peak current control and average current control of the LED driving current will be described in detail with reference to FIG. 19 and FIG. 20.

Figure 19:
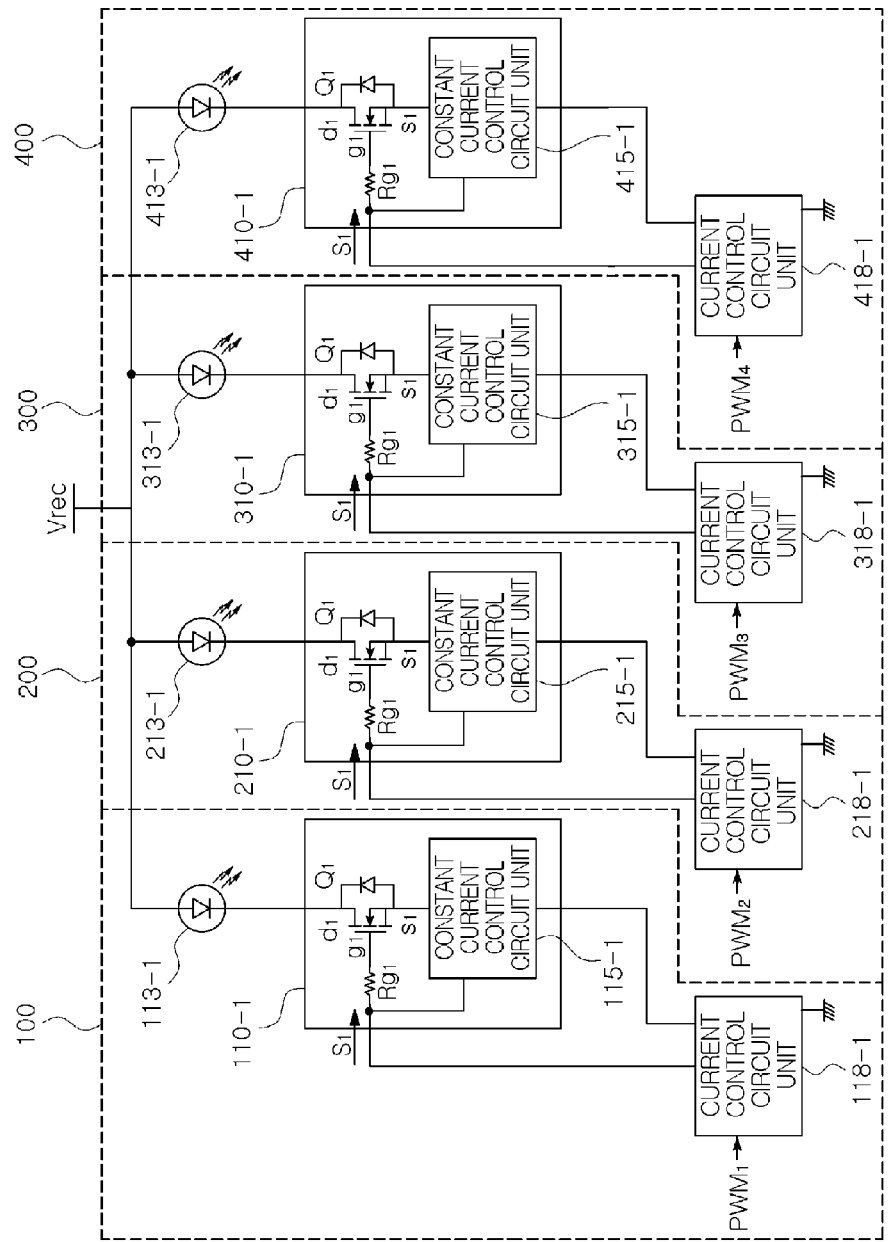
FIG. 19 is a detailed block diagram showing PWM control in the LED luminescence apparatus according to an exemplary embodiment of the present invention.

FIG. 19 is a detailed block diagram showing PWM control in the LED luminescence apparatus according to an exemplary embodiment of the present invention.

Figure 20:
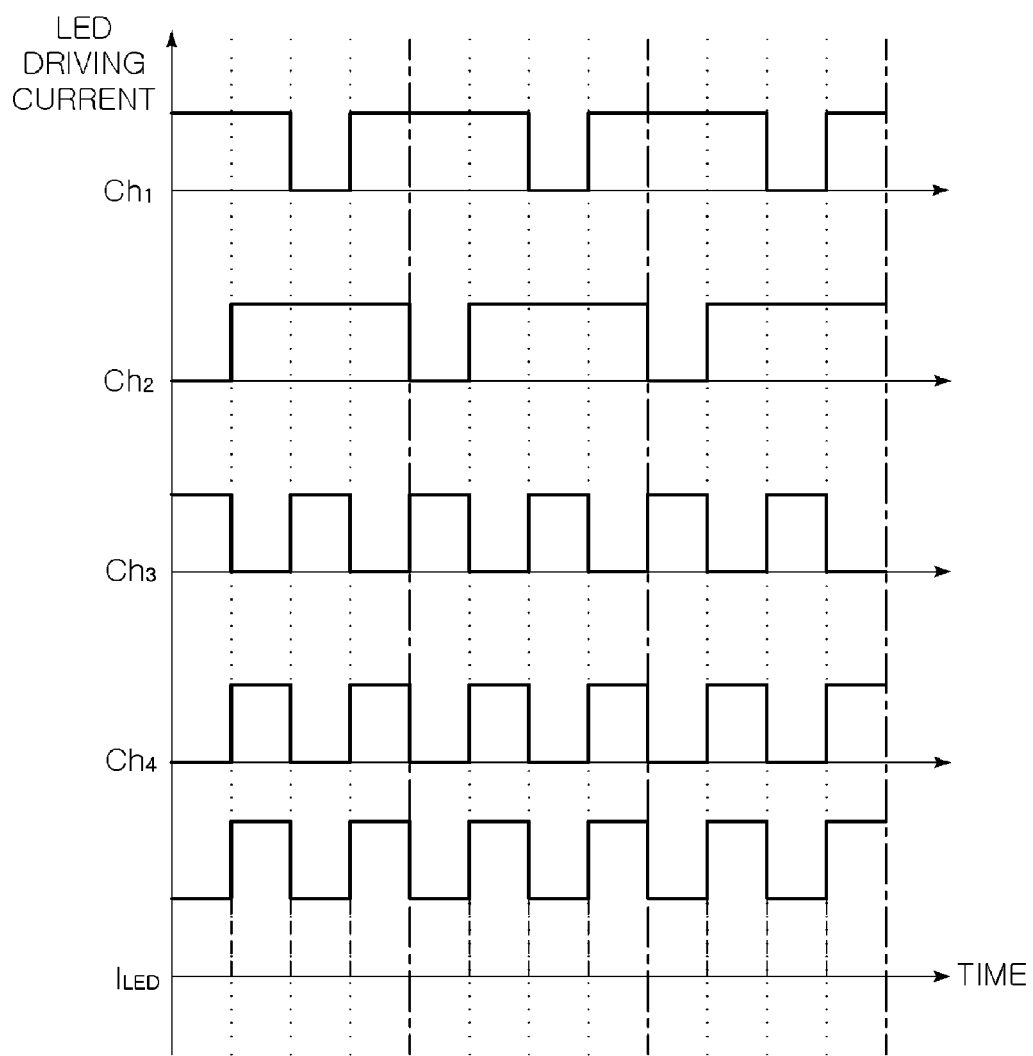
FIG. 20 is a waveform diagram showing the waveforms of LED driving currents depending on PWM output signals in the LED luminescence apparatus according to the exemplary embodiment shown in FIG. 19.

FIG. 20 is a waveform diagram showing the waveforms of LED driving currents depending on PWM output signals in the LED luminescence apparatus according to the present exemplary embodiment.

In order to describe an operation in which the LED channel units 100 to 400 are sequentially operated in response to PWM decision signals PWM1 to PWMn, and then the LED driving currents are generated in the form which they overlap each other in some intervals, FIG. 19 illustrates the first LED units 113-1 to 413-1 implemented in the first stages of the respective LED channel units 100 to 400 on the basis of PWM decision signals PWM1 to PWM4.

As shown in FIG. 19, when the rectified ripple voltage Vrec becomes the driving voltage Vf1 of the first LED units 113-1 to 413-1, the first LED units 113-1 to 413-1 in the respective LED channel units 100 to 400 are driven.

In this case, the PWM output decision unit 34 generates the PWM decision signals PWM1 to PWM4, as shown in FIG. 18, and provides them to the current control circuit units 118 to 418, respectively. The current control circuit units 118 to 418 of the LED channel units 100 to 400 are sequentially operated in response to the PWM decision signals PWM1 to PWM4.

That is, as shown in FIG. 19, the LED channel unit 1 100 is driven in response to the first PWM decision signal PWM 1. The current control circuit unit 118-1 of the LED channel unit 1 100 outputs the switch control signal S1, so that the first LED unit 113-1 emits light via the constant current control unit 110-1. That is, LED driving current Ch1 is formed by the LED channel unit 1 100 in response to the first PWM decision signal PWM1. Here, the LED driving current Ch1 of the LED channel unit 1 100 is formed in the same pattern as the first PWM decision signal PWM1, for example, it does not flow in the third interval during the four intervals constituting a single cycle of the 2-frequency-divided signal Fs/2.

Next, the LED channel unit 2 200 is driven in response to the second PWM decision signal PWM2. The current control circuit unit 218-1 of the LED channel unit 2 200 outputs the switch control signal S1, so that the first LED unit 213-1 emits light via the constant current control unit 210-1. That is, LED driving current Ch2 is formed by the LED channel unit 2 200 in response to the second PWM decision signal PWM2. Here, the LED driving current Ch2 of the LED channel unit 2 200 is formed in the same pattern as the second PWM decision signal PWM2, for example, it does not flow in the first interval during the four intervals constituting a single cycle of the 2-frequency-divided signal Fs/2.

Thereafter, the LED channel unit 3 300 is driven in response to the third PWM decision signal PWM3. The current control circuit unit 318-1 of the LED channel unit 3 300 outputs the switch control signal S1, so that the first LED unit 313-1 emits light via the constant current control unit 310-1. That is, LED driving current Ch3 is formed by the LED channel unit 3 300 in response to the third PWM decision signal PWM3. Here, the LED driving current Ch3 of the LED channel unit 3 300 is formed in the same pattern as the third PWM decision signal PWM3, for example, it does not flow in the second and fourth intervals during the four intervals constituting a single cycle of the 2-frequency-divided signal Fs/2.

Finally, the LED channel unit 4 400 is driven in response to the fourth PWM decision signal PWM4. The current control circuit unit 418-1 of the LED channel unit 4 400 outputs the switch control signal S1, so that the fourth LED unit 413-1 emits light via the constant current control unit 410-1. That is, LED driving current Ch4 is formed by the LED channel unit 4 400 in response to the fourth PWM decision signal PWM4. Here, the LED driving current Ch4 of the LED channel unit 4 400 is formed in the same pattern as the fourth PWM decision signal PWM4, for example, it does not flow in the first and third intervals during the four intervals constituting a single cycle of the 2-frequency-divided signal Fs/2.

Consequently, since the LED channel units 100 to 400 are sequentially driven in response to the PWM decision signals PWM1 to PWM4, the total LED driving current ILED obtained by summing the driving currents of the first LED units 113-1 to 413-1 of the LED channel units 100 to 400 can be generated in the form of DC level-shifted pulse waves that overlap one another in some intervals. That is, in FIG. 20, in a single cycle of the 2-frequency-divided signal Fs/2, in a first interval, the driving current Ch1 of the LED channel unit 1 100 and the driving current Ch3 of the LED channel unit 3 300 overlap each other, in a second interval, the driving current Ch1 of the LED channel unit 1 100, the driving current Ch2 of the LED channel unit 2 200, and the driving current Ch4 of the LED channel unit 4 400 overlap one another, in a third interval, the driving current Ch2 of the LED channel unit 2 200 and the driving current Ch3 of the LED channel unit 3 300 overlap each other, and in the fourth interval, the driving current Ch1 of the LED channel unit 1 100, the driving current Ch2 of the LED channel unit 2 200, and the driving current Ch4 of the LED channel unit 4 400 overlap one another.

Figure 21:
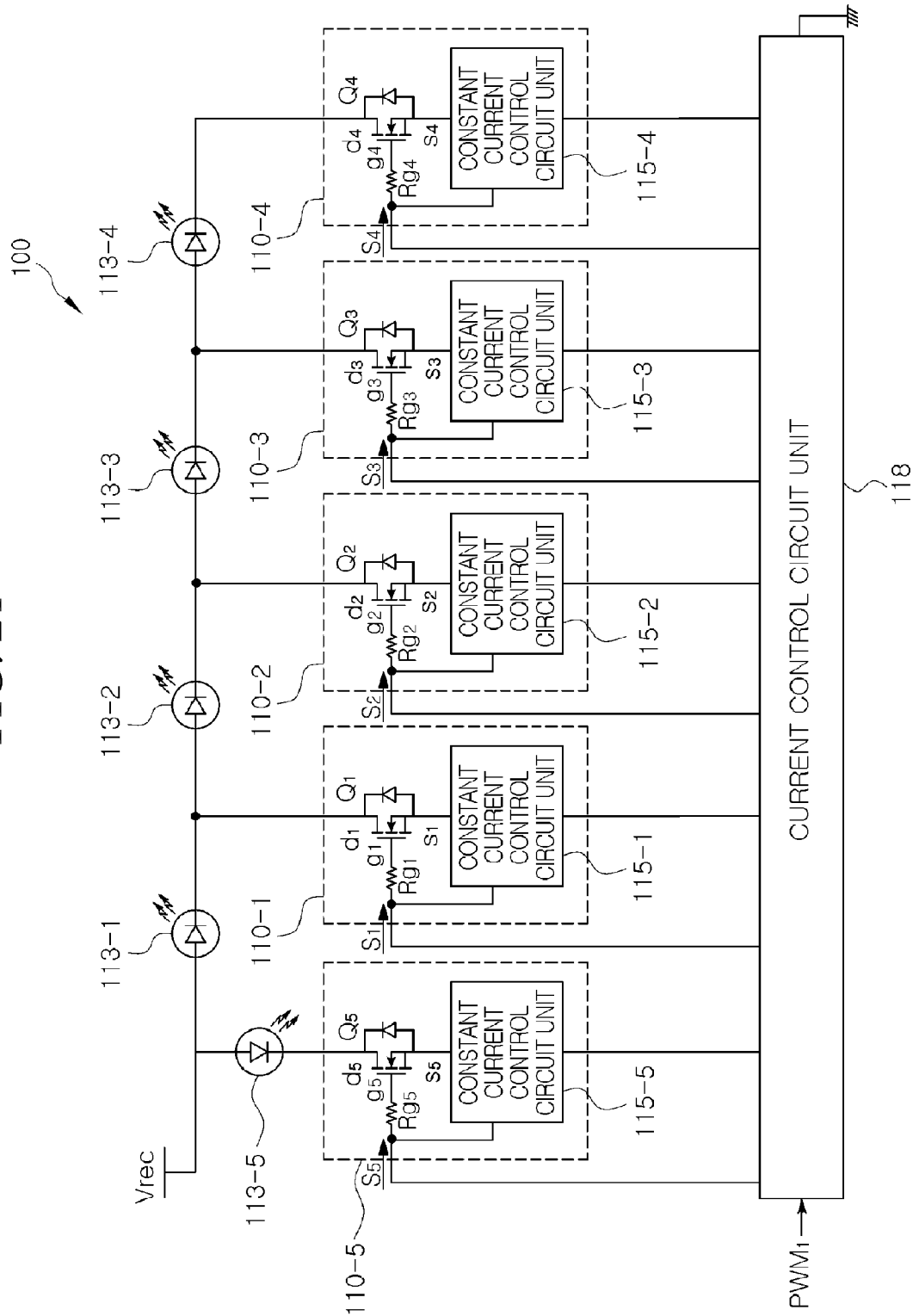
FIG. 21 is a block diagram of an LED luminescence apparatus according to an exemplary embodiment of the present invention.

FIG. 21 is a block diagram of an LED luminescence apparatus according to an exemplary embodiment of the present invention.

Figure 22A:
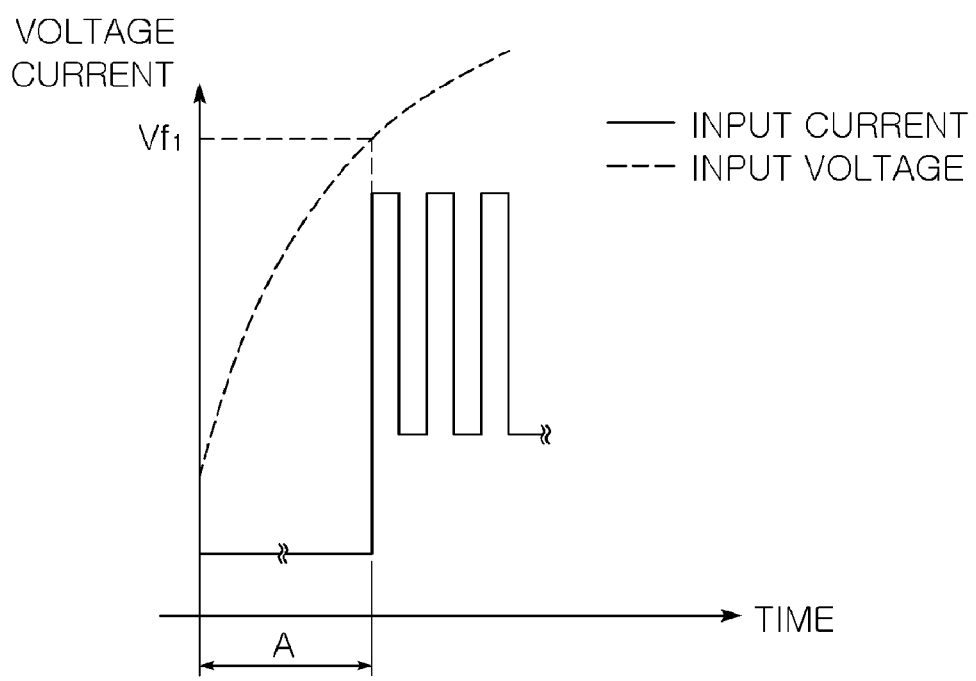
FIG. 22A and FIG. 22B are waveform diagrams illustrating LED driving current waveforms without and with an improved LED OFF interval, respectively, in the LED luminescence apparatus according to an exemplary embodiment shown in FIG. 21.
Figure 22B:
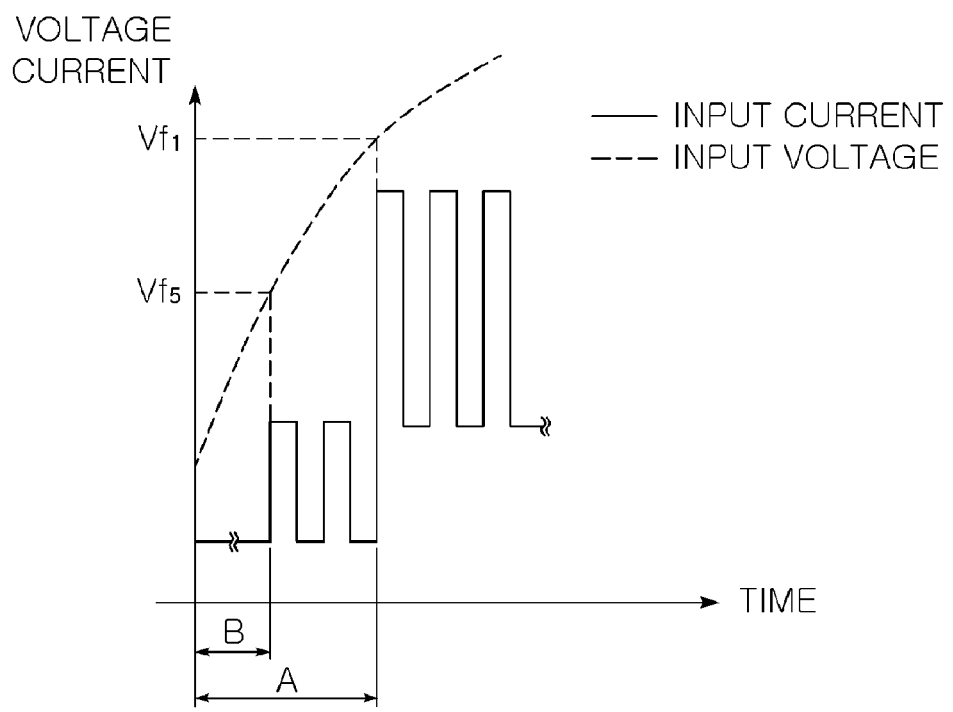

FIG. 22A and FIG. 22B are waveform diagrams illustrating LED driving current waveforms without and with an improved LED OFF interval, respectively, in the LED luminescence apparatus according to the present exemplary embodiment.

Although FIG. 21 illustrates only the LED channel unit1 100, the individual LED channel units 100 to 400 have the same configuration so that they are operated in response to the PWM decision signals PWM1 to PWM4.

Since the LED luminescence apparatus according to the exemplary embodiment shown in FIG. 21 is the same as that of the exemplary embodiment described above with respect to FIG. 19 except for a fifth LED unit 113-5, connected in parallel to the LED units 113-1 to 113-4, and a corresponding constant current control unit 110-5, descriptions of the same elements will be omitted here.

The fifth LED unit 113-5 is operated at a driving voltage Vf5 that is lower than the driving voltage Vf1 of the first LED unit 113-1, and the constant current control unit 110-5 and the current control circuit unit 118 are operated at the corresponding driving voltage. That is, the current control circuit unit 118, such as that shown in FIG. 21, outputs a control signal S5 for operating the fifth LED unit 113-5 to the constant current control unit 110-5 when the input AC power is lower than the driving voltage of the first LED unit 113-1. Furthermore, the current control circuit unit 118 outputs a control signal S5 for preventing the fifth LED unit 113-5 from operating to the constant current control unit 110-5 when the input AC power is equal to or higher than the driving voltage of the first LED unit 113-1.

Using this operation, the fifth LED unit 113-5 first emits light at voltage Vf5 where the input power is lower than the driving voltage of the first LED unit 113-1 in multi-stage stepped current operation, thereby reducing the LED OFF interval. That is, as shown in FIG. 22A, without the fifth LED unit 113-5, for example, the LED units 113-1 to 113-4 do not emit light in the interval where the input voltage is less than the driving voltage Vf1 of the first LED unit 113-1, and therefore LED OFF interval A occurs in the early interval of stepped driving current.

However, according to the present exemplary embodiment, in this early interval, the fifth LED unit 113-5 having driving voltage Vf5 lower than the driving voltages Vf1 to Vf4 of the LED driving units 113-1 to 113-4 emits light, thereby reducing the LED OFF interval A to the LED OFF interval B achieved by the fifth LED unit 113-5, as shown in FIG. 22B.

As described above, the exemplary embodiments of the present invention may have constant current control units configured using a plurality of channels and the outputs of the constant current control units are continuously provided in response to PWM decision signals obtained by frequency division and interleaving, so that the cost of the power circuit of an LED luminescence apparatus can be reduced and the small size and light weight of the LED luminescence apparatus can be realized because an EMI filter is configured using only a resistor and a capacitor and therefore simplifying the structure of the LED luminescence apparatus.

Furthermore, the present invention is additionally provided with an LED whose driving voltage Vf is low, thereby reducing light output OFF intervals.

Figure 23:
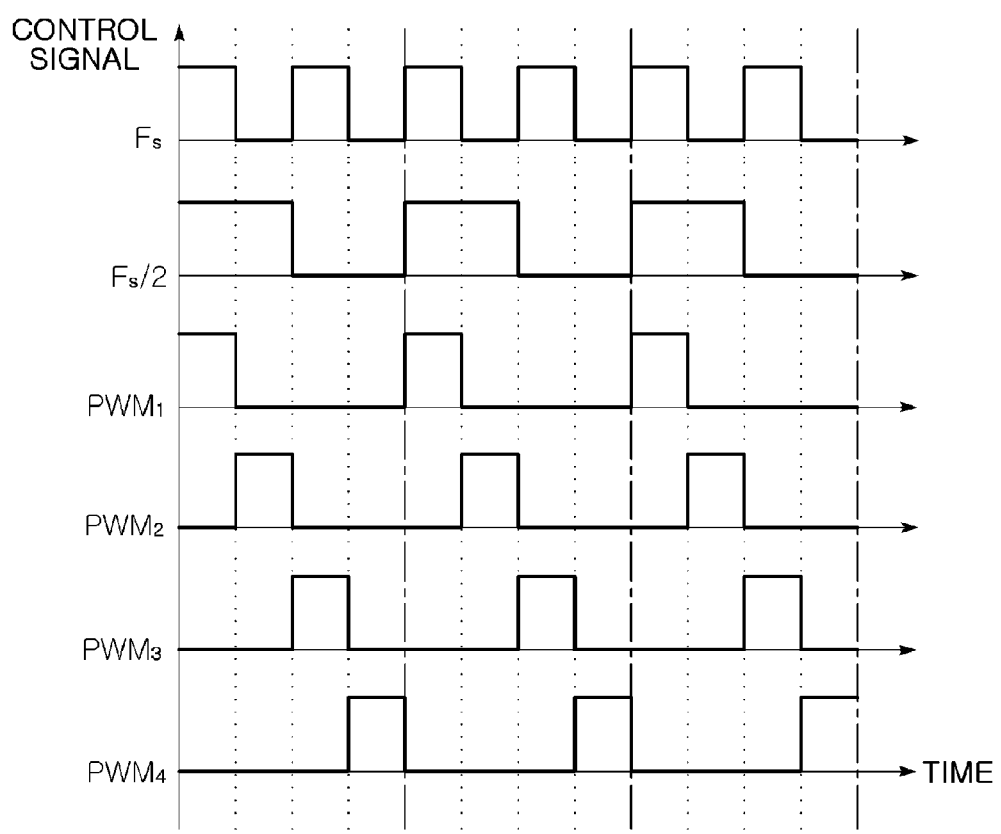
FIG. 23 is a waveform diagram showing PWM decision signals obtained by frequency division in the LED luminescence apparatus according to an exemplary embodiment of the present invention.

FIG. 23 is a waveform diagram showing PWM decision signals obtained by frequency division in the LED luminescence apparatus according to an exemplary embodiment of the present invention. The circuit configuration of the exemplary embodiment is the same as in FIG. 17, and detailed description thereof will be omitted herein.

As shown in FIG. 23, the PWM output decision unit 34 outputs n PWM decision signals PWM 1 to PWMn using a reference PWM frequency signal Fs and a 2-frequency-divided signal Fs/2. That is, the PWM output decision unit 34 combines n channels using a logical expression of the reference signal Fs and the frequency-divided signal, and then generates PWM decision signals PWM1 to PWMn. For example, when four PWM decision signals are generated, the first PWM decision signal PWM1 can be generated by performing a logical AND operation on the reference signal Fs and the 2-frequency-divided signal Fs/2, the second PWM decision signal PWM2 can be generated by performing a logical AND operation on an inverted reference signal Fs and the 2-frequency-divided signal Fs/2, the third PWM decision signal PWM3 can be generated by performing a logical AND operation on the reference signal Fs and an inverted 2-frequency-divided signal Fs/2, and the fourth PWM decision signal PWM4 can be generated by performing a logical AND operation on an inverted reference signal Fs and an inverted 2-frequency-divided signal Fs/2. Therefore, the PWM decision signals PWM1 to PWM4 have the forms of pulses which are sequentially output without overlapping one another.

The operation of the LED luminescence apparatus using AC power shown in FIG. 16 and FIG. 17 according to the present exemplary embodiment is described above. The light emission operation of the LED units is described above with reference to FIG. 4 and FIG. 5. In response to the PWM decision signals PWM1 to PWMn generated by the PWM output decision unit 34, the individual LED channel units 100 to 400 can be sequentially operated. That is, as shown in FIG. 5, the LED channel units 100 to 400 are sequentially driven in response to the PWM decision signals PWM1 to PWM4, so that the first LED units 113-1 of the LED channel units 100 to 400 are turned on, and consequently the LED driving currents are formed in the shape of continuous current.

Figure 24:
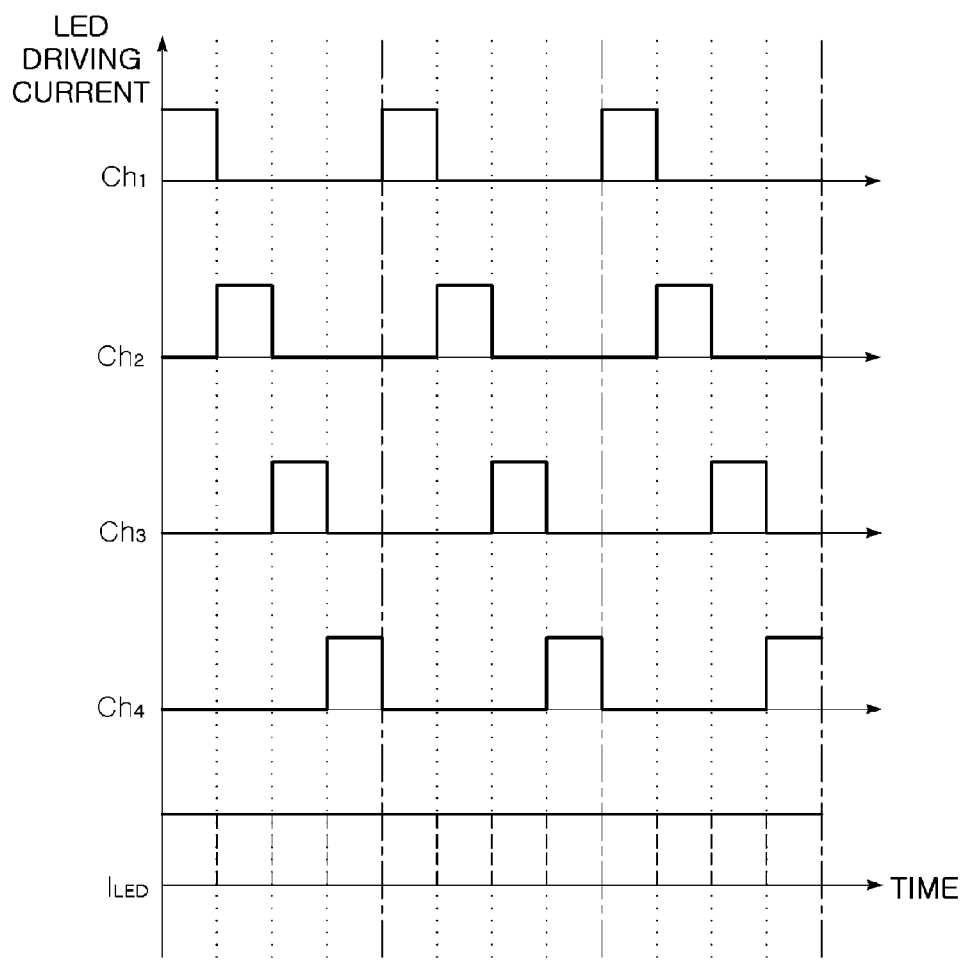
FIG. 24 is a waveform diagram showing the waveforms of LED driving currents depending on PWM output signals in the LED luminescence apparatus according to the exemplary embodiment shown in FIG. 23.

FIG. 24 is a waveform diagram showing the waveforms of LED driving currents depending on PWM output signals in the LED luminescence apparatus according to the present exemplary embodiment, which is similar to the waveform diagram described above with respect to FIG. 20. However, in this case, FIG. 24 shows the waveforms of LED driving circuits based on FIG. 23. The PWM output decision unit 34 generates the PWM decision signals PWM1 to PWM4, as shown in FIG. 23, and provides them to the current control circuit units 118 to 418, respectively. The current control circuit units 118 to 418 of the LED channel units 100 to 400 are sequentially operated in response to the PWM decision signals PWM1 to PWM4. That is, as shown in FIG. 24, the LED channel units 1 through 4 are driven in response to the first PWM decision signal PWM1 through the fourth PWM decision signal PWM4, respectively.

Consequently, since the LED channel units 100 to 400 are sequentially driven in response to the PWM decision signals PWM1 to PWM4, total LED driving current ILED obtained by summing up the driving currents of the first LED units 113-1 to 413-1 of the LED channel units 100 to 400 can be formed as continuous current.

As described above, exemplary embodiments of the present invention disclose that constant current control units are configured for a plurality of channels and the outputs of the constant current control units are continuously provided in response to PWM decision signals obtained by frequency division, so that the cost of the power circuit of an LED luminescence apparatus can be reduced and the small size and light weight of the LED luminescence apparatus can be realized because there is no need to separately provide an EMI filter composed of a coil and a capacitor.

Figure 25:
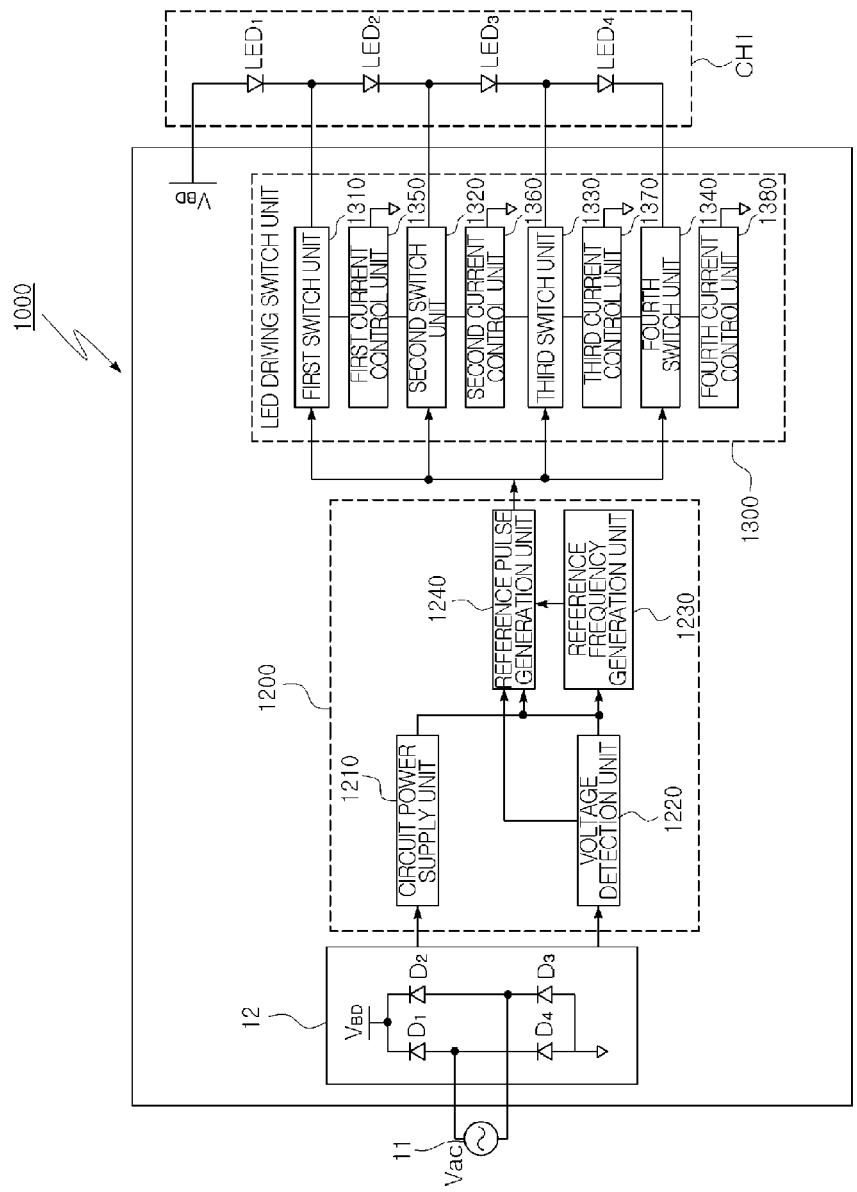
FIG. 25 is a block diagram showing an LED driving circuit implemented as an LED driving circuit package according to an exemplary embodiment of the present invention.

FIG. 25 is a block diagram showing an LED driving circuit implemented as an LED driving circuit package according to an exemplary embodiment of the present invention.

As shown in FIG. 25, an LED driving circuit package 1000 according to the present exemplary embodiment may include a rectification unit 12 for receiving AC voltage $V_{ac}$ 11 and converting the AC voltage $V_{ac}$ into ripple voltage $V_{BD}$, a low voltage control unit 1200 for generating various types of low voltage signals required to drive LEDs using the ripple voltage $V_{BD}$ output from the rectification unit 12 and outputting the low voltage signals, and an LED driving switch unit 1300 for controlling current that is to be supplied to external LEDs being supplied with the ripple voltage $V_{BD}$.

The rectification unit 12 may include a plurality of diodes $D_1$ to $D_4$ constituting a bridge circuit, and is configured to convert the AC voltage $V_{ac}$ into the ripple voltage $V_{BD}$ and output the ripple voltage $V_{BD}$. The ripple voltage $V_{BD}$ may be supplied to the external LEDs via the external connection terminals of the LED driving circuit package.

The low voltage control unit 1200 may include a circuit power supply unit 1210 for generating low voltage power that can be supplied, as supply voltage, to various types of internal circuits using the ripple voltage $V_{BD}$ generated by the rectification unit 12, a voltage detection unit 1220 for detecting the magnitude of the ripple voltage $V_{BD}$, a reference frequency generation unit 1230 for operating using the low voltage power generated by the circuit power supply unit 1210 and generating a reference frequency, and a reference pulse generation unit 1240 for operating using the low voltage power generated by the circuit power supply unit 1210 and generating a reference pulse required to control the operation of the LED driving switch unit 1300 according to the reference frequency generated by the reference frequency generation unit 1230 and the magnitude of the voltage detected by the voltage detection unit 1220.

In order to implement the above-described circuits, the low voltage control unit 1200 has resistive elements required to divide the ripple voltage $V_{BD}$ which is a high voltage.

The LED driving switch unit 1300 may include a plurality of switch units 1310 to 1340 and a plurality of current control units 1350 to 1380. The plurality of switch units 1310 to 1340 may be connected to the respective cathodes of a plurality of external series-connected LEDs $LED_1$ to $LED_4$ that form a single channel.

The plurality of current control units 1350 to 1380 control currents which are supplied to the LEDs via the switch units so as to be constant currents.

For example, when the voltage detection unit 1220 detects the ripple voltage $V_{BD}$ and the ripple voltage reaches a preset threshold, the reference pulse generation unit 1240 generates a reference pulse to turn on the first switch unit 1310 so that the first switch unit 1310 enters a conductive state, and to turn off the remaining second to fourth switch units 1320 to 1340 so that the switches 1320 to 1340 enter an open state. Using this operation, current is applied to the first LED $LED_1$ and then the first LED $LED_1$ emits light. In this case, the first current control unit 1350 controls current flowing through the first LED $LED_1$ and the first switch unit 1310 as to be constant current.

Next, when the voltage detection unit 1220 detects the ripple voltage $V_{BD}$ and the ripple voltage reaches another preset threshold, the reference pulse generation unit 1240 generates a second reference pulse to turn on the second switch unit 1320 so that the second switch unit 1320 enters a conductive state, and to turn off the remaining first, third and fourth switch units 1310, 1330 and 1340 so that the switches 1310, 1330 and 1340 enter an open state. Using this operation, current is applied to the first and second LEDs $LED_1$ and $LED_2$ and then the first and second LEDs $LED_1$ and $LED_2$ emit light. In this case, the second current control unit 136 controls current flowing through the first and second LEDs LED$_1$ and LED$_2$ and the second switch unit 1320 as to be constant current.

Next, when the voltage detection unit 1220 detects the ripple voltage V$_{BD}$ and the ripple voltage reaches a further preset threshold, the reference pulse generation unit 1240 generates a third reference pulse to turn on the third switch unit 1330 so that the third switch unit 1330 enters a conductive state, and to turn off the remaining first, second and fourth switch units 1310, 1320 and 1340 so that the switches 1310, 1320 and 1340 enter an open state. Using this operation, current is applied to the first to third LEDs LED$_1$ to LED$_3$ and then the first to third LEDs LED$_1$ to LED$_3$ emit light. In this case, the third current control unit 1370 controls current flowing through the first to third LEDs LED$_1$ to LED$_3$ and the third switch unit 1330 as to be constant current.

Next, when the voltage detection unit 1220 detects the ripple voltage V$_{BD}$ and the ripple voltage reaches yet another preset threshold, the reference pulse generation unit 1240 generates a fourth reference pulse to turn on the fourth switch unit 1340 so that the fourth switch unit 1340 enters a conductive state, and to turn off the remaining first to third switch units 1310 to 1330 so that the switches 1310 to 1330 enter an open state. Using this operation, current is applied to the first to fourth LEDs LED$_1$ to LED$_4$ and then the first to fourth LEDs LED$_1$ to LED$_4$ emit light. In this case, the fourth current control unit 1380 controls current flowing through the first to fourth LEDs LED$_1$ to LED$_4$ and the fourth switch unit 1340 as to be constant current.

The ripple voltage detected by the voltage detection unit 1220 periodically repeats while increasing and decreasing, so that the above-described LED control performed by the LED driving switch unit 1300 may allow stepped current, in which rising and falling ripple voltage is periodically repeated, to flow through the LED channel CH1.

Figure 26:
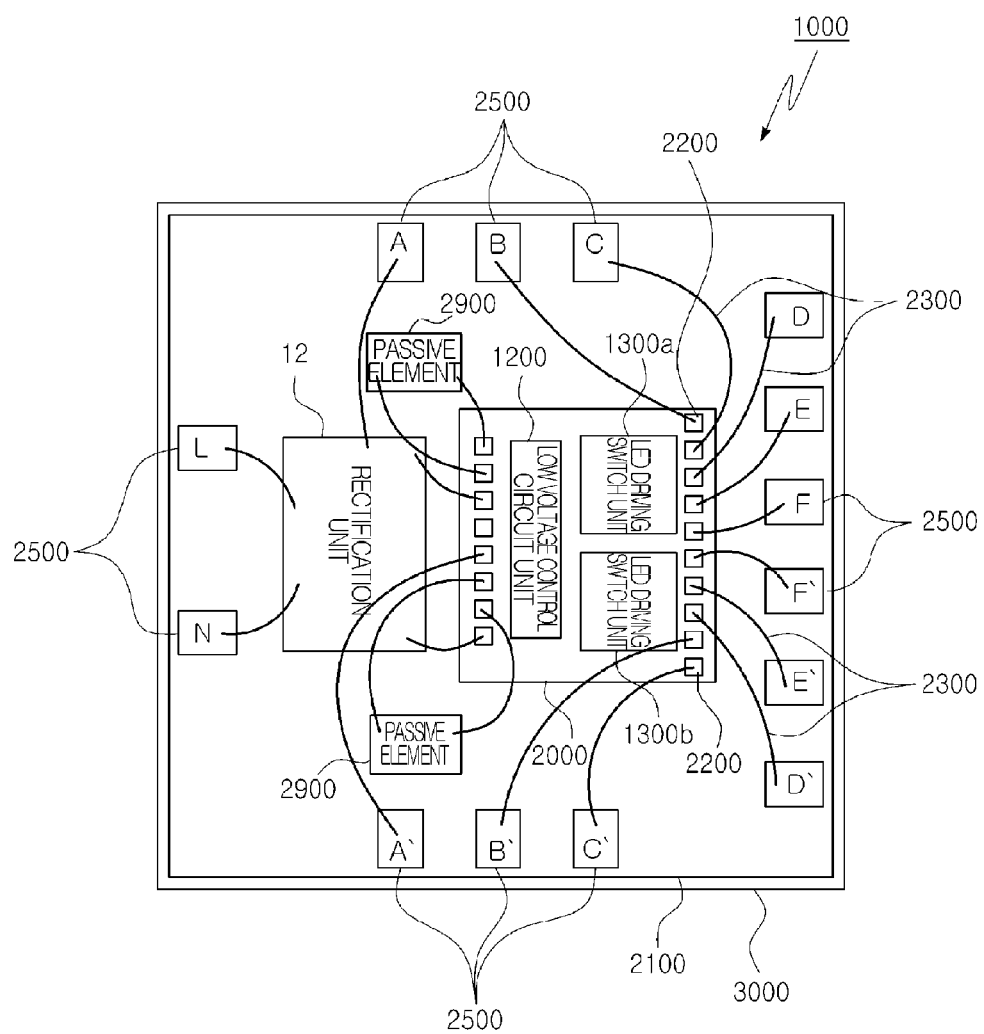
FIG. 26 is a plan view showing the LED driving circuit package according to an exemplary embodiment of the present invention.
Figure 27:
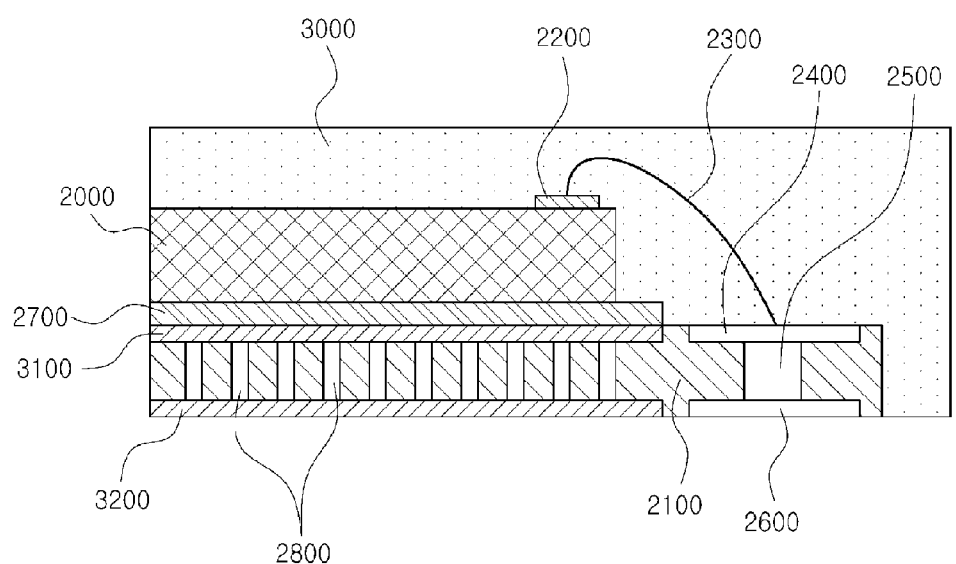
FIG. 27 is a side sectional view showing the LED driving circuit package according to the exemplary embodiment shown in FIG. 26.

FIG. 26 is a plan view showing the LED driving circuit package according to an exemplary embodiment of the present invention. FIG. 27 is a side sectional view showing the LED driving circuit package according to the present exemplary embodiment.

Referring to FIG. 26 and FIG. 27, the LED driving circuit package 1000 according to the present exemplary embodiment may be implemented as a Multi-Chip Package (MCP) including a silicon substrate 2000 and a Printed Circuit Board (PCB) 2100.

That is, the LED driving circuit package 1000 according to the present exemplary embodiment includes the PCB 2100, the silicon substrate 2000 bonded to the top surface of the PCB 2100, and the rectification unit 12 and passive elements 2900 mounted on the top surface of the PCB 2100.

The low voltage control circuit unit 1200 and LED driving switch units 1300*a* and 1300*b* described in FIG. 25 may be integrated into the silicon substrate 2000 using a semiconductor manufacturing process. FIG. 26 illustrates an exemplary embodiment in which two driving switch units 1300*a* and 1300*b* are depicted to drive two LED channels.

The rectification unit 12 may be implemented using four PN junction diodes. Generally, as the PN junction diodes, diodes that are able to suppress reverse voltage having magnitude that is about 1.5 to 2 times that of input AC voltage may be used. Therefore, in order to implement both the rectification unit and the low voltage circuit unit together on the silicon substrate, an additional process for isolating high voltage from low voltage during the manufacturing of the semiconductor device may be required. Thus, the diodes used to constitute the rectification unit 12 may be implemented in such a way that the diodes are independently mounted on the PCB 2100 using individual elements or the like.

Meanwhile, some of the diodes included in the rectification unit 12 can be implemented as overvoltage and surge voltage suppressor diodes such as Zener diodes or Transient Voltage Suppression (TVS) diodes, rather than PN junction diodes. The present exemplary embodiment has rectification unit 12 diodes that are not implemented in the silicon substrate 2000 and are mounted on the PCB 2100, thus enabling elements to be easily changed in a packaging process.

Further, the passive resistive elements 2900 may be mounted on the PCB 2100 in the form of separate individual elements without being integrated into the silicon substrate 2000.

Since the circuit of the present exemplary embodiment is supplied with and operated by various types of AC power ranging from 80 Vrms to 265 Vrms, it must acquire power (voltage and current) from AC voltage unlike typical circuits that are supplied with and driven by separate external power. Therefore, the circuit power supply unit 1210 of the low voltage control circuit unit 1200 requires passive resistive elements having high power consumption. With just a semiconductor manufacturing process using a silicon substrate, it may be difficult to implement passive elements having high power consumption, and thus necessary passive elements 2900 having high power consumption can be mounted on the PCB 2100 so as to divide the AC rectified voltage in the present exemplary embodiment.

In the exemplary embodiment shown in FIG. 26 and FIG. 27, in a region of the PCB 2100 to which the silicon substrate 2000 is bonded, an upper heat dissipation pad 3100 may be formed. Further, on the bottom surface of the PCB 2100, corresponding to the region in which the upper heat dissipation pad 3100 is formed, a lower heat dissipation pad 3200 may be formed. In addition, vias 2800 that come into direct contact with the upper and lower heat dissipation pads 3100 and 3200 may be formed in the PCB 2100 in order to easily transfer heat from the upper heat dissipation pad 3100 to the lower heat dissipation pad 3200.

In consideration of insulation from the PCB 2100, the silicon substrate 2000 may be bonded to the top of the upper heat dissipation pad 31 using a non-conducting adhesive 2700.

Meanwhile, although not shown in the drawings, in a modification of the embodiment shown in FIG. 26 and FIG. 27, the upper heat dissipation pad 3100 of the PCB 2100 may be omitted, and the silicon substrate 2000 may be directly bonded to a region, in which the vias 2800 are formed, using the non-conducting adhesive 2700.

The rectification unit 12 and the silicon substrate 2000 are arranged adjacent to the center portion of the top surface of the PCB 2100, and electrode pads L, N, A to F, A' to F', and 2400 may be formed on the top surface of the PCB 2100 along the edges of the PCB 2100. The electrode pads L, N, A to F, A' to F', and 2400 may form electrical connections to the rectification unit 12 and the silicon substrate 2000 through wires 2300. The electrode pads L, N, A to F, A' to F', and 2400 may be electrically connected to an external connection electrode 2600 formed on the bottom surface of the PCB 2100 through a conductive via 2500.

When forming electrical connections through the wires 2300, the electrical connections may be formed so that wires through which high voltage flows and wires through which low voltage flows are spatially isolated so as to remove electrical interference therebetween. For this operation, it is preferable that the electrode pads L and N to which AC power is externally applied, and the electrode pads A and A' to which the ripple voltage $V_{BA}$ formed by the rectification unit 12 is applied, be arranged adjacent to the rectification unit 12, thus the length of the wires for electrical connections to be made as short as possible.

The above-described PCB 2100, silicon substrate 2000, rectification unit 12, passive elements 2900, and bonding wires 2300 may form an integrated mold part 3000 using various kinds of molding materials including a resin material or the like, and thus are integrally molded together.

Figure 28:
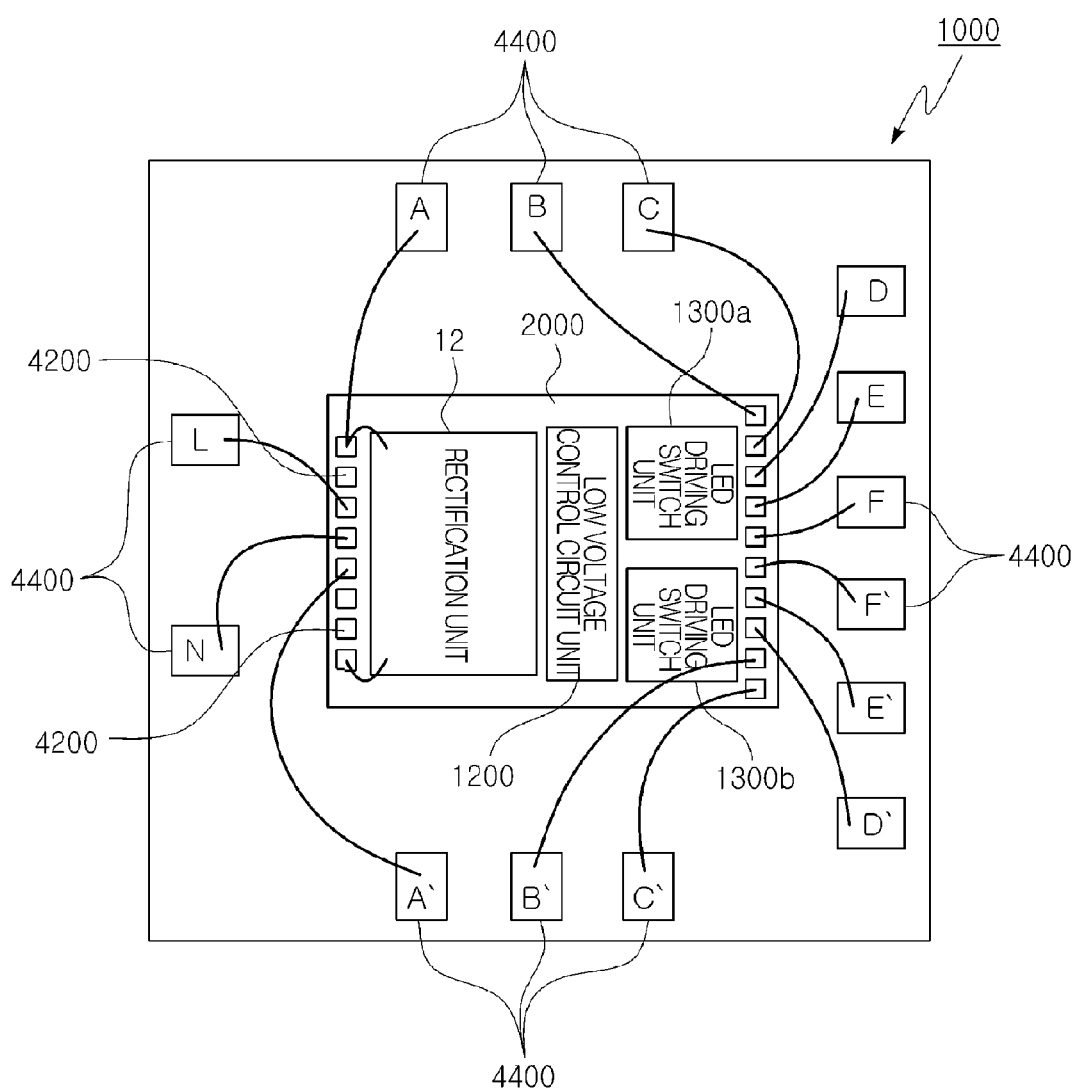
FIG. 28 is a plan view showing an LED driving circuit package according to an exemplary embodiment of the present invention.
Figure 29:
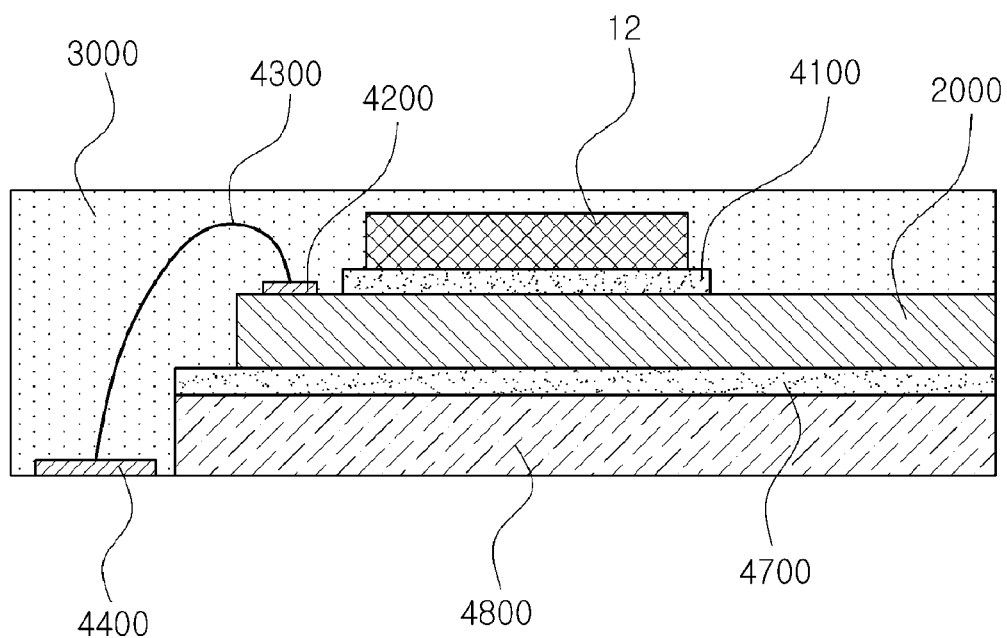
FIG. 29 is a side sectional view showing the LED driving circuit package according to the exemplary embodiment shown in FIG. 28.

FIG. 28 is a plan view showing an LED driving circuit package according to an exemplary embodiment of the present invention, and FIG. 29 is a side sectional view showing the LED driving circuit package of FIG. 28.

The embodiment shown in FIG. 28 and FIG. 29 has a structure including a silicon substrate 2000 into which a low voltage control circuit unit 1200 and LED driving switch units 1300*a* and 1300*b* are integrated using a semiconductor manufacturing process, and a rectification unit 12 mounted on the top surface of the silicon substrate 2000.

In the present exemplary embodiment, high voltage diodes constituting the rectification unit 12 may be mounted on the silicon substrate 2000 using a conducting or non-conducting adhesive (made of, for example, an epoxy material) 4100. In the silicon substrate 2000, a region required to mount the high voltage diodes may be provided in an area spaced apart from the area in which the low voltage control circuit unit 1200 and the LED driving switch units 1300*a* and 1300*b* are integrated.

Furthermore, connection pads 4200 for forming electrical connections between the electrode pads 4400 and the rectification unit 12 may be formed on the silicon substrate 2000. Wires 4300 may be bonded to the connection pads 4200 so as to individually form electrical connections to the rectification unit 12 and to the external electrodes 4400.

The silicon substrate 2000 may be bonded to the top of a heat dissipation pad 4800 to provide heat dissipation. The silicon substrate 2000 and the heat dissipation pad 4800 may be mutually bonded to each other using a non-conducting adhesive 4700 so as to form an electric insulator.

The above-described heat dissipation pad 4800, silicon substrate 2000, rectification unit 12 and bonding wires 2300 may form an integrated mold part 3000 using various kinds of molding materials such as a resin material or the like, and thus are integrally molded together. On the bottom surface of the mold part 3000, electrode pads L, N, A to F, A' to F', and 4400 may be formed at locations spaced apart from the heat dissipation pad 4800.

These electrode pads L, N, A to F, A' to F', and 44 may form electrical connections to the silicon substrate 2000 via wire bonding while being used as external connection electrodes for inputting/outputting electrical signals to/from the outside of the package.

Similarly to the exemplary embodiment shown in FIGS. 26 and FIG. 27, the electrode pads L, N, A to F, A' to F', and 4400 may be formed such that electrode pads for high voltage usage are spaced apart from electrode pads for low voltage usage. That is, the electrode pads L and N to which AC power is externally applied and the electrode pads A and A' to which the ripple voltage $V_{BA}$ formed by the rectification unit 12 is applied, may be arranged adjacent to the rectification unit 12, thus enabling the length of the wires for electrical connections to be made as short as possible.

Figure 30:
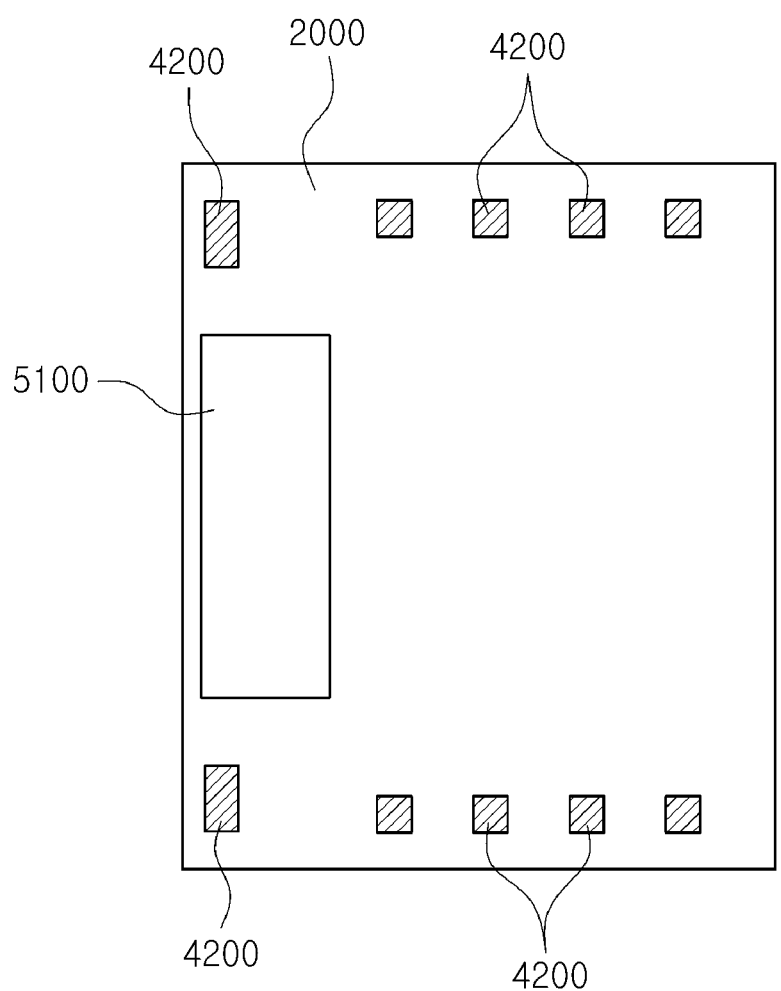
FIG. 30 and FIG. 31 are plan views showing examples of the arrangement of terminals and the implementation of the rectification unit on the top surface of the silicon substrate in the LED driving circuit package of FIG. 28 according to exemplary embodiments of the present invention.
Figure 31:
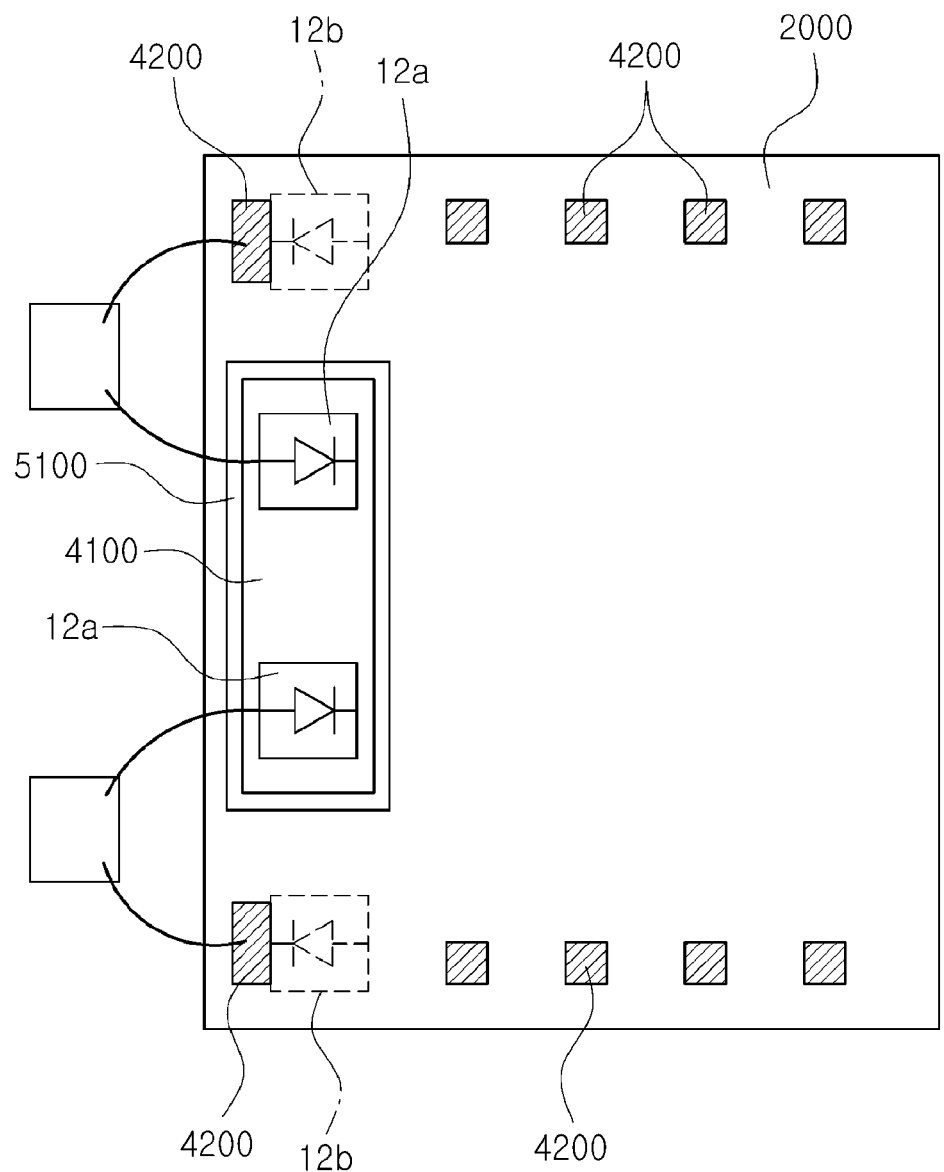

FIG. 30 and FIG. 31 are plan views showing examples of the arrangement of terminals and the implementation of the rectification unit on the top surface of the silicon substrate in the LED driving circuit package of FIG. 28 according to exemplary embodiments of the present invention.

As shown in FIG. 30 a diode mounting pad 5100 to mount diodes included in the rectification unit 12, and connection pads 4200 to form electrical connections to electrode pads L, N, A to F, A' to F', and 4400 formed on the bottom surface of the mold part 3000 may be arranged on the top surface of the silicon substrate 2000.

As shown in FIG. 31, an exemplary embodiment of the present invention may be implemented such that some diodes 1100*a* of the rectification unit 12 are mounted on the diode mounding pad 5100 in the form of individual elements using a conductive adhesive 4100, and such that the remaining diodes 1100*b* are integrated into the silicon substrate.

Another exemplary embodiment of the present invention may be implemented such that all diodes used in the rectification unit 12 are mounted on the diode mounting pad 5100 in the form of individual elements using the conducting adhesive 4100.

Figure 32:
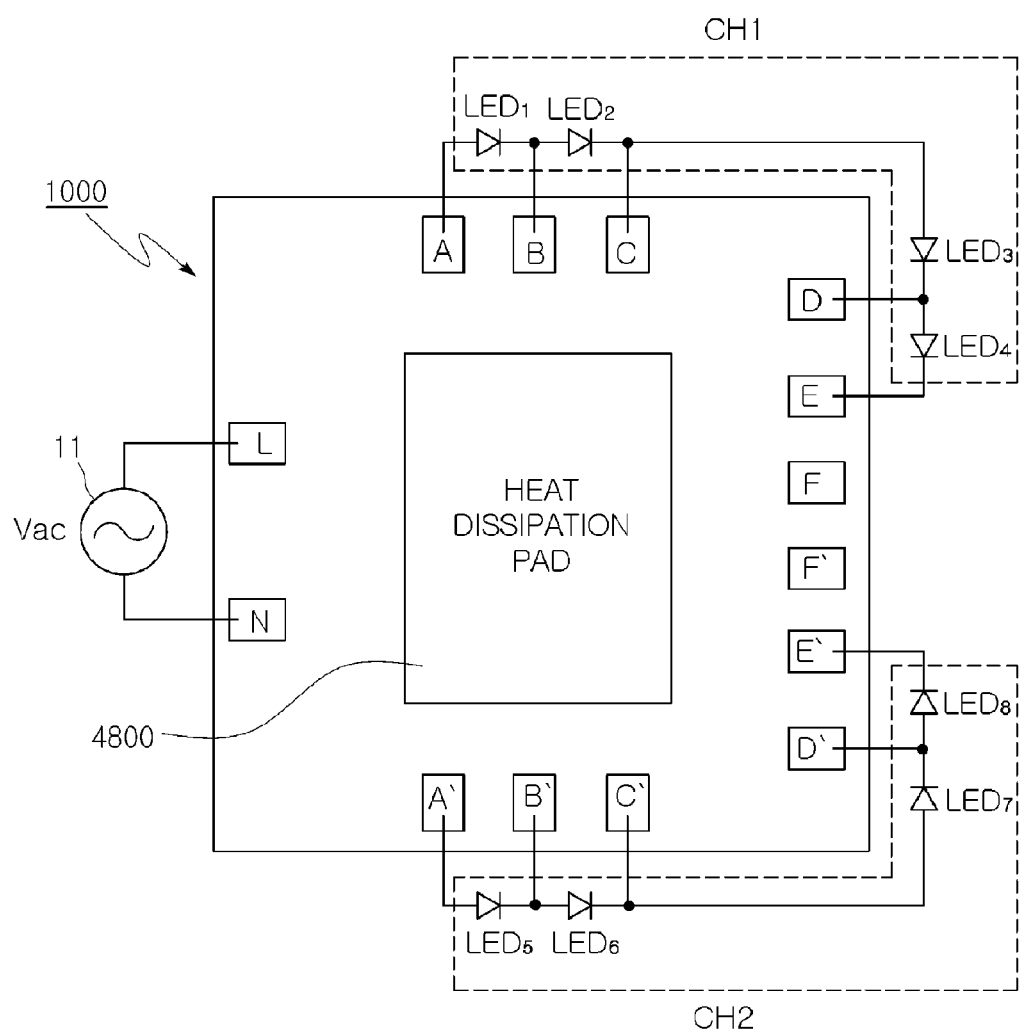
FIG. 32 is a diagram showing the arrangement of electrode pads and the connection between the electrode pads and LEDs in the LED driving circuit package according to an exemplary embodiment of the present invention.

FIG. 32 is a diagram showing the arrangement of electrode pads and the connection between the electrode pads and LEDs in the LED driving circuit package according to an exemplary embodiment of the present invention.

In FIG. 32, electrode pads A, B, C, D, and E may be connected to LEDs $LED_1$ to $LED_4$ forming one channel CH1, and electrode pads A', B', C', D', and E' may be connected to LEDs $LED_5$ to $LED_8$ forming another channel CH2. The electrode pads F and F' may be used to adjust currents flowing through respective LED channels. Such current adjustment may be performed using various types of electric and electronic parts (for example, a resistor, a capacitor, an inductor or a transistor) that are separately connected to the outside of the package.

As shown in FIG. 32, electrode pads L and N to which AC power is applied may be formed on one side of the driving circuit package, and electrode pads A to F and A' to F' connected to the LEDs may be arranged between channels to be symmetrical on the remaining sides other than the side closest to the electrode pads L and N to which the power is applied.

FIG. 32 illustrates the connection between the LEDs implemented as two channels, but the present invention is not limited to this connection. Various numbers of channels may be determined depending on the number of LEDs desired to be driven and the amount of current desired to be supplied to the LEDs, so that the structure of the arrangement of the electrode pads can be changed.

Figure 33:
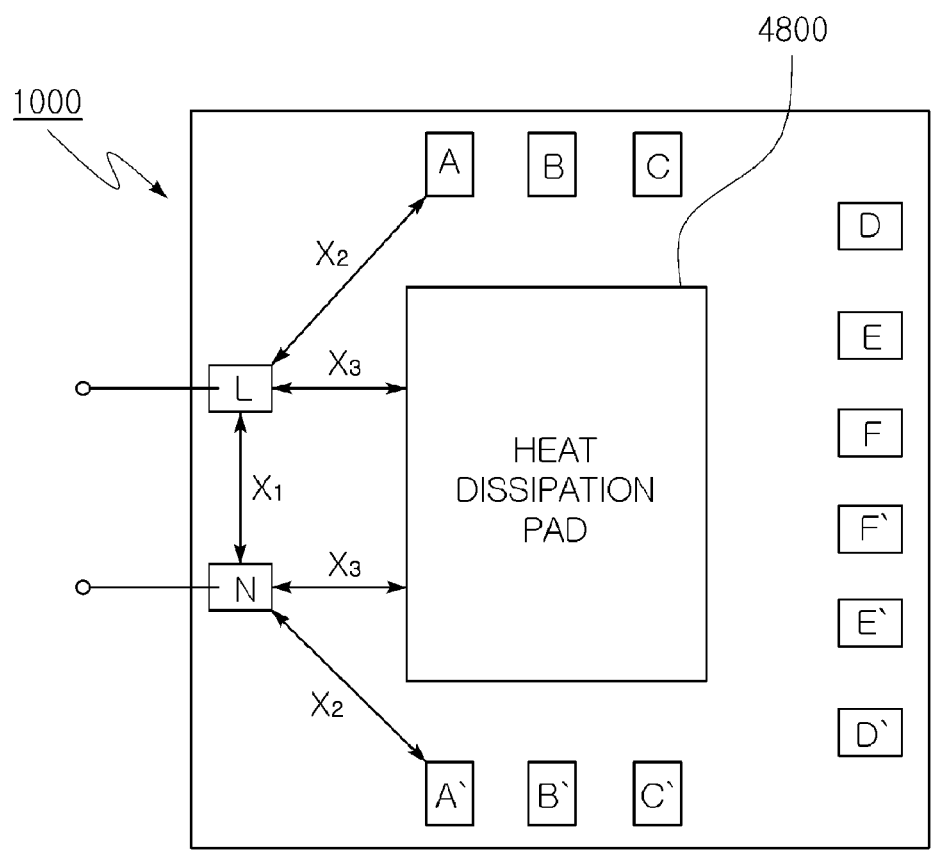
FIG. 33 is a diagram showing the arrangement of electrode pads and the connection between the electrode pads and a heat dissipation pad in the LED driving circuit package according to an exemplary embodiment of the present invention.

FIG. 33 is a diagram showing the arrangement of electrode pads and the connection between the electrode pads and a heat dissipation pad in the LED driving circuit package according to an exemplary embodiment of the present invention.

In FIG. 33, AC voltages functioning as power are alternately applied to electrode pads L and N as positive (+) and negative (−) voltages. Further, unidirectional ripple voltage $V_{BA}$ is applied by the rectification unit 12 to electrode pads A and A'. That is, high voltage is instantaneously applied to the electrode pads L, N, A and A'.

Therefore, as shown in FIG. 33, separation distances $x_1$ and $x_2$ for insulation must be achieved among the electrode pads L, N, A and A'. For example, the separation distances $x_1$ and $x_2$ may range from a minimum of 1 mm to a maximum of 5.2 mm. As described above, since the operating voltage may have a value from 80 Vrms to 265 Vrms, the separation distances $x_1$ and $x_2$ may be suitably adjusted within the above-described range according to the operating voltage. The distances $x_1$ and $x_2$ may be increased as Vrms increases.

Further, in the exemplary embodiment of FIG. 28 and FIG. 29, the area of a heat dissipation pad 4800 may be increased so as to obtain a high heat dissipation effect. However, if the area of the heat dissipation pad 4800 having conductivity is excessively increased, the separation distances providing insulation between the electrode pads L, N, A and A' to which high voltage is applied may not be achievable. Therefore, the heat dissipation pad 4800 may be formed so that the separation distance $x_3$ providing insulation from the electrode pads L, N, A and A' is achieved. The separation distance $x_3$ may be formed to be substantially identical to the separation distances $x_1$ and $x_2$.

Figure 34:
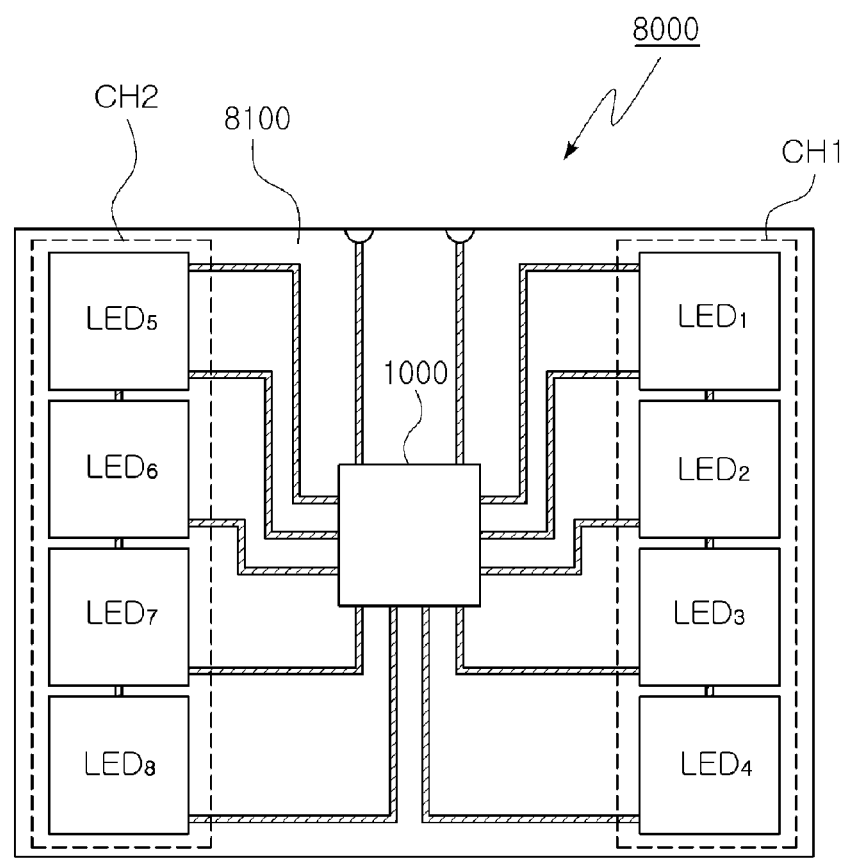
FIG. 34 is a diagram showing an example of a luminescence module to which the LED driving circuit package according to an exemplary embodiment of the present invention is applied.

FIG. 34 is a diagram showing an example of a luminescence module to which the LED driving circuit package according to an exemplary embodiment of the present invention is applied.

As shown in FIG. 34, when the LED driving circuit package according to an exemplary embodiment of the present invention is applied, the LED driving circuit package 1000 and the LEDs of individual channels CH1 and CH2 can be arranged together on one surface of the board 8100 of a luminescence module.

In particular, the LEDs of the channels CH1 and CH2 are arranged in a line for each channel and the LED driving circuit package 1000 is disposed between the LEDs of the respective channels, so that an arrangement of LEDs providing efficient lighting may be possible.

Meanwhile, a heat dissipation means for efficiently discharging heat radiated from the LED driving circuit package 1000 and the LEDs $LED_1$ to $LED_8$ may be provided on the substrate 8100 of the luminescence module 8000.

Figure 35:
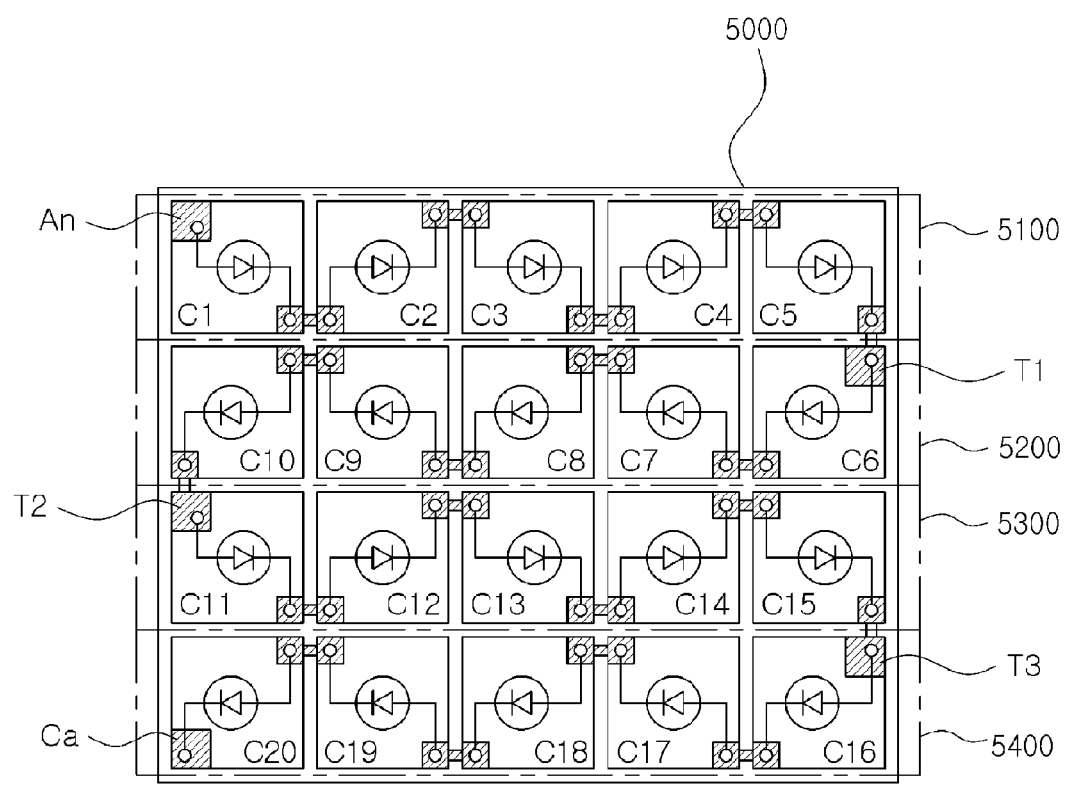
FIG. 35 is a diagram showing an example of an LED chip which can be applied to the LED luminescence apparatus of the present invention described above with respect to FIG. 3, FIG. 4, FIG. 5, and FIG. 6.

FIG. 35 is a diagram showing an example of an LED chip which can be applied to the LED luminescence apparatus of the present invention described above with respect to FIG. 3, FIG. 4, FIG. 5, and FIG. 6.

As shown in FIG. 35, an LED chip 5000 which is applied to the above-described LED luminescence apparatus of the present invention can be implemented as a multi-cell LED chip including a plurality of LED cells C1 to C20. Each of the plurality of LED cells C1 to C20 included in the LED chip 5000 forms an electrical connection to neighboring LED cells, thus forming a single integrated series-connection structure.

Each of the LED units 13-1 to 13-4 according to the exemplary embodiment described in FIG. 3 may be implemented as a single LED or a plurality of LEDs that are connected in series or in parallel to each other. In the LED chip of FIG. 35, LED cells forming a single row may be used as a single LED unit. For example, the LED cells C1 to C5 in a first row 5100 may form a first LED unit, the LED cells C6 to C10 in a second row 5200 may form a second LED unit, the LED cells C11 to C15 in a third row may form a third LED unit, and the LED cells C16 to C20 in a fourth row 5400 may form a fourth LED unit.

As shown in FIG. 3, the LED units of the LED luminescence apparatus input and output the driving current, and have nodes which form an electrical connection to switches. In the LED chip of FIG. 35, terminal units An, Ca, and T1 to T3 which form electrical wiring to the outside of the chip on cells C6, C11, and C16 may be formed so as to input/output the driving current and form electrical connections to the switches. Each of the terminals units An, Ca, and T1 to T3 may be formed in the shape of a pad which has a predetermined area and to which a wire for forming an electrical connection to the outside is bonded.

Figure 36:
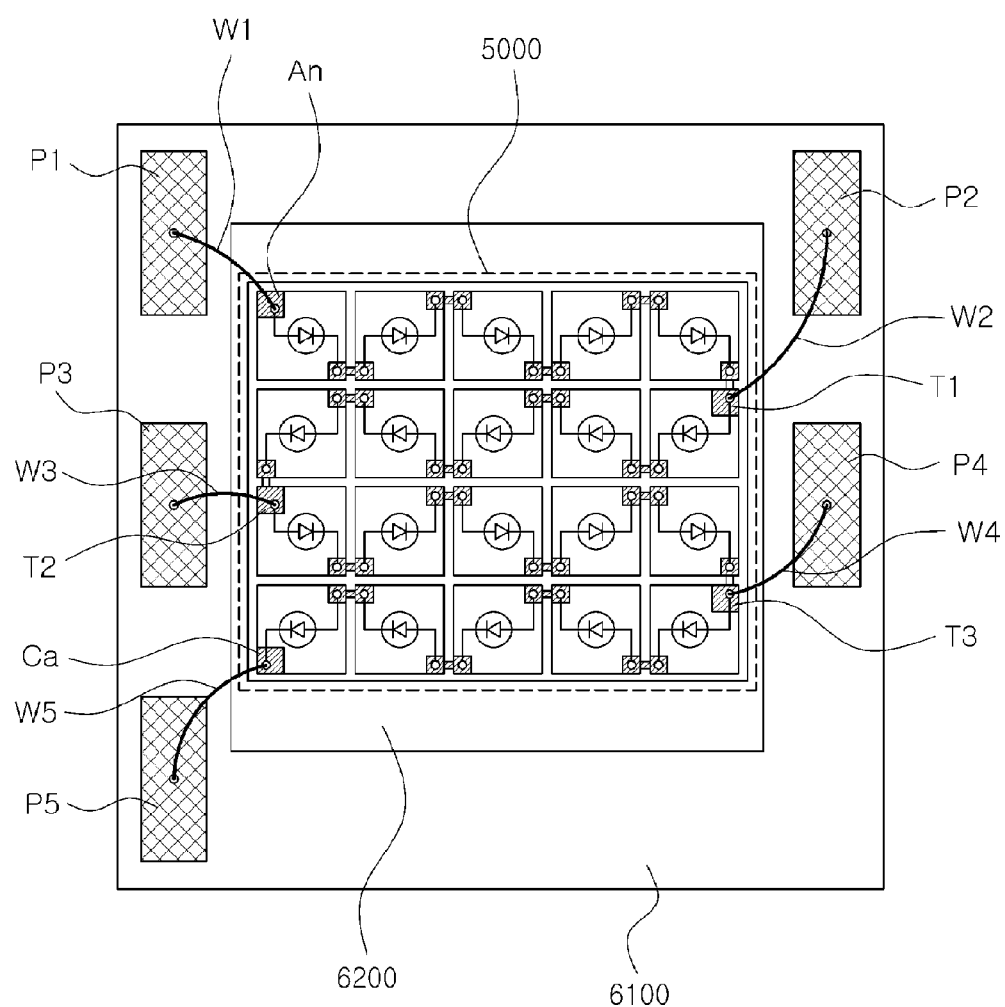
FIG. 36 is a plan view showing an LED package using the multi-cell LED chip shown in FIG. 35.

FIG. 36 is a plan view showing an LED package using the multi-cell LED chip of FIG. 35.

The LED package of FIG. 36 may include a board 6100 having a die attach area 6200 at the center portion thereof, an LED chip 5000 attached to the die attach area 6200, and a plurality of electrode pad units P1 to P5 formed around the die attach area 6200 and configured to form electrical connections to the terminal units An, Ca, and T1 to T3 of the LED chip 5000 via wires w1 to w5.

Although not shown in the drawing, a heat dissipation pad for effectively dissipating and discharging heat generated by the LED chip may be formed on the die attach area 6200. Further, on a surface opposite the one surface of the board to which the LED chip 5000 is attached and on which the electrode pad units P1 to P5 are formed, a plurality of terminal units corresponding to the electrode pad units P1 to P5 in a one-to-one correspondence may be formed so as to form electrical connections to the electrode pad units P1 to P5. These terminal units may be connected to a rectification circuit unit and may be configured to input/output driving current and set up connections to switches.

Figure 37A:
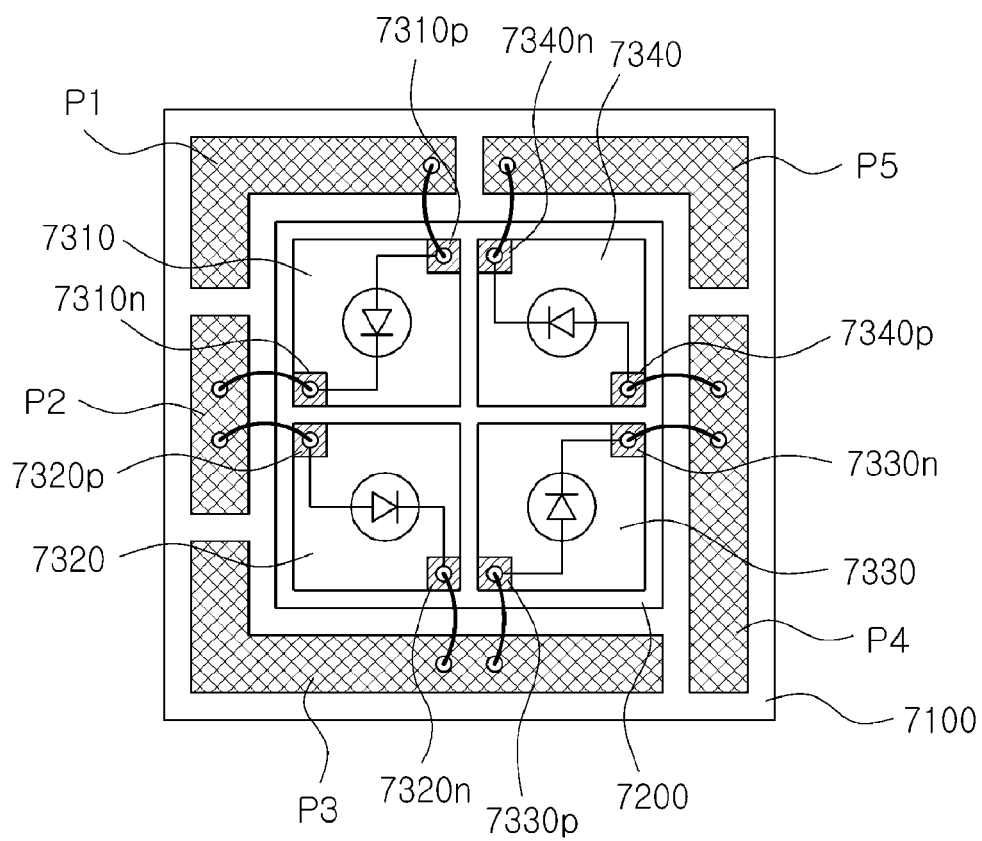
FIG. 37A and FIG. 37B are diagrams showing an exemplary embodiment of an LED package which can be applied to the LED luminescence apparatus according to exemplary embodiment shown in FIG. 35 and FIG. 36.
Figure 37B:
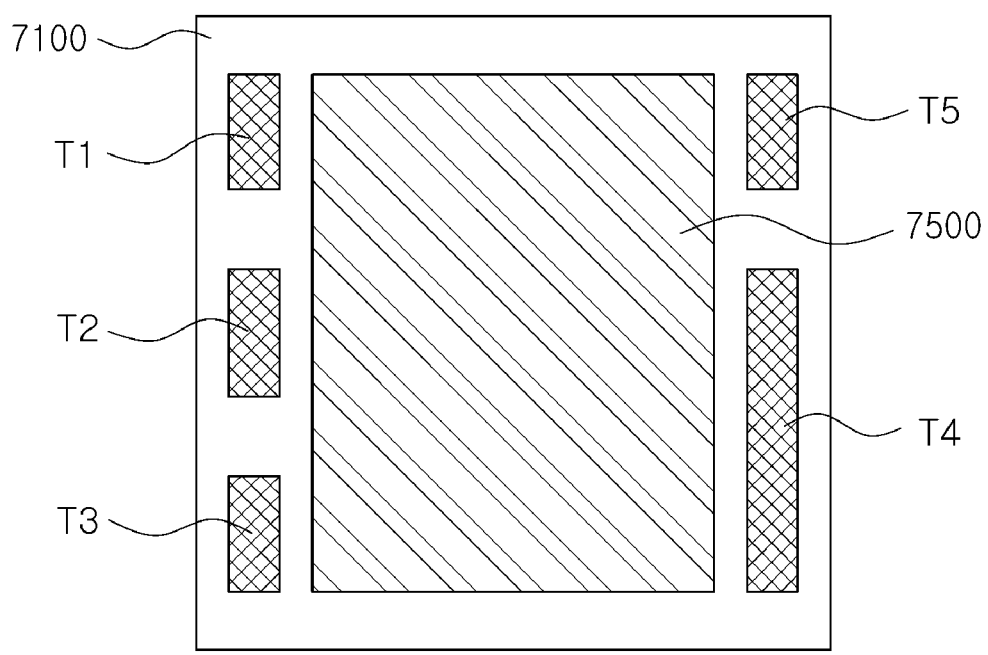

FIG. 37A and FIG. 37B are diagrams showing an exemplary embodiment of an LED package which can be applied to the LED luminescence apparatus described above. FIG. 37A is a diagram showing the surface of the LED package to which LED chips are attached, and FIG. 37B is a diagram showing the opposite surface thereof.

As shown in FIG. 37A, the LED package according to an exemplary embodiment of the present invention may include a board 7100 having a die attach area 7200 formed at the center portion thereof, a plurality of LED chips 7310 to 7340 attached to the die attach area, and a plurality of electrode pad units P1 to P5 formed around the die attach area.

The LED package shown in FIG. 37A has a structure in which a single LED chip forms a single LED unit, wherein electrical connections between the LED units may be made by a plurality of electrode pad units P1 to P5.

For example, the p-type electrode 7310*p* of the first LED chip 7310 may be wire-bonded to the first electrode pad unit P1, the n-type electrode 7310*n* of the first LED chip 7310 and the p-type electrode 7320*p* of the second LED chip 7320 may be wire-bonded in common to the second electrode pad unit P2, the n-type electrode 7320*n* of the second LED chip 7320 and the p-type electrode 7330*p* of the third LED chip 7330 may be wire-bonded in common to the third electrode pad unit P3, the n-type electrode 7330*n* of the third LED chip 7330 and the p-type electrode 7340*p* of the fourth LED chip 7340 may be wire-bonded in common to the fourth electrode pad unit P4, and the n-type electrode 7340*n* of the fourth LED chip 7340 may be wire-bonded to the fifth electrode pad unit P5.

Using this connection structure, the four LED chips form a connection structure in which they are connected in series to each other. Further, the first electrode pad unit P1 and the fifth electrode pad unit P5 are connected to a rectification circuit unit, and the second to fourth electrode pad units P2 to P4 are respectively connected to a plurality of switches, thus enabling the LED units to be sequentially driven, as described above.

As shown in FIG. 37A, the p-type electrode 7310*p*, 7320*p*, 7330*p* or 7340*p* and the n-type electrode 7310*n*, 7320*n*, 7330*n*, or 7340*n* are formed at corners located diagonally across from each other on the top surface of each of the LED chips 7310 to 7340. Further, the LED chips 7310 to 7340 may be arranged in a 2×2 matrix form and may be arranged such that one electrode of each LED chip is adjacent to the electrode of a single neighboring LED chip. By means of this arrangement, wire bonding between the electrode pads formed around the die attach area 7200 and the electrodes of the respective LED chips may be implemented so that the wires that are bonded do not intersect or interfere with each other.

Meanwhile, as shown in FIG. 37B, on a surface opposite the one surface of the board shown in FIG. 37A, a plurality of terminal units T1 to T5 corresponding to the electrode pad units P1 to P5 in a one-to-one correspondence may be formed so as to form electrical connections to the electrode pad units P1 to P5. The terminal units T1 to T5 make electrical contact with circuit patterns or the like on other external boards, thus forming electrical connections between the LED chips, the rectification circuit unit and the switches, as described above. Further, on a corresponding portion of the surface that is below the portion to which the LED chips 7310 to 7340 are attached, there may be formed a heat dissipation pad 7500 for effectively dissipating and discharging heat radiated from the LED chips 7310 to 7340.

Figure 38A:
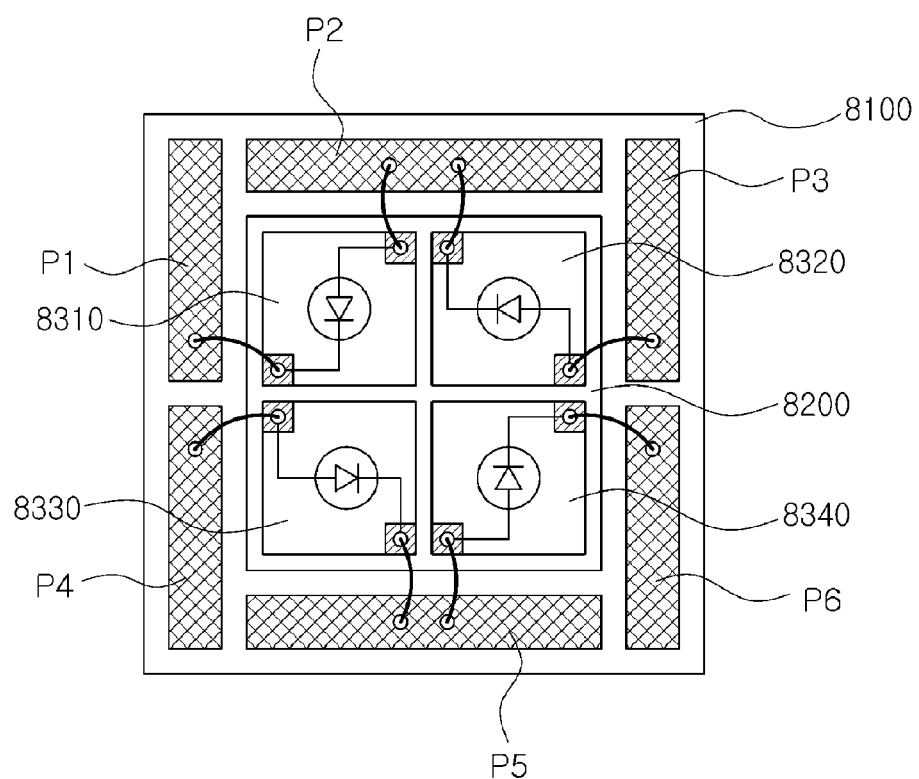
FIG. 38A and FIG. 38B are diagrams showing an exemplary embodiment of an LED package which can be applied to the LED luminescence apparatus shown in FIG. 35 and FIG. 36.
Figure 38B:
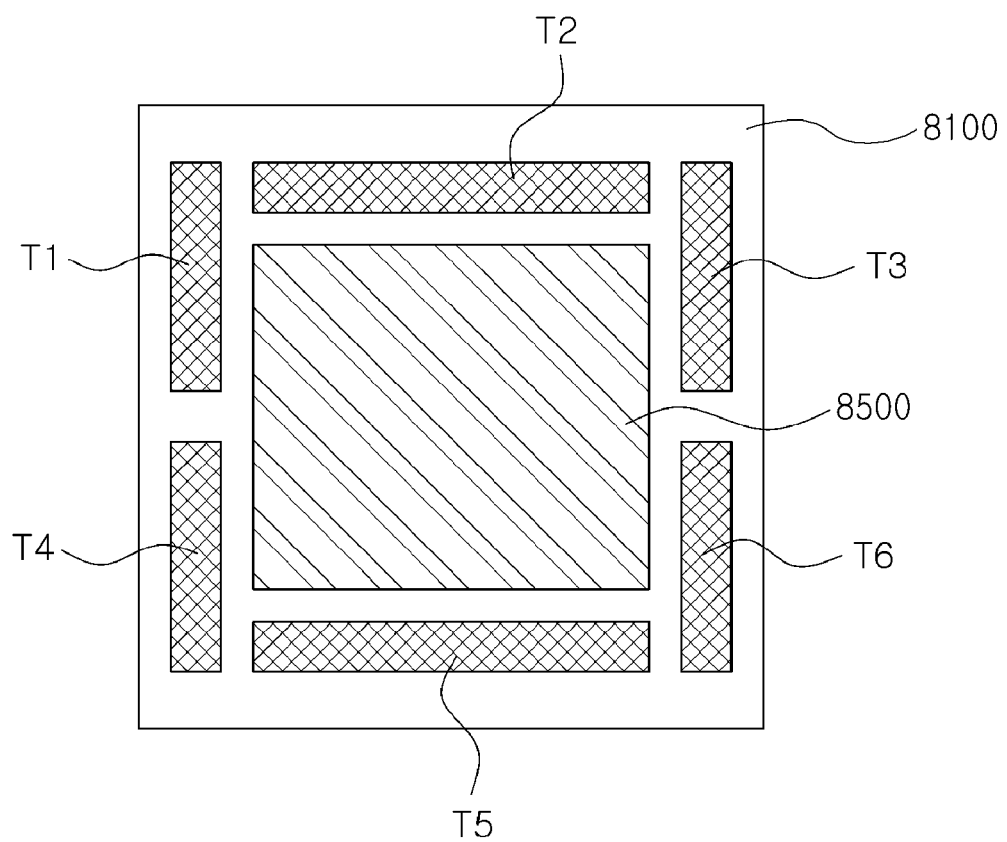

FIG. 38A and FIG. 38B are diagrams showing an exemplary embodiment of an LED package which can be applied to the LED luminescence apparatus described above. FIG. 38A is a diagram showing the surface of the LED package to which the LED chips are attached, and FIG. 38B is a diagram showing the opposite surface thereof.

Similarly to the above-described LED package of FIG. 37A and FIG. 37B, the LED package according to the present exemplary embodiment may include a board 81 having a die attach area 8200 formed at the center portion thereof, a plurality of LED chips 8310 to 8340 attached to the die attach area, and a plurality of electrode pad units P1 to P6 formed around the die attach area.

The LED package of FIG. 38A has a structure in which the LED chip 8310 and the LED chip 8320 form a series-connection via the electrode pad unit P2, and the LED chip 8330 and the LED chip 8340 form a series-connection via the electrode pad unit P5.

In the connection structure of the LED chips, as shown in FIG. 38A, when an electrical connection is formed between the electrode pad unit P3 and the electrode pad unit P4, the four LED chips 8310 to 8340 may be connected in series to one another. In this case, the first electrode pad unit P1 and the sixth electrode pad unit are connected to a rectification circuit unit, and the electrode pad unit P2, the electrode pad unit P3 or P4, and the electrode pad unit P5 are individually connected to a plurality of switches, thus enabling the LED units to be sequentially driven, as described above.

Meanwhile, in the LED package of FIG. 38A, when the electrode pad unit P1 and the electrode pad unit P4 are electrically connected to each other, and the electrode pad unit P3 and the electrode pad unit P6 are electrically connected to each other, an electrical connection structure is formed in which the two series-connected LED chips 8310 and 8320 and the two series-connected LED chips 8330 and 8340 are connected in parallel to each other. In this case, the electrode pad unit P1 or P4 and the electrode pad unit P3 or P4 are connected to the rectification circuit unit, and the electrode pad unit P2 and the electrode pad unit P5 may be connected to the switches. In this way, the two LED chips 8310 and 8320 can be sequentially driven, and the two LED chips 8330 and 8340 can be sequentially driven. In this electrical connection structure, half of the driving voltage and double driving current are required compared to the connection structure of the LED chips shown in FIG. 37A and FIG. 37B.

As shown in FIG. 38A, the electrical connections between the LED chips and the electrode pad units have been changed, and thus suitable electrical connection structures can be formed as occasion demands.

Meanwhile, similarly to the embodiment of FIG. 37A, electrodes having two polarities may be individually formed at corners located diagonally across from each other on the top surface of each of the LED chips 8310 to 8340 shown in FIG. 38A, and the LED chips 8310 to 8340 may be arranged in a 2×2 matrix form. One electrode of each of the LED chips may be arranged adjacent to the electrode of a single neighboring LED chip.

Further, as shown in FIG. 38B, on a surface opposite the one surface of the board shown in FIG. 38A, a plurality of terminal units T1 to T6 corresponding to the electrode pad units P1 to P6 in a one-to-one correspondence may be formed so as to form electrical connections to the electrode pad units P1 to P6. The terminal units T1 to T6 make electrical contact with circuit patterns or the like on other external boards, thus forming electrical connections between the LED chips, the rectification circuit unit and the switches, as described above. Further, on a corresponding portion of the surface that is below the portion to which the LED chips 8310 to 8340 are attached, there may be formed a heat dissipation pad 8500 for effectively dissipating and discharging heat radiated from the LED chips 8310 to 8340.

The exemplary embodiments described above with respect to FIG. 3, FIG. 4, and FIG. 5, FIG. 6, FIG. 7, FIG. 8, FIG. 9, and FIG. 10 have been described such that the LED driving current increases or decreases in a stepped form using multi-stage constant current control. However, the waveform of the LED driving current may be modified by variously setting reference current for constant current control.

As described above, the series-connected LEDs are sequentially driven at constant current using AC voltage, so that current that increases or decreases in a stepped form can be provided as illustrated in FIG. 4 and FIG. 5, and therefore LED driving current approximate to a sinusoidal wave equal to AC voltage is provided, thereby enabling problems related to the power factor, THD, etc. to be solved.

Furthermore, current at each stage is controlled to have constant magnitude, so that constant driving current can be provided even in the event of variation in AC voltage (distortion, or increase or decrease in the magnitude of voltage). Thus, the light output efficiency of AC-driven LEDs can be improved.

Figure 39:
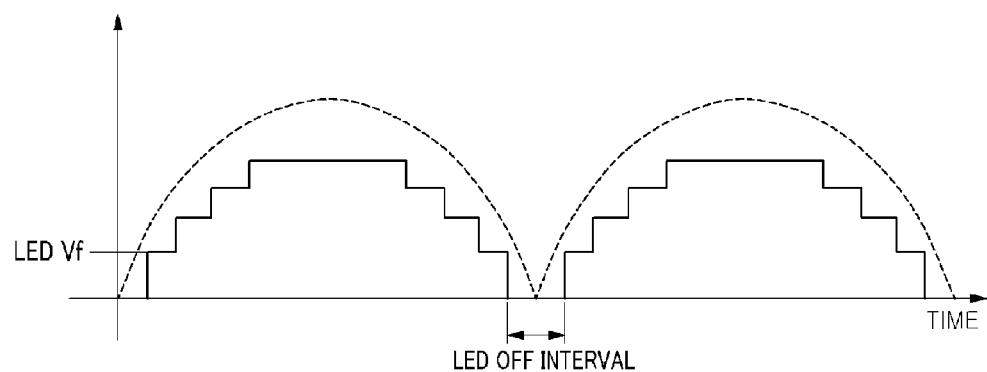
FIG. 39 is a waveform diagram illustrating an OFF interval of AC current provided to LEDs, in the LED luminescence apparatus using AC power according to the exemplary embodiment described with respect to FIG. 3.

FIG. 39 is a waveform diagram illustrating an OFF interval of AC current provided to LEDs, in the LED luminescence apparatus using AC power according to an exemplary embodiment of the present invention.

FIG. 39 illustrates two cycles for waveforms of input voltage and input current of the LED luminescence apparatus using AC power described above with respect to FIG. 3, FIG. 4, and FIG. 5.

Referring to FIG. 4 and FIG. 39, the LED luminescence apparatus using AC power has "LED OFF intervals" where current is not applied to the plurality of LED units 13-1 to 13-N, and thus LEDs do not emit light. The non-light-emitting areas of the LED units 13-1 to 13-4 are an interval prior to t0 of a first cycle, and an interval from t7 of the first cycle to t0 of a second cycle. The non-light-emitting areas are generated at points where the ripple voltage becomes the smallest.

Accordingly, an exemplary embodiment of the present invention provides an LED luminescence apparatus using AC power, in which the plurality of LED units can emit light during entire intervals without generating the above-described non-light-emitting areas.

Figure 40:
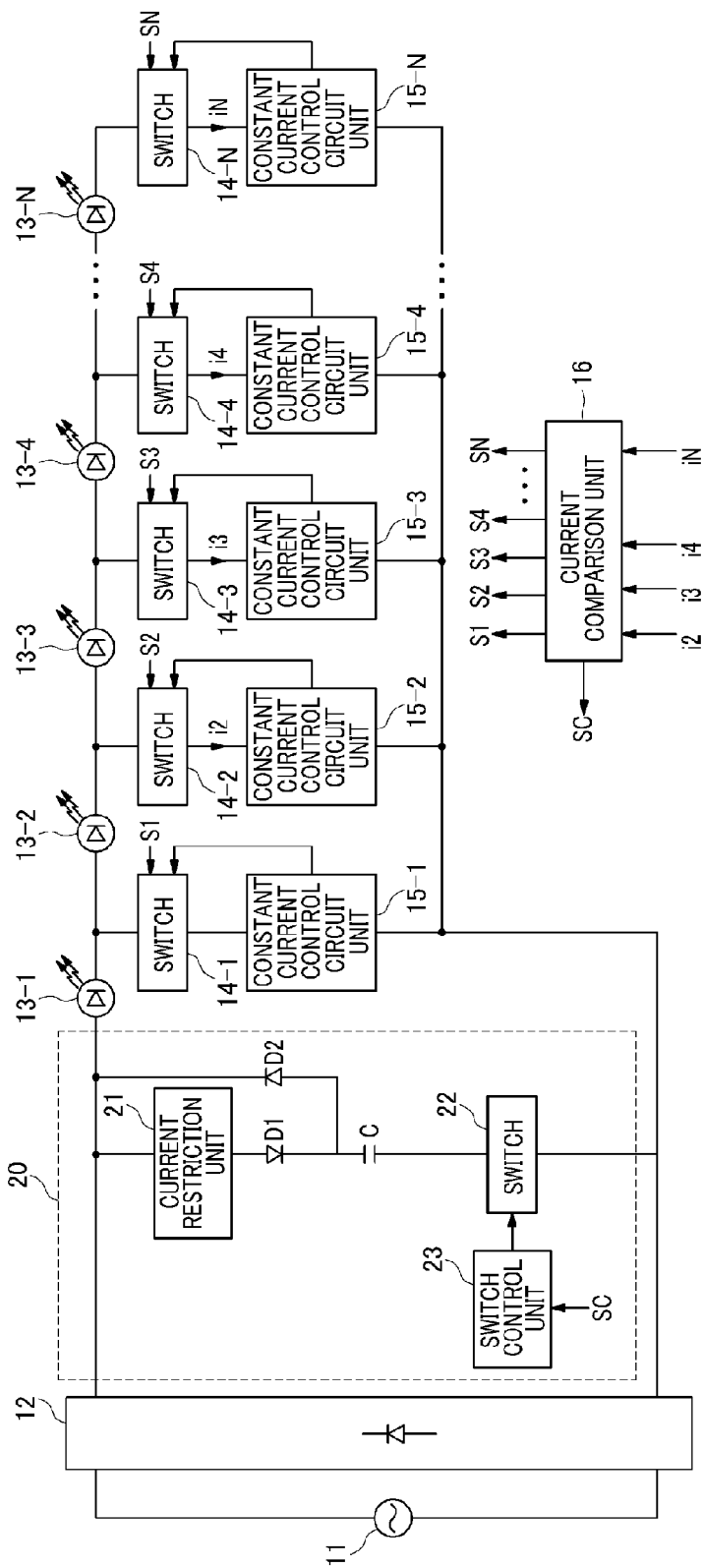
FIG. 40 is a block diagram of an LED luminescence apparatus using AC power according to an exemplary embodiment of the present invention.

FIG. 40 is a block diagram of an LED luminescence apparatus using AC power according to an exemplary embodiment of the present invention.

Referring to FIG. 40, the LED luminescence apparatus using AC power according to the present exemplary embodiment may include an AC power source 11, a rectification circuit unit 12, a plurality of LED units 13-1 to 13-N, a plurality of switches 14-1 to 14-N, a plurality of constant current control circuit units 15-1 to 15-N, a current comparison unit 16, and a light output compensation unit 20.

The configuration of the LED luminescence apparatus using AC power according to the present exemplary embodiment is substantially the same as the configuration of the LED luminescence apparatus using AC power according to the exemplary embodiment described above with respect to FIG. 3, except that the LED luminescence apparatus using AC power according to the present exemplary embodiment further includes the light output compensation unit 20.

Accordingly, for simplification of description, detailed descriptions of the AC power source 11, the rectification circuit unit 12, the plurality of LED units 13-1 to 13-N, the plurality of switches 14-1 to 14-N, and the plurality of constant current control circuit units 15-1 to 15-N of the LED luminescence apparatus using AC power according to the present exemplary embodiment will be omitted here.

However, the current comparison unit 16 according to the present exemplary embodiment further outputs the control signal SC, compared to the exemplary embodiment described above with respect to FIG. 3.

The current comparison unit 16 may receive currents i1 to iN flowing through the plurality of switches 14-1 to 14-N from the constant current control circuit units 15-1 to 15-N, and generate a switching control signal SC to control turn-on/turn-off of the switch 22 of the light output comparison unit 20.

That is, the current comparison unit 16 receives the currents i1 to iN such that when any one of the currents reaches a preset value, the current comparison unit 16 outputs a control signal to switch the switch 22 to be in the open (turn-off) or close (turn-on) state.

For example, the current comparison unit 16 receives the currents i1 to iN from the constant current control circuit units 15-1 to 15-N such that when the current i1 reaches a minimum point, the current comparison unit 16 outputs the control signal SC to switch the switch 22 to be in the open (turn-off) state, and when the current iN reaches a maximum point, the current comparison unit 16 outputs the control signal SC to switch the switch 22 to be in the close (turn-on) state.

Referring to FIG. 40, the light output comparison unit 20 includes a current restriction unit 21, a switch 22, a switch control unit 23, a capacitor C, a first diode D1, and a second diode D2.

One end of the current restriction unit 21 is connected to an output end of the rectification circuit unit 12. The other end of the current restriction unit 21 is connected to an anode of the first diode D1. The current restriction unit 21 is a circuit, which controls the magnitude of current provided to the capacitor C through the first diode D1 and current filled in the capacitor C, and may be configured by at least one resistance device.

A cathode of the first diode D1 is connected to one end of the capacitor C. The other end of the capacitor C is connected to the switch 22.

FIG. 40 illustrates one capacitor C, but the capacitor C may be implemented by a plurality of capacitors, which are connected in series or parallel to one another.

The switch 22 of the present disclosure may be configured by using a field effect transistor (FET) device, in which a reverse-direction diode is provided. The other end of the capacitor C may be connected to a drain terminal of the switch 22. A ground electrode may be connected to a source terminal of the switch 22. The switch control unit 23 may be connected to a gate terminal of the switch 22.

The switch control unit 23 receives the control signal SC input from the current comparison unit 16, and outputs a control signal, which controls the open (turn-off)/close (turn-on) state of the switch 22 depending on the control signal SC, to the gate terminal of the switch 22.

The anode of the second diode D2 is connected to a node of the first diode D1 and the capacitor C. The cathode of the second diode D2 is connected to a node of the first LED unit 13-1 and the current restriction unit 21.

In the present exemplary embodiment, the first diode D1 and the second diode D2 may be used for LEDs. If LEDs are implemented by the first diode D1 and the second diode D2, the light emission efficiency of the LED luminescence apparatus may increase.

The operation of the light output compensation unit 20 and the light emitting operation of the plurality of LED units 13-1 to 13-N, which are related to each other as described above, will be described with reference to FIG. 41 and FIG. 42.

Figure 41:
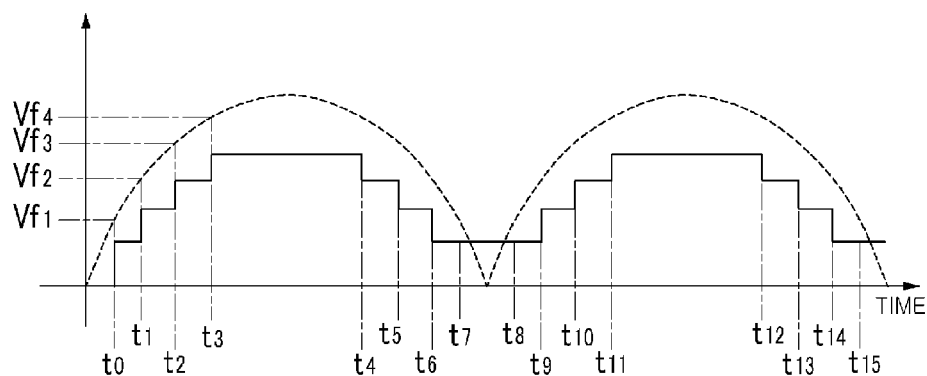
FIG. 41 is a waveform diagram illustrating waveforms of AC voltage and AC current, which are provided to LEDs, in the LED luminescence apparatus using AC power according to the exemplary embodiment of FIG. 40.

FIG. 41 is a waveform diagram illustrating waveforms of AC voltage and AC current, which are provided to LEDs, in the LED luminescence apparatus using AC power according to the present exemplary embodiment.

Figure 42:
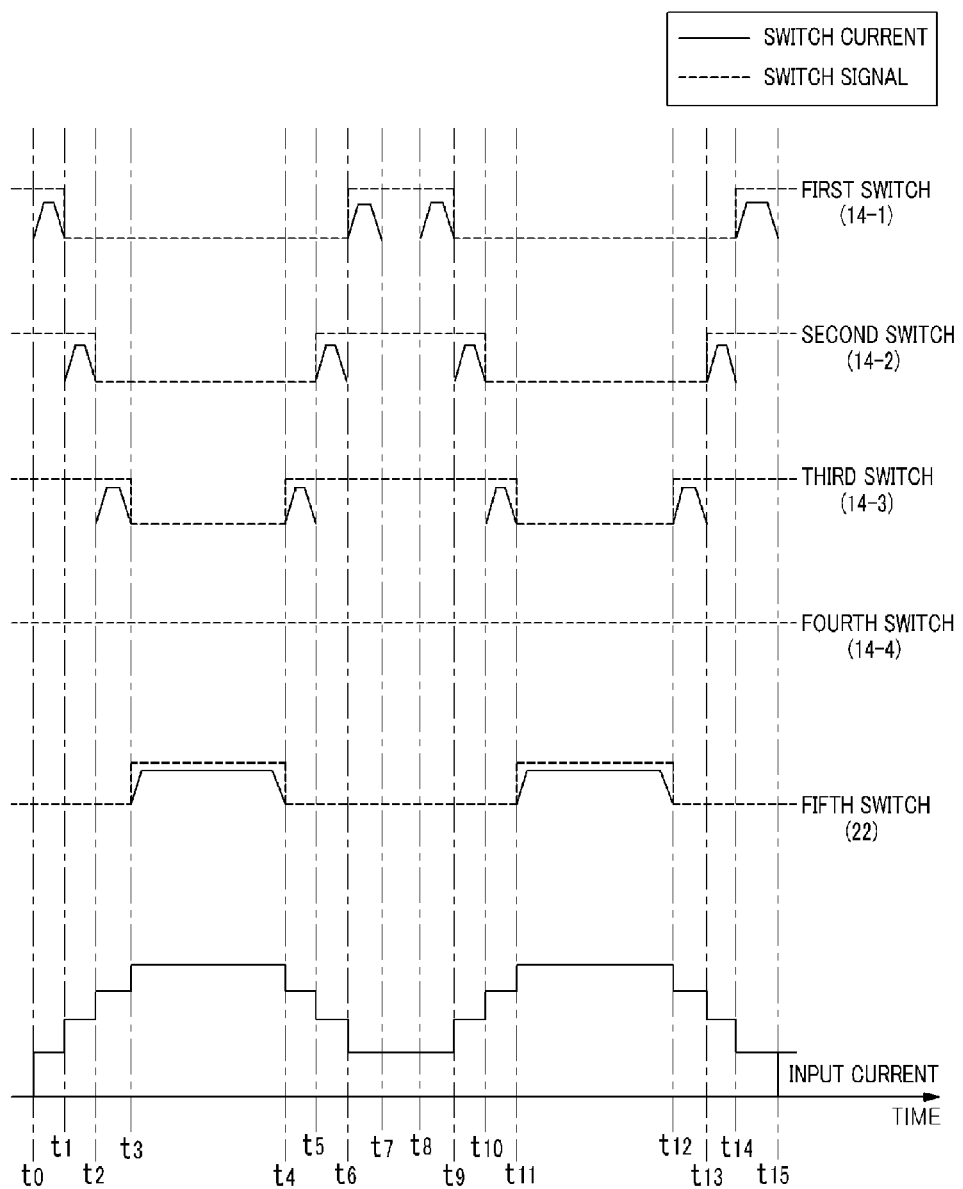
FIG. 42 is a waveform diagram illustrating waveforms of control signals of switches provided in the LED luminescence apparatus using AC power according to the exemplary embodiment of FIG. 40, a waveform of current flowing through the switches, and a waveform of current provided to LEDs over time.

FIG. 42 is a waveform diagram illustrating waveforms of the control signals of the switches provided in the LED luminescence apparatus using AC power according to the present exemplary embodiment, a waveform of current flowing through the switches, and a waveform of current provided to LEDs over time.

FIG. 41 and FIG. 42 illustrate the case where the number of LED units is 4, that is, N=4. Accordingly, an example of the case where in FIG. 40 the value of N is set to 4 will be described.

FIG. 41 and FIG. 42 illustrate two cycles of the ripple voltage provided by the rectification circuit unit 11. The same operation may be performed in the remaining cycles of the ripple voltage, thus only two cycles are shown for the sake of brevity.

When the magnitude of the ripple voltage provided to the plurality of LED units 13-1 to 13-4 increases and becomes the driving voltage (forward voltage) Vf1 of the first LED unit 13-1, current flows through the first LED unit 13-1 so that the first LED unit 13-1 emits light (time t0 of FIGS. 4 and 5). Here, the first to fourth switches 14-1 to 14-4 are initially set to the close state (turn-on state). The input voltage Vf1 is a threshold voltage, which enables the first LED unit 13-1 to be turned on, and the current corresponding to the input voltage Vf1 flows through a path to the first constant current circuit control unit 15-1 via the first LED 13-1. In this case, the first switch 14-1 maintains its turn-on state and uniformly controls current passing through the first constant current control circuit unit 15-1 in response to a control signal from the first constant current control circuit unit 15-1. The first constant current control circuit unit 15-1 performs constant current control such that reference current preset to drive the first LED unit 13-1 can flow. The operation, in which the first LED unit 13-1 initiates light emission, corresponds to the time intervals t0 and t1 in FIG. 41 and FIG. 42.

Subsequently, when the magnitude of the ripple voltage further increases, and the voltage applied to the plurality of LED units 13-1 to 13-N becomes the driving voltage of the first and second LED units 13-1 and 13-2 (when the magnitude of the ripple voltage becomes Vf2), current flows through the second LED unit 13-2 so that the second LED unit 13-2 emits light (time t1 of FIG. 4 and FIG. 5). Here, the input voltage Vf2 is a threshold voltage, which enables the first and second LED units 13-1 and 13-2 to be turned on, and the current corresponding to the input voltage Vf2 flows through a path to the second constant current circuit control unit 15-2 via the second LED unit 13-2. In this case, the current comparison unit 16 senses that the current i2 of the second constant current control circuit unit 15-2 is a preset value, and generates the first switching control signal S1 to open (turn off) the first switch 14-1. At the same time, the second switch 14-2 maintains its turn-on state and performs control in response to a control signal from the second constant current control circuit unit 15-2 such that current flowing through the second constant current control circuit unit 15-2 becomes the same as reference current preset to drive both the first and second LED units 13-1 and 13-2.

Using this operation, control may be performed such that constant current flows through the first LED unit 13-1 and the second LED unit 13-2. As illustrated in FIG. 41 and FIG. 42, at the time t1, the first switch 14-1 is turned off, and stepped input current can be formed by the constant current control of the second constant current control circuit unit 15-2.

Similarly to the above-described procedure, when the ripple voltage further increases, and voltage applied to the plurality of LED units 13-1 to 13-N becomes the driving voltage of the first to third LED units 13-1 to 13-3 (when the magnitude of the ripple voltage becomes Vf3), current flows through the third LED unit 13-3 so that the third LED unit 13-3 emits light (time t2 of FIG. 41 and FIG. 42). Here, the input voltage Vf3 is a threshold voltage, is which enables the first to third LED units 13-1 to 13-3 to be turned on, and the current corresponding to the input voltage Vf3 flows through a path to the third constant current circuit control unit 15-3 via the third LED unit 13-3. In this case, the current comparison unit 16 senses that the current i3 of the third constant current control circuit unit 15-3 is a preset value, and generates the second switching control signal S2 to open (turn off) the second switch 14-2. At the same time, the third switch 14-3 maintains its turn-on state and performs control in response to a control signal from the third constant current control circuit unit 15-3 such that current flowing through the third constant current control circuit unit 15-3 becomes the same as reference current preset to drive the first to third LED units 13-1 to 13-3.

Using this operation, control may be performed such that constant current flows through the first to third LED units 13-1 to 13-3. As illustrated in FIG. 41 and FIG. 42, at the time t2, the second switch 14-2 is turned off, and stepped input current can be formed by the constant current control of the third constant current control circuit unit 15-3.

Similarly to the above-described procedure, when the ripple voltage further increases, and voltage applied to the plurality of LED units 13-1 to 13-N becomes the driving voltage of the first to fourth LED units 13-1 to 13-4 (when the magnitude of the ripple voltage becomes Vf4), current flows through the fourth LED unit 13-4 so that the fourth LED unit 13-4 emits light (time t3 of FIG. 41 and FIG. 42). Here, the input voltage Vf4 is a threshold voltage, which enables all the first to fourth LED units 13-1 to 13-4 to be turned on, and the current corresponding to the input voltage Vf4 flows through a path to the fourth constant current circuit control unit 15-4 via the fourth LED unit 13-4. In this case, the current comparison unit 16 senses that the current i4 of the fourth constant current control circuit unit 15-4 is a preset value, and generates the third switching control signal S3 to open (turn off) the third switch 14-3. At the same time, the fourth switch 14-4 maintains its turn-on state and performs control in response to a control signal from the fourth constant current control circuit unit 15-4 such that current flowing through the fourth constant current control circuit unit 15-4 becomes the same as reference current preset to drive the first to fourth LED units 13-1 to 13-4.

Using this operation, control may be performed such that constant current flows through the first to fourth LED units 13-1 to 13-4. As illustrated in FIG. 41 and FIG. 42, at the time t3, the third switch 14-3 is turned off, and stepped input current can be formed by the constant current control of the fourth constant current control circuit unit 15-4.

Furthermore, in the present exemplary embodiment, when the current i4 of the fourth constant current control circuit unit 15-4 reaches a first preset value, the current comparison unit 16 generates the control signal SC to close (turn on) the switch 22 of the light output compensation unit 20.

When the control signal SC is input, the switch control unit 23 closes (turns-on) the switch 22. Then, current flows through the rectification circuit unit 12, the current restriction unit 21, the first diode D1, the capacitor C, and the switch 22, and the capacitor C is filled with the ripple voltage rectified in the rectification circuit unit 12.

A signal output from the switch control unit 23 to the gate terminal of the switch 22 is a pulse width modulation (PWM) signal. The capacitor C is filled with voltage during the time when the switch 22 is turned on. Subsequently, when the ripple voltage passes over a peak and gradually decreases, and the current i4 of the fourth constant current circuit control unit 15-4 reaches a second preset value, a control signal SC to open (turn off) the switch 22 of the light output compensation unit 20 is generated.

When the control signal SC to open (turn off) the switch 22 is input, the switch control unit 23 opens (turns off) the switch 22. Then, the current path formed from the rectification circuit unit 12 to the capacitor C disappears so that the operation of filling the capacitor C with ripple voltage is stopped.

FIG. 41 and FIG. 42 illustrate that the current comparison unit 16 outputs the control signal SC to close (turn on) the switch 22 at the time t3, and the control signal SC to open (turn off) the switch 22 at the time t4. However, the time to turn on or turn off the switch 22 may be modified.

However, in order to avoid deteriorating the quality characteristics of the input power, in the present exemplary embodiment the capacitor C may be filled with current during the time when the most current flows through the plurality of LED units 13-1 to 13-N.

When the ripple voltage passes over a peak and gradually decreases, the LED units are sequentially turned off in the sequence from the fourth LED unit 13-4 to the first LED unit 13-1.

When the magnitude of the ripple voltage provided to the plurality of LED units 13-1 to 13-4 decreases and becomes the driving voltage Vf3 of the first to third LED units 13-1 to 13-3, the fourth LED unit 13-4 is turned off (time t4). In this case, the current comparison unit 16 senses that the current i4 of the fourth constant current control circuit unit 15-4 is not a preset value, and outputs the third switching control signal S3 to close (turn on) the third switch 14-3, so that the third switch 14-3 is turned on. The current comparison unit 16 outputs the first and second switching control signals S1 and S2 to maintain previous states, so that the first and second switches 14-1 and 14-2 maintain their open (turn-off) states. At the same time, the third switch 14-3 maintains its turn-on state, and the third constant current control unit 15-3 initiates constant current control in response to a control signal from the third constant current control circuit unit 15-3 such that the reference current preset to drive the first to third LED units 13-1 to 13-3 is maintained. The light emitting operations of the first to third LED units 13-1 to 13-3 correspond to the time intervals t4 and t5 in FIG. 41 and FIG. 42.

When the magnitude of the ripple voltage further decreases and becomes the driving voltage Vf2 of the first and second LED units 13-1 and 13-2, the third LED unit 13-3 is turned off (time t5). In this case, the current comparison unit 16 senses that the current i3 of the third constant current control circuit unit 15-3 is not a preset value, and outputs the second switching control signal S2 to close (turn on) the second switch 14-2, so that the second switch 14-2 is turned on. The current comparison unit 16 outputs the first switching control signal S1 to maintain a previous state, so that the first switch 14-1 maintains its open (turn-off) state. At the same time, the second switch 14-2 maintains its turn-on state, and the second constant current control unit 15-2 initiates constant current control in response to a control signal from the second constant current control circuit unit 15-2 such that the reference current preset to drive the first and second LED units 13-1 and 13-2 is maintained. The light emitting operations of the first and second LED units 13-1 and 13-2 correspond to the time intervals t5 and t6 in FIG. 41 and FIG. 42.

Similarly to the above-described procedure, when the magnitude of the ripple voltage further decreases and becomes the driving voltage Vf1 of the first LED unit 13-1, the second LED unit 13-2 is turned off (time t6). In this case, the current comparison unit 16 senses that the current i2 of the second constant current control circuit unit 15-2 is not a preset value, and outputs the first switching control signal S1 to close (turn on) the first switch 14-1, so that the first switch 14-1 is turned on. The current comparison unit 16 outputs the second to fourth switching control signals S2 to S4 to maintain previous states, so that the second to fourth switches 14-2 to 14-4 maintain their open (turn-off) states. At the same time, the first switch 14-1 maintains its turn-on state, and the first constant current control unit 15-1 initiates constant current control in response to a control signal from the first constant current control circuit unit 15-1 such that the reference current preset to drive the first LED unit 13-1 is maintained. The light emitting operation of the first LED unit 13-1 corresponds to the time intervals t6 and t7 in FIG. 41 and FIG. 42.

When the ripple voltage further decreases, and voltage applied to the plurality of LED units 13-1 to 13-N becomes threshold voltage Vd of the second diode D2, current paths to the capacitor C, the second diode D2, and the first LED unit 13-1 are formed. Then, the first LED unit 13-1 emits light by current provided from the capacitor C. The light emitting operation of the first LED unit 13-1 corresponds to the time intervals t7 and t8 in FIG. 41 and FIG. 42.

In the present exemplary embodiment, the threshold voltage Vd of the second diode D2 is set to below the first driving voltage Vf1, but may be modified. For example, if the threshold voltage Vd of the second diode D2 is set to the second driving voltage Vf2, the light emitting operations of the first and second LED units 13-1 and 13-2 may correspond to the time intervals t6 to t10 in FIG. 41 and FIG. 42.

As described, in the present exemplary embodiment, current filled in the capacitor C of the light output compensation unit 20 is applied to the LED units at the LED non-light-emitting intervals according to the exemplary embodiment described above with respect to FIG. 3, so that the LED luminescence apparatus may constantly emit light without generating non-light-emitting intervals (LED off intervals).

A subsequent current control operation is performed by repeating the constant current control performed during the above-described intervals t0 to t8, and thus detailed descriptions thereof will be omitted here.

The present exemplary embodiment has been described such that LED driving current increases or decreases in a stepped form by multi-stage constant current control. However, the present disclosure is not limited thereto. The waveform of the LED driving current may be modified by variously setting reference currents for constant current control.

In the present exemplary embodiment, the series-connected LEDs may be sequentially driven at constant current using AC voltage, so that current that increases or decreases in a stepped form can be provided as illustrated in FIG. 41 and FIG. 42, and therefore LED driving current approximate to a sinusoidal wave equal to AC voltage is provided, thereby enabling problems related to the power factor, THD, etc. to be solved.

Furthermore, current at each stage is controlled to have constant magnitude, so that constant driving current can be provided even in the event of variation in AC voltage (distortion, or increase or decrease in the magnitude of voltage). Thus, the light output efficiency of AC-driven LEDs can be improved.

Furthermore, the LED units may be driven at the areas in which LEDs do not emit light due to AC power, by using the current filled in the capacitor C, so that the LED luminescence apparatus can emit light during the entire interval of AC power without generating non-light-emitting intervals (LED off intervals).

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A light-emitting diode (LED) driving circuit package, comprising:
   a rectification unit to receive an alternating current (AC) power voltage and rectify the AC power voltage to generate a ripple voltage;
   an LED driving switching unit comprising a plurality of switch units connected to respective cathodes of a plurality of external series-connected LEDs and a plurality of current control units connected to the respective switch units; and
   a low voltage control unit comprising:
      a circuit power supply unit to generate low voltage power;
      a voltage detection unit connected to the rectification unit and configured to detect a magnitude of the ripple voltage;
      a reference frequency generation unit connected to the circuit power supply unit and the voltage detection unit and configured to generate a reference frequency; and
      a reference pulse generation unit connected to the circuit power supply unit and the voltage detection unit and configured to generate a reference pulse for controlling the operation of the LED driving switch unit in response to the reference frequency generated by the reference frequency generation unit and a magnitude of the voltage detected by the voltage detection unit,
   wherein:
      the reference frequency generation unit and the reference pulse generation unit are configured to be operated by the low voltage power generated by the circuit power supply unit;

current supplied to at least one of the LEDs via a certain switch unit is controlled by the current control unit connected to the certain switch unit so as to be constant current; and the LED driving switch unit is connected between the low voltage control unit and the plurality of external series-connected LEDs such that inputs of the plurality of switch units are directly connected to the low voltage control unit and outputs of the plurality of switch units are respectively directly connected to the cathodes of the plurality of the external series-connected LEDs.

2. The LED driving circuit package of claim 1, wherein the reference pulse generation unit is configured to generate a first reference pulse to turn on a first switch unit and to turn off the remaining switch units when the voltage detection unit detects the ripple voltage and the ripple voltage reaches a first preset threshold, and to generate a second reference pulse to turn on a second switch unit and to turn off the remaining switch units when the voltage detection unit detects the ripple voltage and the ripple voltage reaches a second preset threshold.

3. The LED driving circuit package of claim 2, wherein the LED driving circuit package comprises a Multi-Chip Package (MCP) comprising a silicon substrate and a Printed Circuit Board (PCB).

4. The LED driving circuit package of claim 3, wherein the silicon substrate is disposed on a top surface of the PCB, and the rectification unit is disposed on the top surface of the PCB.

5. The LED driving circuit package of claim 4, wherein the rectification unit comprises four diodes, and the four diodes are configured to suppress a reverse voltage having a magnitude of about 1.5 to 2 times that of the AC power voltage.

6. The LED driving circuit package of claim 5, wherein the four diodes are independently disposed on the PCB.

7. The LED driving circuit package of claim 6, wherein the four diodes are selected from PN junction diodes, overvoltage suppressor diodes, and surge voltage suppressor diodes.

8. The LED driving circuit package of claim 7, wherein passive resistive elements are disposed on the PCB in the form of separate individual elements.

9. The LED driving circuit package of claim 7, further comprising:
an upper heat dissipation pad interposed between the PCB and the silicon substrate; and
a lower heat dissipation pad disposed beneath the PCB,
wherein the upper heat dissipation pad and the lower heat dissipation pad are respectively disposed on corresponding regions of the PCB.

10. The LED driving circuit package of claim 9, further comprising:
a plurality of vias formed in the PCB and contacting the upper and lower heat dissipation pads.

11. The LED driving circuit package of claim 10, wherein the rectification unit and the silicon substrate are arranged adjacent to a center portion of the top surface of the PCB.

12. A light-emitting diode (LED) driving circuit package, comprising:
a rectification unit comprising diodes to rectify an alternating current (AC) power voltage to generate a ripple voltage;
an LED driving switching unit comprising a plurality of switch units connected to respective cathodes of a plurality of external series-connected LEDs and a plurality of current control units connected to the respective switch units; and a low voltage control unit comprising:
a circuit power supply unit to generate low voltage power;
a voltage detection unit connected to the rectification unit and configured to detect a magnitude of the ripple voltage;
a reference frequency generation unit connected to the circuit power supply unit and the voltage detection unit and configured to generate a reference frequency; and
a reference pulse generation unit connected to the circuit power supply unit and the voltage detection unit and configured to generate a reference pulse for controlling the operation of the LED driving switch unit in response to the reference frequency generated by the reference frequency generation unit and a magnitude of the voltage detected by the voltage detection unit, wherein:
at least one of the diodes of the rectification unit is disposed on a diode mounting pad as an individual element;
current supplied to at least one of the LEDs via a certain switch unit is controlled by the current control unit connected to the certain switch unit so as to be constant current; and
the LED driving switch unit is connected between the low voltage control unit and the plurality of external series-connected LEDs such that inputs of the plurality of switch units are directly connected to the low voltage control unit and outputs of the plurality of switch units are respectively directly connected to the cathodes of the plurality of external series-connected LEDs.

13. The LED driving circuit package of claim 12, wherein remaining diodes of the rectification unit are integrated in the silicon substrate.

14. The LED driving circuit package of claim 13, further comprising:
power pads configured to receive the AC power;
LED pads; and
LEDs connected to the LED pads,
wherein the LED pads are arranged symmetrical along a line passing between the power pads, and the LED pads are arranged opposite to the power pads.

15. A light-emitting diode (LED) driving circuit package, comprising:
a board having a die attach area at a center portion thereof;
an LED chip attached to the die attach area, the LED chip comprising LED cells; and
electrode pad units disposed on the board and around the die attach area and respectively connected to switches, wherein:
each LED cell comprises a series electrical connection to a neighboring LED cell;
each electrode pad unit is respectively electrically connected to a terminal unit of the LED cells via a wire; and
the respective terminal units are configured to input and output driving current and form electrical connections to the switches in the respective LED cells.

* * * * *